(12) United States Patent
Nakamura et al.

(10) Patent No.: US 7,166,882 B2
(45) Date of Patent: Jan. 23, 2007

(54) SEMICONDUCTOR DEVICE AND METHOD FOR FABRICATING THE SAME

(75) Inventors: Shunji Nakamura, Kawasaki (JP); Eiji Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/095,101

(22) Filed: Mar. 12, 2002

(65) Prior Publication Data
US 2002/0145199 A1    Oct. 10, 2002

(30) Foreign Application Priority Data
Mar. 13, 2001 (JP) .............. 2001-070628
Feb. 26, 2002 (JP) .............. 2002-049422

(51) Int. Cl.
*H01L 31/119* (2006.01)

(52) U.S. Cl. ............... 257/306; 257/311; 257/E21.648

(58) Field of Classification Search ......... 257/300–311
See application file for complete search history.

(56) References Cited

U.S. PATENT DOCUMENTS 5,861,653 A * 1/1999 Hada ........................ 257/386
6,130,482 A * 10/2000 Iio et al. ..................... 257/774
6,146,985 A * 11/2000 Wollesen .................... 438/618
6,472,266 B1 * 10/2002 Yu et al. ..................... 438/241
6,667,552 B1 * 12/2003 Buynoski ................... 257/758

* cited by examiner

*Primary Examiner*—H. Jey Tsai
(74) *Attorney, Agent, or Firm*—Westerman, Hattori, Daniels & Adrian, LLP.

(57) ABSTRACT

The semiconductor device comprises: an insulation film 72 formed over a silicon substrate 10, an insulation film 78 formed on the insulation film 72 and having opening 82, and conductor 84 formed at least in the opening 82. Cavity 88 having the peripheral edges conformed to a configuration of the opening 82 is formed in the insulation film 72. The cavity 88 is formed in the region between the electrodes or the regions between the interconnection layers so as to decrease the dielectric constant between the electrodes or between the interconnection layers, whereby the parasitic capacitances of the region between the electrodes or the region between the interconnection layers can be drastically decreased, and consequently the semiconductor device can have higher speed.

15 Claims, 68 Drawing Sheets

88  88

UNIT CELL ARRAY | PERIPHERAL LOGIC CIRCUIT | UNIT CELL ARRAY

SCRIBE LINE

SCRIBE LINE

SEMICONDUCTOR DEVICE AND METHOD FOR FABRICATING THE SAME

BACKGROUND OF THE INVENTION

The present invention relates to a semiconductor device having a decreased parasitic capacitance formed between the electrodes or the interconnection layers, and a method for fabricating the same.

With larger scale and higher integration of semiconductor devices, a minimum processing dimension of the semiconductor devices almost reaches 0.1 µm, which makes it increasingly difficult to form such minimum patterns by the photolithography techniques. In view of such difficulty of the pattern formation, techniques of fabricating elements by using only simple rectangular patterns without using the conventionally used oblique patterns and patterns of complicated configurations are being studied.

A conventional semiconductor device which can be fabricated by using simple rectangular patterns will be explained with reference to FIG. 68A. FIG. 68A is a plan layout of typical layers, which shows a structure of the conventional semiconductor device.

Rectangular device regions 302 are defined zigzag by a device isolation film on the main surface of the silicon substrate (the regions indicated by the one dot chain lines in FIG. 68A). A plurality of word lines 304 are formed, extended longitudinally as viewed in the drawing over the silicon substrate with the device isolation film formed on. Two word lines 304 are extended in each of the device regions 302. Source/drain diffusion layers are formed in the device regions on both sides of the word lines 304. A sidewall insulation film 306 is formed on the side walls of the word lines 304. Contact plugs 308, 310 are buried in the region between the word lines 304, connected to the source/drain diffusion layers. The contact plugs 308, which are buried in the central parts of the respective device regions 302, are extended in the direction of extension of the word lines 304 and overlapping the device isolation film. The contact plugs 310 buried in both end parts of the respective device regions 302 are formed only in the device regions 302. On the silicon substrate with the word lines 304 and the contact plugs 308, 310 formed on, there are formed bit lines 312, connected to the contact plugs 308 through an insulation film covering the word lines 304 and the contact plugs 308, 310, and capacitors (not shown) connected to the contact plugs 310 through the insulation film.

A semiconductor device thus comprising a DRAM including memory cells each including one transistor and one capacitor, which are formed by using only rectangular patterns is fabricated.

In the conventional semiconductor device shown in FIG. 68A, the bit lines 312, the source/drain diffusion layers are connected to each other via the contact plugs 308, so that the device regions 302, the word lines 304, the bit lines 312, etc. are drawn in simple rectangular patterns. The sidewall insulation film 306 of silicon nitride film or others is formed on the side walls of the word lines 304 so that the contact holes for the contact plugs 308, 310 to be buried in are formed by self-alignment with the word lines 304. Accordingly, the long contact plugs 308 extended in the direction of extension of the word lines 304, and the word lines 304 are capacitively coupled with each other through the sidewall insulation film 306 (shaded in the drawing), with a result of parasitic capacitance increase between the word lines 304 and the bit lines 312.

In forming the contact holes for the storage electrodes by self-alignment with the bit lines 312, the sidewall insulation film 314 of, e.g., silicon nitride film also on the side walls of the bit lines 312, which results in increase the parasitic capacitance between the bit lines 312 and the storage electrodes.

Thus, in the conventional semiconductor device, parasitic capacitance decrease is required, as shown in FIG. 68B, between the word lines 304, between the bit lines 312, between the word line 304 and the bit line 312, between the word line 304 and the plugs 308, 310, and between the bit line 312 and the storage electrode.

In not only memory devices of DRAMs having patterns drawn by using only rectangular patterns, but also other memory devices of DRAMs having other patterns, SRAMs, etc., and other devices, such as logic devices, etc., it is desirable to decrease the parasitic capacitance between the interconnection layers.

SUMMARY OF THE INVENTION

An object of the present invention is to provide a semiconductor device which can decrease the parasitic capacitance between the electrodes or between the interconnection layers.

According to one aspect of the present invention, there is provided a semiconductor device comprising: a first insulation film formed over a semiconductor substrate; a second insulation film formed on the first insulation film and having an opening; and a conductor formed at least in the opening, a cavity being formed in the first insulation film and having a peripheral edge conformed to a configuration of the opening.

According to another aspect of the present invention, there is provided a method for fabricating a semiconductor device, comprising the steps of: forming a first insulation film on a semiconductor substrate; forming a second insulation film having an etching characteristic different from that of the first insulation film on the first insulation film; forming an opening in the second insulation film down to at least the first insulation film; forming a conductor in contact with the second insulation film in at least the opening; and etching the first insulation film by intruding an etchant through an interface between the second insulation film and the conductor to form a cavity below the second insulation film.

As described above, according to the present invention, the cavity is formed in regions between electrodes or regions between interconnection layers to thereby decrease the dielectric constant between the electrodes or between the interconnection layers, whereby a parasitic capacitance in the regions between the electrodes or the regions between the interconnection layers can be much lower, and consequently, the semiconductor device can have higher speed.

DETAILED DESCRIPTION OF THE INVENTION

[A First Embodiment]

The semiconductor device and the method for fabricating the same according to a first embodiment of the present invention will be explained with reference to FIGS. 1–5, 6A–6C, 7A–7C, 8A–8C, 9A–9B, 10A–10B, 11A–11B, 12, 13A–13D, 14A–14C, 15A–15B, 16A–16B, 17A–17B, 18A–18D, 19A–19C, 20A–20B, 21A–21B and 22.

Figure 1:
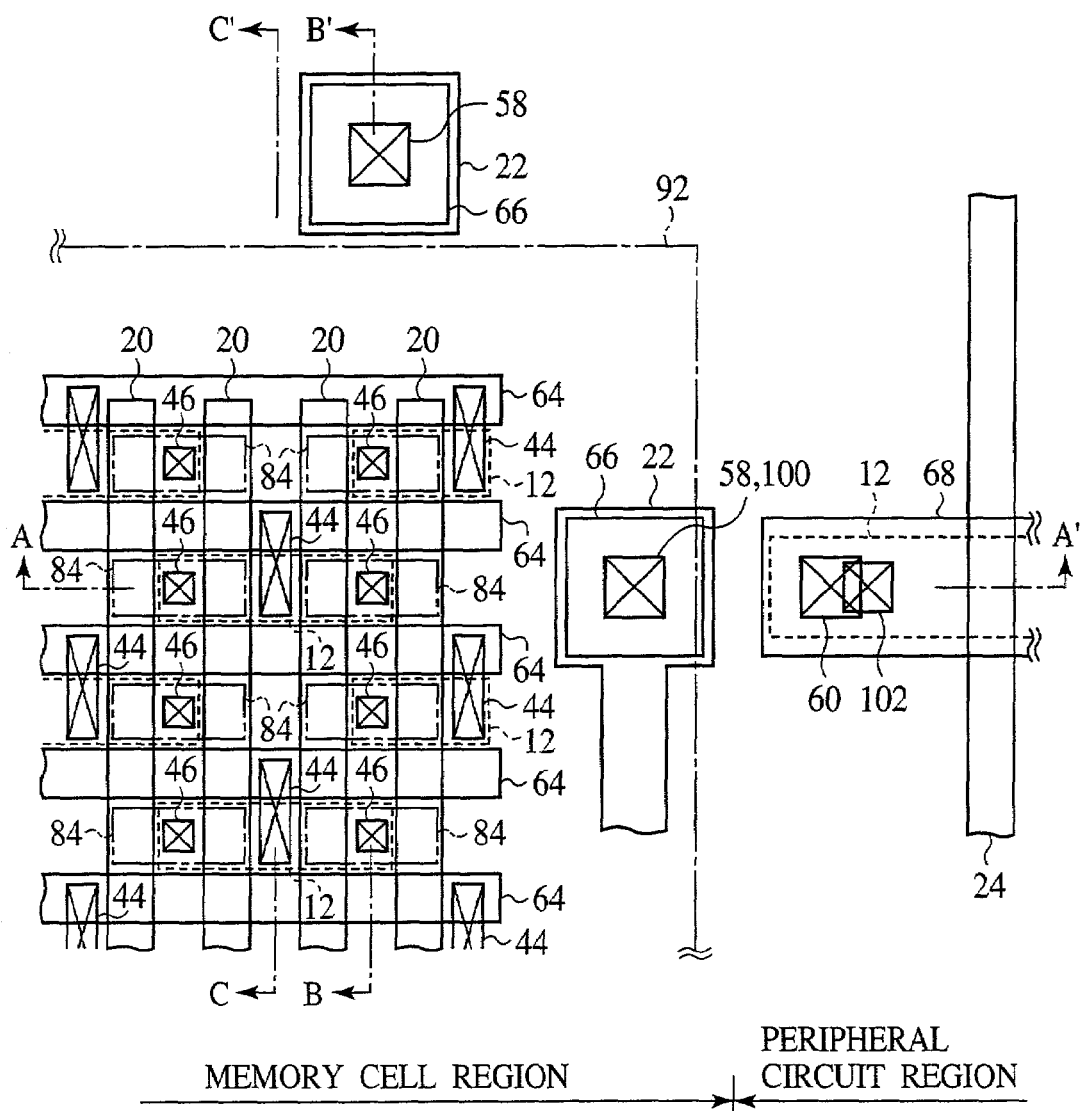
FIG. 1 is a plan view of the semiconductor device according to a first embodiment of the present invention, which shows a structure thereof.
Figure 2:
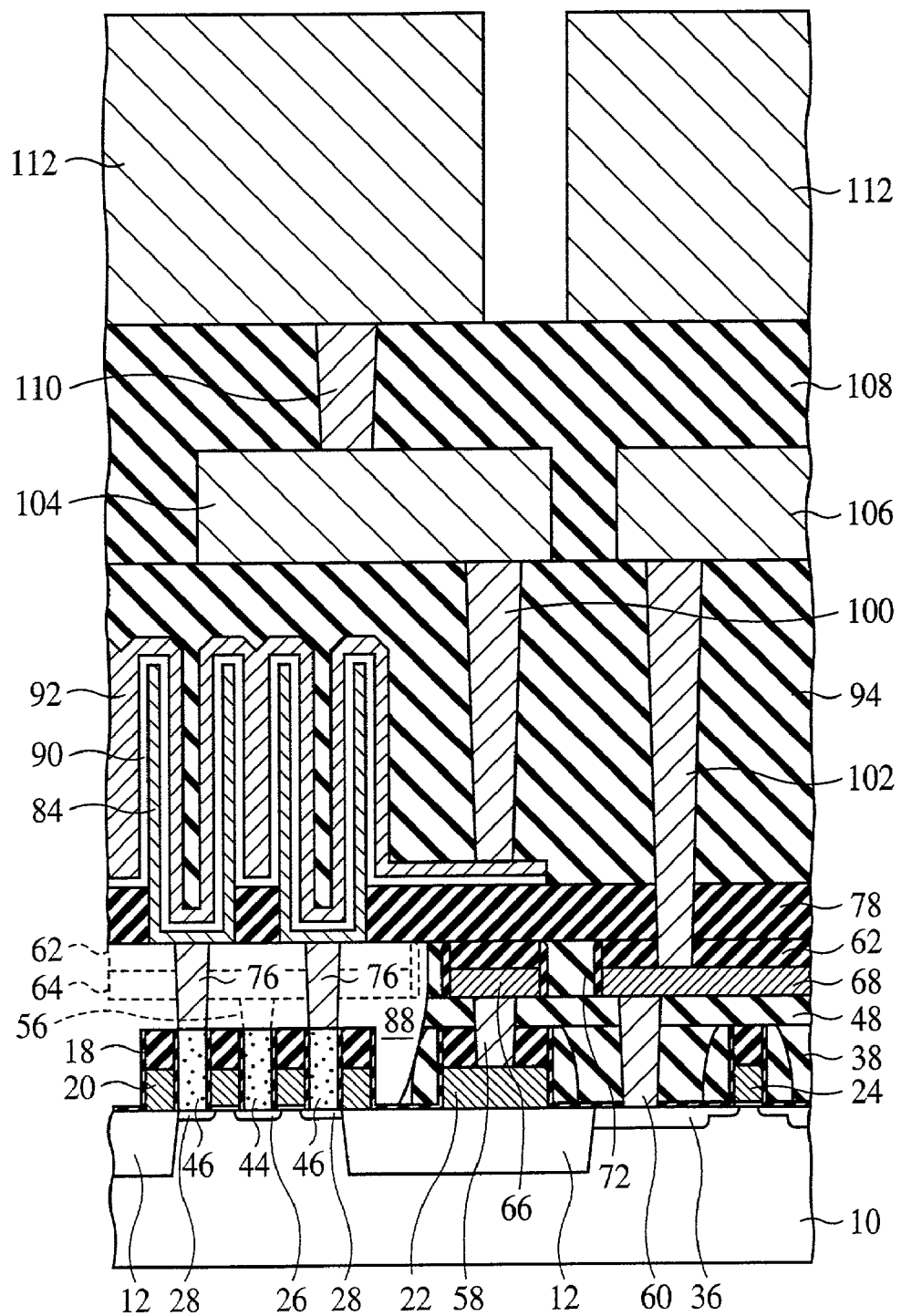
FIG. 2 is a diagrammatic sectional view of the semiconductor device according to the first embodiment of the present invention, which shows the structure thereof.
Figure 3:
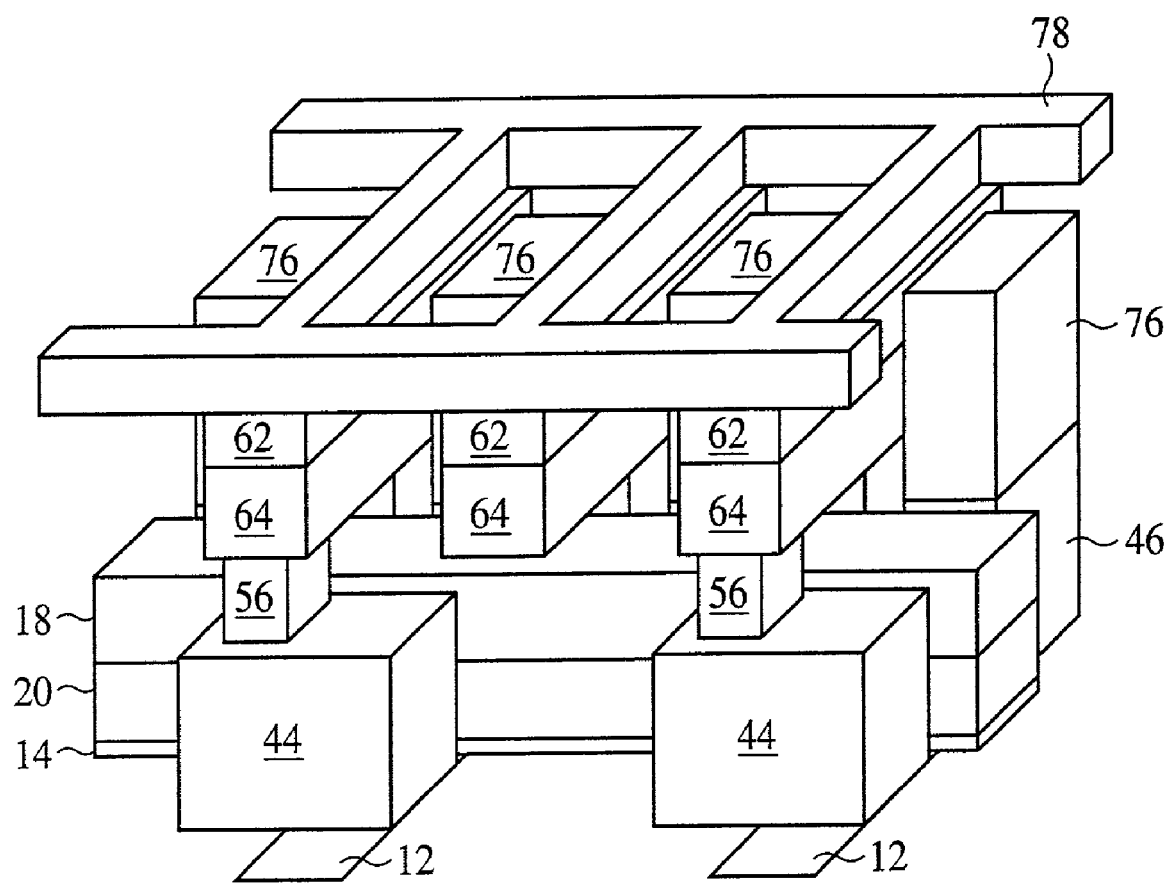
FIG. 3 is a perspective view of the semiconductor device according to the first embodiment of the present invention, which shows the structure thereof.
Figure 4:
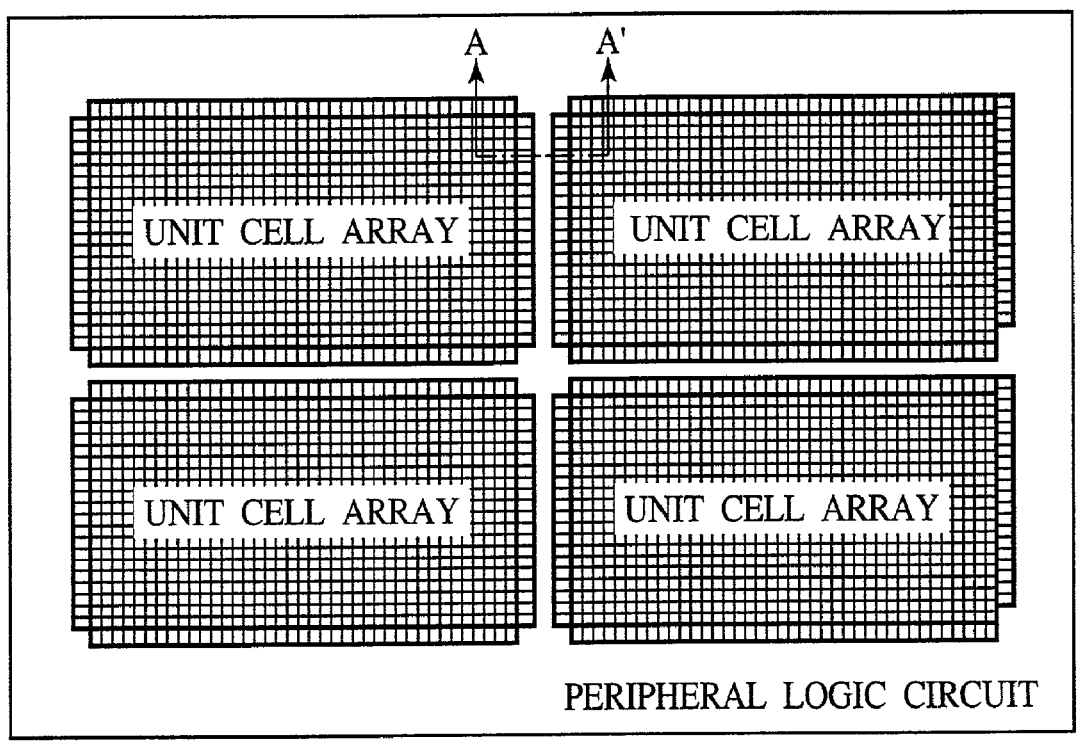
FIG. 4 is a plan view showing a layout of memory cell arrays on a semiconductor chip.
Figure 5:
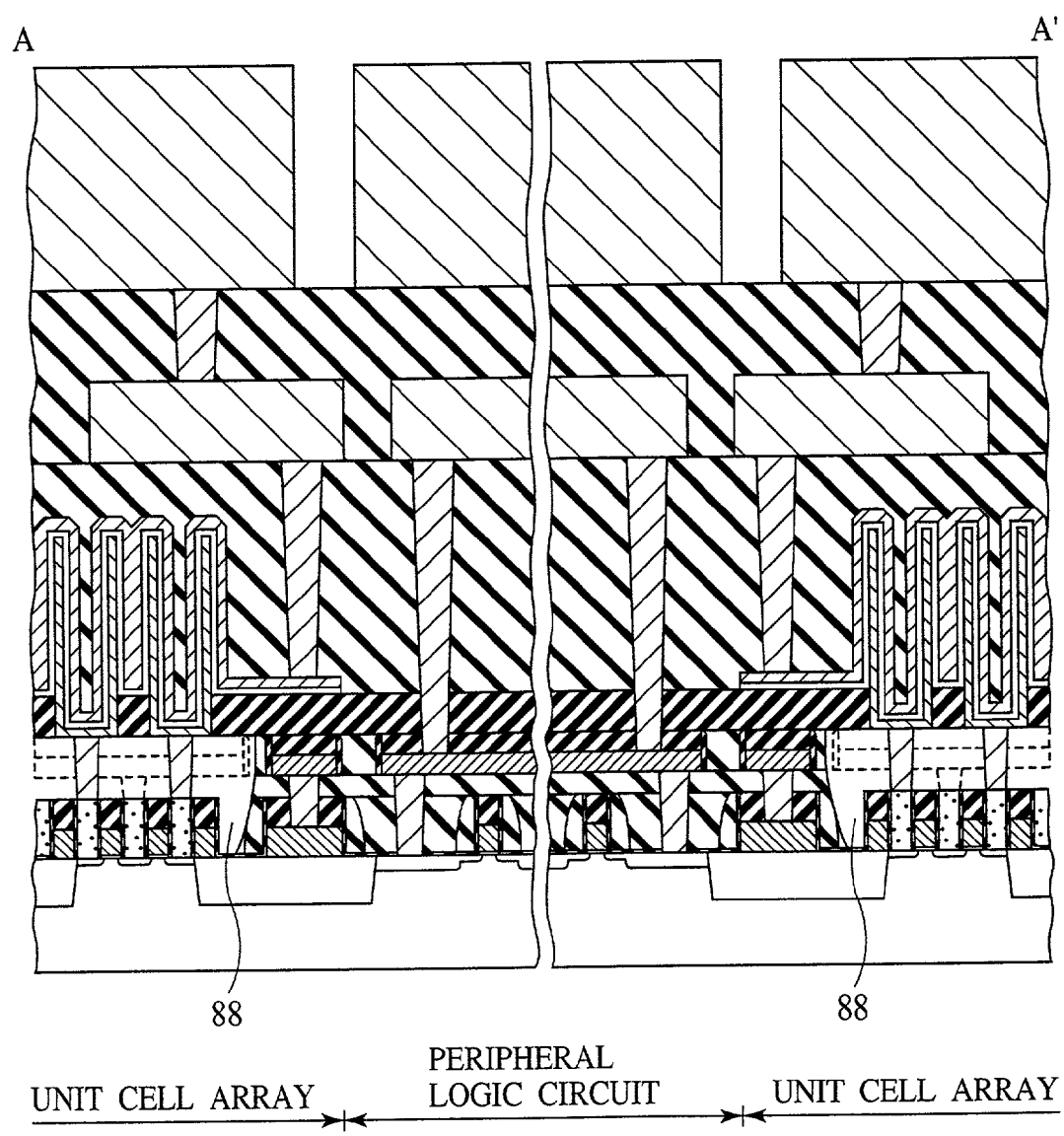
FIG. 5 is a diagrammatic sectional view of the semiconductor device, which shows a structure thereof between unit cyell arrays.

FIG. 1 is a plan view of the semiconductor device according to the present embodiment, which shows a structure thereof. FIG. 2 is a diagrammatic sectional view of the semiconductor device according to the present embodiment, which shows the structure thereof. FIG. 3 is a perspective view of the semiconductor device according to the present embodiment, which shows the structure thereof. FIG. 4 is a plan view showing a layout of memory cell arrays on a semiconductor chip. FIG. 5 is a diagrammatic sectional view of the semiconductor device, which shows a structure thereof between unit cell arrays. FIGS. 6A–6C, 7A–7C, 8A–8C, 9A–9B, 10A–10B, 11A–11B, 12, 13A–13D, 14A–14C, 15A–15B, 16A–16B, 17A–17B, 18A–18D, 19A–19C, 20A–20B, and 21A–21B are sectional views of the semiconductor device according to the present embodiment in the steps of the method for fabricating the same, which explain the method. FIG. 22 is a view explaining a process of etching an inter-layer insulation film by the method for fabricating the semiconductor device according to the present embodiment.

First, the structure of the semiconductor device according to the present embodiment will be explained with reference to FIGS. 1 to 3. FIG. 2 is a diagrammatic sectional view along the line A–A' in FIG. 1. In FIGS. 1 and 2, a memory cell region is shown on the left side, and a peripheral circuit region is shown on the right side.

A device isolation film 12 for defining device regions is formed on a silicon substrate 10. Gate electrodes 20, 22, 24 having the upper surfaces covered with a silicon nitride film 18 are formed over the silicon substrate 10 with the device isolation film 12 formed on with gate insulation films 14, 16 formed therebetween. Source/drain diffusion layers 26, 28 are formed in the silicon substrate 10 on both sides of the gate electrodes 20. Thus, memory cell transistors comprising the gate electrodes 20, and the source/drain diffusion layers 26, 28 are formed. The gate electrodes 20 function also as a conducting film forming word lines as shown in FIG. 1. Source/drain diffusion layers 36 are formed in the silicon substrate 10 on both sides of the gate electrode 24. Thus, peripheral circuit transistors comprising the gate electrode 24 and the source/drain diffusion layers 36 are formed.

Inter-layer insulation films 38, 48 are formed over the silicon substrate with the memory cell transistors and the peripheral circuit transistors formed on. On the silicon substrate 10 with the memory cell transistors and the peripheral circuit transistors formed on there are formed bit lines 64 connected to the source/drain diffusion layers 26 via plugs 56, 44, an interconnection layer 55 connected to the gate electrode 22 via a plug 58, and an interconnection layer 68 connected to the source/drain diffusion layer 36 via a plug 60. A silicon nitride film 62 is formed on the bit lines 64 and the interconnection layers 66, 68. The bit lines 64 are formed in a plural number, extended crossing the word lines.

An inter-layer insulation film 72 is formed on the inter-layer insulation film 48 with the bit lines 64 and the interconnection layers 66, 68 formed on. Plugs 76 are buried in the inter-layer insulation films 72, 48, connected to the plugs 46. Cylindrical storage electrodes 84 are formed on the plugs 76, connected to the source/drain diffusion layers 38 via the plugs 76, 46. An inter-layer insulation film 78 is formed on the inter-layer insulation film 72 where the storage electrodes 84 are not formed. Plate electrode 92 is formed over the storage electrodes 84 interposing a capacitor dielectric film 90 therebetween. Thus, the storage electrode 84, the capacitor dielectric film 90 and the plate electrode 92 constitute capacitor.

An inter-layer insulation film 94 is formed on the inter-layer insulation film 78 with the capacitors formed on. On the inter-layer insulation film 94 there are formed an inter-connection layer 104 connected to the plate electrodes 92 via a plug 100, and an inter-connection layer 106 connected to the interconnection layer 68 via a plug 102. An inter-layer insulation film 108 is formed on the inter-layer insulation film 94 with the interconnection layers 104, 106 formed on. An interconnection layer 112 is formed on the inter-layer insulation film 108, connected to the interconnection layer 104 via a plug 110.

Thus, a DRAM comprising memory cells each including one transistor and one capacitor is formed.

Here, the semiconductor device according to the present embodiment is characterized mainly in that the inter-layer insulation films 38, 48, 72 and the sidewall insulation film 34 are removed from the regions between the word lines (gate electrodes 20), the regions between the bit lines 64 and the regions between the word lines 20 and the bit lines 64, and a cavity 88 is formed in these regions. In the semiconductor device having such structure, the cavity 88 (dielectric constant: about 1), whose dielectric constant is smaller than dielectric constants of silicon oxide film (dielectric constant: about 4) and silicon nitride film (dielectric constant: about 8.5) is formed in the regions between the word lines 20, between the bit lines 64, and between the word line 20 and the bit line 64, whereby a parasitic capacitance between the word lines 20, that between the bit lines 64 and that between the word line 20 and the bit line 64 can be much decreased.

In forming the cavity 88 in the regions between the word lines 20, between the bit lines 64 and between the word line 20 and the bit line 64, it is necessary to prevent, in the step of forming the cavity 88, collapse of the inter-layer insulation film 78 forming the ceilings of the cavity 88. In the semiconductor device according to the present embodiment, however, the inter-layer insulation film 78 is supported by the silicon nitride film 62 formed on the bit lines 64, and the bit lines 64 are supported by the plugs 44, 56, whereby the inter-layer insulation film 78 never collapses. No cavity 88 is formed in the peripheral circuit region, and accordingly, the collapse of the inter-layer insulation film 78 never take place in the peripheral circuit region.

It is usual that, as shown in FIG. 4, a plurality of unit cell arrays are arranged on a semiconductor chip, and a peripheral logic circuit is arranged around the memory cell arrays. In such semiconductor chip, the cavities 88 are formed each of the unit cell arrays (refer to FIG. 5).

There is a risk that when the cavities 88 arrive at scribe lines, moisture resistance, etc. may be degraded after dicing. Accordingly, the cavities 88 are controlled no to arrive at scribe lines.

Next, the method for fabricating the semiconductor device according to the present embodiment will be explained with reference to FIGS. 6A–6C, 7A–7C, 8A–8C, 9A–9B, 10A–10B, 11A–11B, 12, 13A–13D, 14A–14C, 15A–15B, 16A–16B, 17A–17B, 18A–18D, 19A–19C, 20A–20B, and 21A–21B. FIGS. 6A–6C, 7A–7C, 8A–8C, 9A–9B, 10A–10B, 11A–11B, and 12 show sectional views of the semiconductor device along the line A–A' in FIG. 1. FIGS. 13A–13D, 14A–14C, 15A–15B, 16A–16B, and 17A–17B show sectional views of the semiconductor device along the line B–B' in FIG. 1. FIGS. 18A–18D, 19A–19C, 20A–20B, and 21A–21B show sectional views of the semiconductor device along the line C–C' in FIG. 1.

Figure 6A:
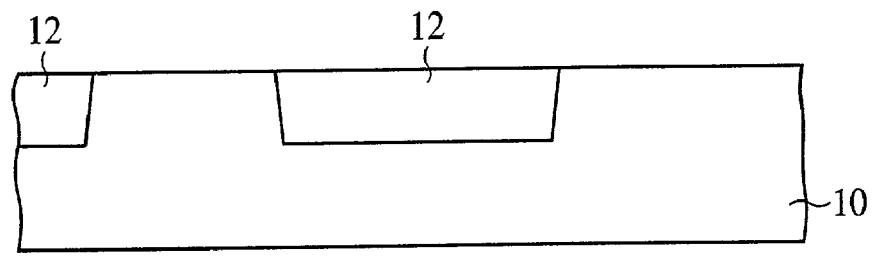
FIGS. 6A–6C, 7A–7C, 8A–8C, 9A–9B, 10A–10B, 11A–11B, 12, 13A–13D, 14A–14C, 15A–15B, 16A–16B, 17A–17B, 18A–18D, 19A–19C, 20A–20B, and 21A–21B are sectional views of the semiconductor device according to the first embodiment of the present invention in the steps of the method for fabricating the same, which show the method.
Figure 13A:
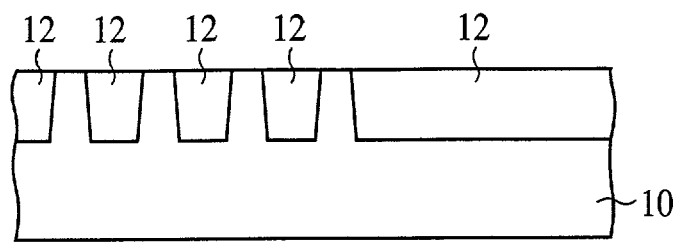
Figure 18A:
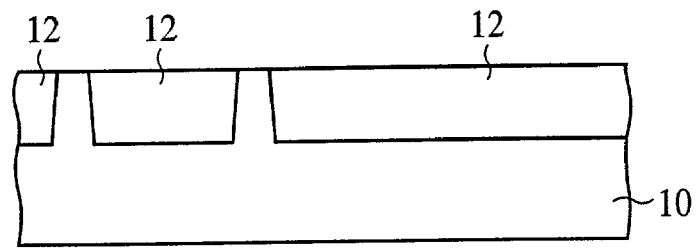

First, the device isolation film 12 is formed on the main surface of a semiconductor substrate 10 by, e.g., STI (Shallow Trench Isolation) method (FIG. 6A, FIG. 13A, FIG. 18A).

Then, the gate insulation films 14, 16 of a silicon oxide film are formed by, e.g., thermal oxidation method on a plurality of device regions defined by the device isolation film 12. The gate insulation film 14 is for the memory cell transistors, and the gate insulation film 16 is for the peripheral circuit transistors.

Figure 6B:
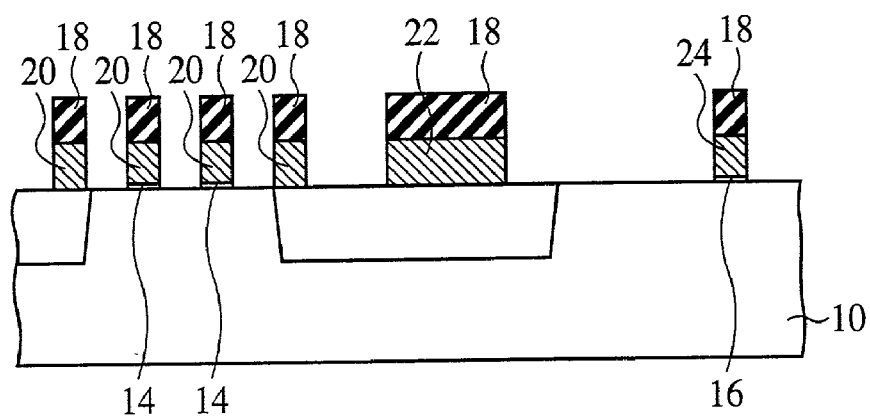

Next, a doped polycrystalline silicon film and a silicon nitride film, for example, are sequentially deposited on the entire surface by, e.g., CVD method, and the layer film is patterned to form the gate electrodes 20, 22, 24 having the upper surfaces covered with the silicon nitride film 18 (FIG. 6B). The gate electrodes 20 are gate electrodes of the memory cell transistors (word lines), and the gate electrodes 22, 24 are for the peripheral circuit transistors. The gate electrode 22 is represented by the parts of the interconnection with the upper conducting layer. The gate electrodes 20, 22, 24 are not essentially formed of a single layer structure of polycrystalline silicon film but may be formed of a polycide structure, a polymetal structure, or a metal film or others.

Figure 6C:
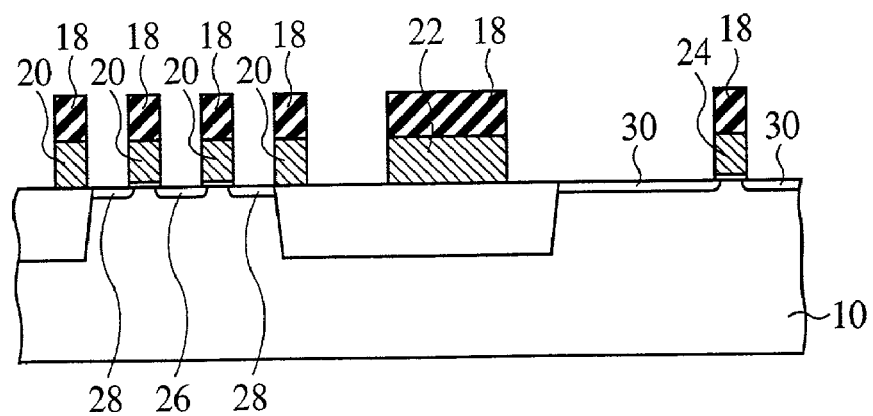
Figure 13B:
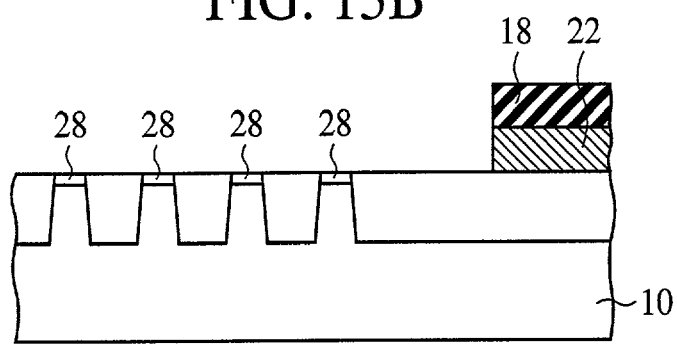
Figure 18B:
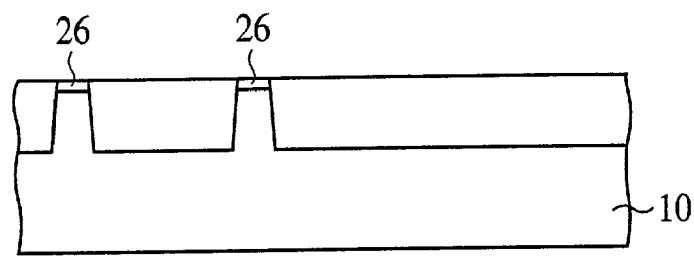

Then, with the gate electrodes 20, 24 as a mask, ions are implanted to form the source/drain diffusion layers 26, 28 in the silicon substrate 10 on both sides of the gate electrode 20 and to form impurity diffused regions 30 which are to be LDD regions or extension regions in the silicon substrate 10 on both sides of the gate electrodes 24 (FIG. 6C, FIG. 13B, FIG. 18B).

Next, a silicon nitride film 32 of, e.g., a 5–20 nm-thick and a silicon oxide film of, e.g., a 70 nm-thick are sequentially deposited on the entire surface by, e.g., CVD method.

Then, with the silicon nitride film 32 as a stopper, the silicon oxide film is etched back. Thus, the sidewall insulation film 34 of the silicon oxide film is formed on the side walls of the gate electrodes 20, 22, 24 and the silicon nitride film 18 with the silicon nitride film 32 formed on. The regions between the gate electrodes are filled with the sidewall insulation film 34, because a gap between the gate electrodes 20 is small in the memory cell region.

The silicon nitride film 32 is for preventing the device isolation film 12 from being etched when the sidewall insulation film 34, etc. are removed in a later step. However, the silicon nitride film 32 is not essential in a case that the device isolation film 12 is formed of a film having etching characteristics different from those of the sidewall insulation film 34 (e.g., silicon nitride film).

Next, with the gate electrodes 24 and the sidewall insulation film 34 as a mask, ions are implanted to form heavily doped regions. Thus, the source/drain diffusion layers 36 of an LDD structure or an extension structure is formed in the silicon substrate 10 on both sides of the gate electrodes 24.

Figure 7A:
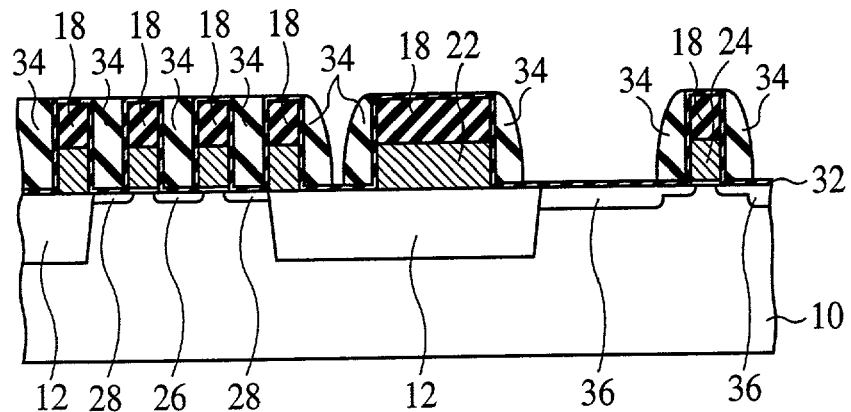
Figure 13C:
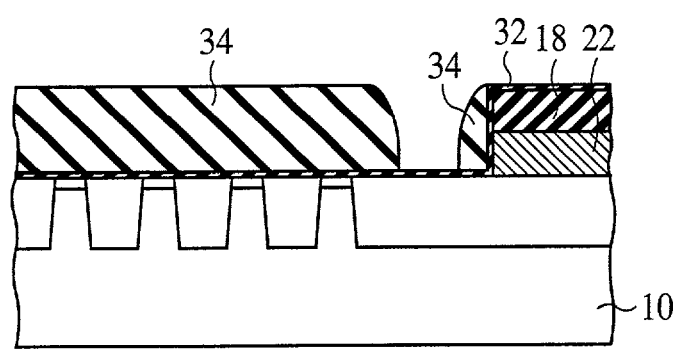
Figure 18C:
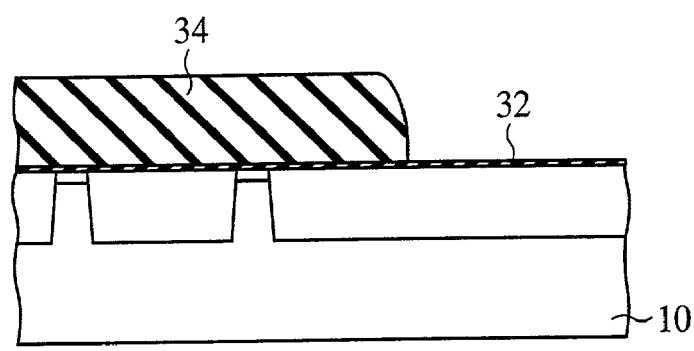

Thus, memory cell transistors comprising the gate electrodes 20, the source/drain diffusion layers 26, 28 formed in the silicon substrate 10 on both sides of the gate electrodes 20 are fabricated in the memory cell region, and in the peripheral circuit region, peripheral circuit transistors comprising the gate electrodes 24, and the source/drain diffusion layers 36 formed in the silicon substrate 10 on both sides of the gate electrodes 24 are formed (FIG. 7A, FIG. 13C, FIG. 18C).

Figure 7B:
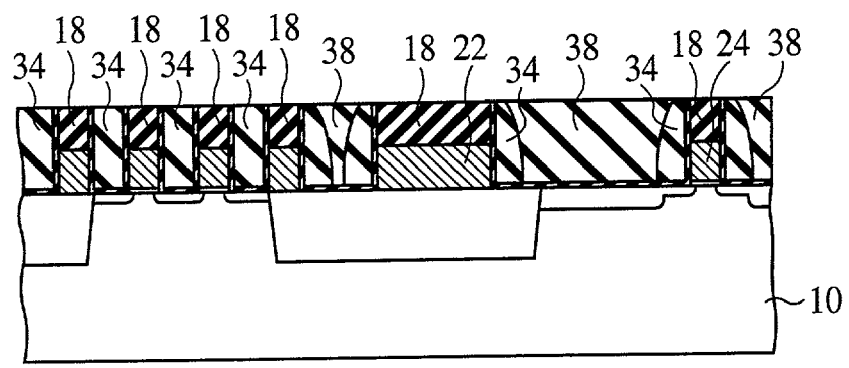
Figure 13D:
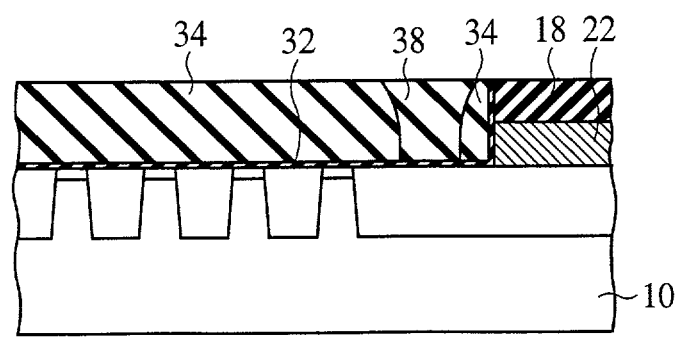
Figure 18D:
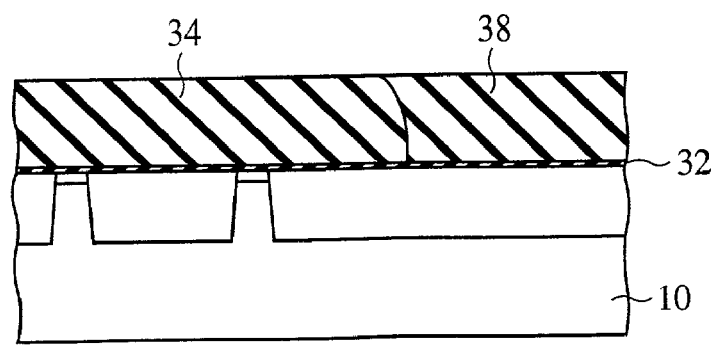

Then, a silicon oxide film of, e.g., a 500 nm-thick is formed on the entire surface by, e.g., CVD method, and the surface of the silicon oxide film is polished by CMP (Chemical Mechanical Polishing) method or other means until the silicon nitride film 18 is exposed, to form the inter-layer insulation film 38 having the surface planarized and formed of the silicon oxide film (FIG. 7B, FIG. 13D, FIG. 18D).

Next, the sidewall insulation film 34 on the source/drain diffusion layer 26, 28 is patterned by lithography and etching by self-alignment with the gate electrodes 20 and the silicon nitride film 32 to form contact holes 40 down to the silicon nitride film 32 on the source/drain diffusion layer 26, and contact holes 42 down to the silicon nitride film 32 on the source/drain diffusion layer 28.

Then, the silicon nitride film 32 at the bottoms of the contact holes 40, 42 is selectively removed by dry etching to expose the source/drain diffusion layers 26, 28 respectively in the contact holes 40, 42.

Figure 7C:
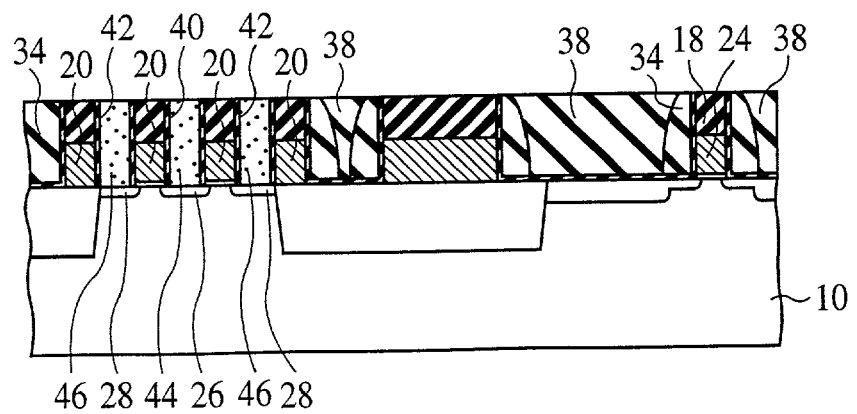
Figure 14A:
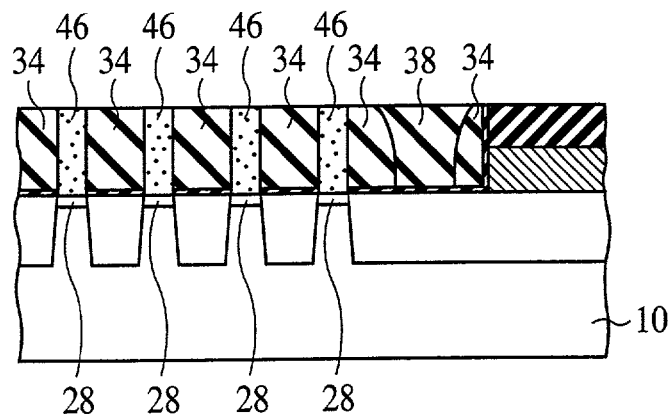
Figure 19A:
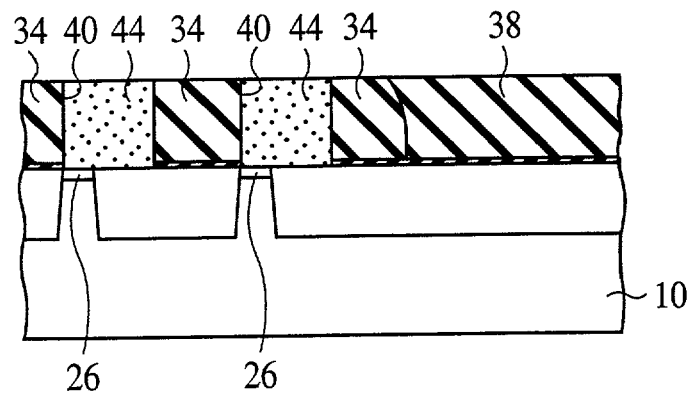

Then, plugs 44, 46 are buried respectively in the contact holes 40, 42 (FIG. 7C, FIG. 14A, FIG. 19A). For example, a doped polycrystalline silicon film is deposited by CVD method and etched back to leave the doped polycrystalline silicon film only in the contact holes 40, 42 to thereby form the plugs 44, 46 of the doped polycrystalline silicon film.

Next, a silicon oxide film of, e.g., a 100 nm-thick is deposited on the entire surface by, e.g., CVD method to form the inter-layer insulation film 48 of the silicon oxide film.

Then, the inter-layer insulation films 48, 38 and the silicon nitride films 18, 32 are patterned by lithography and etching to form contact holes 50 down to the plugs 44, contact holes 52 down to the gate electrodes 22 and contact holes 54 down to the source/drain diffusion layers 36.

Figure 8A:
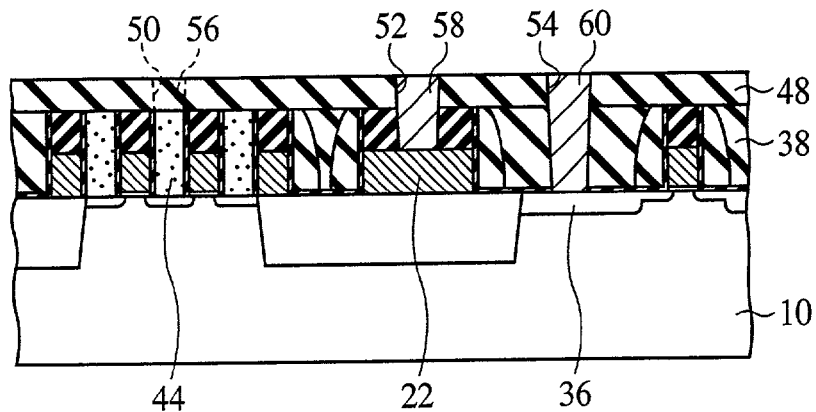
Figure 14B:
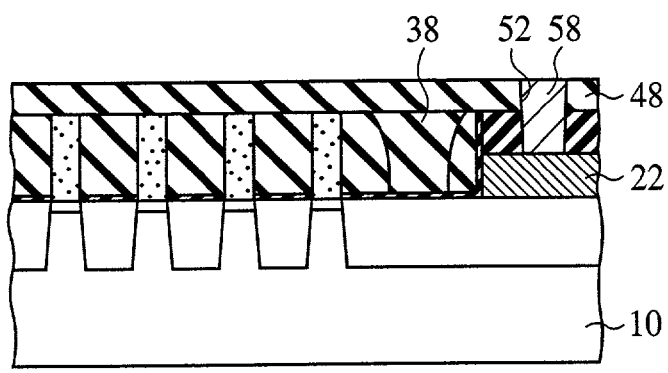
Figure 19B:
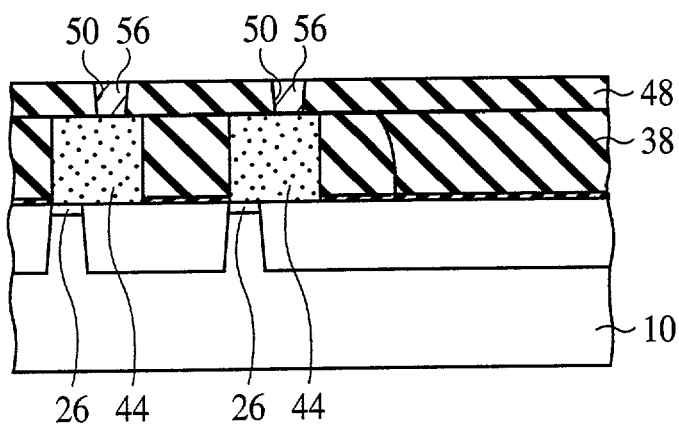

Next, a Ti (titanium) film, TiN (titanium nitride) film and a W (tungsten) film are sequentially deposited on the entire surface by, e.g., CVD method and then polished flat until the surface of the inter-layer insulation film 48 is exposed. Thus, the plugs 56, 58, 60 of the W film, the TiN film and the Ti film, which are buried in the contact holes 50, 52, 54 are formed (FIG. 8A, FIG. 14B, FIG. 19B). The plugs 56 are not seen in the section shown in FIG. 8A, but plugs 56 are indicated by the dotted line so as to make clear the positional relationship with the other constituent members.

Next, a 50 nm-thick W film and a 200 nm-thick silicon nitride film are sequentially deposited on the entire surface by, e.g., CVD method and patterned to form the bit lines 64 having the upper surfaces covered with the silicon nitride film 62 and connected to the source/drain diffusion layers 26 via the plugs 56, 44, the interconnection layer 66 having the upper surface covered with the silicon nitride film 52 and connected to the gate electrode 22 via the plug 58, and the interconnection layer 68 having the upper surface covered with the silicon nitride film 62 and connected to the source/drain diffusion layer 36 via the plug 60.

Figure 8B:
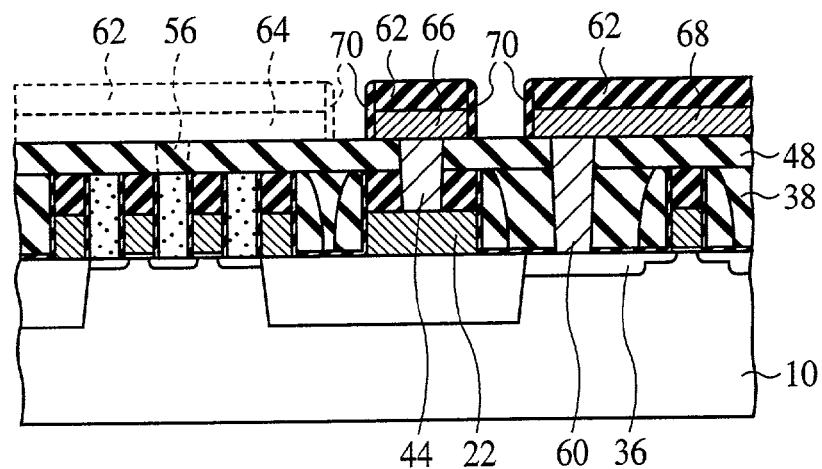
Figure 14C:
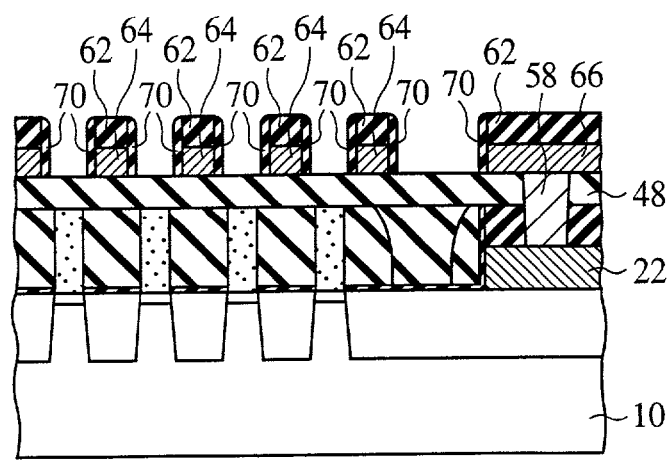
Figure 19C:
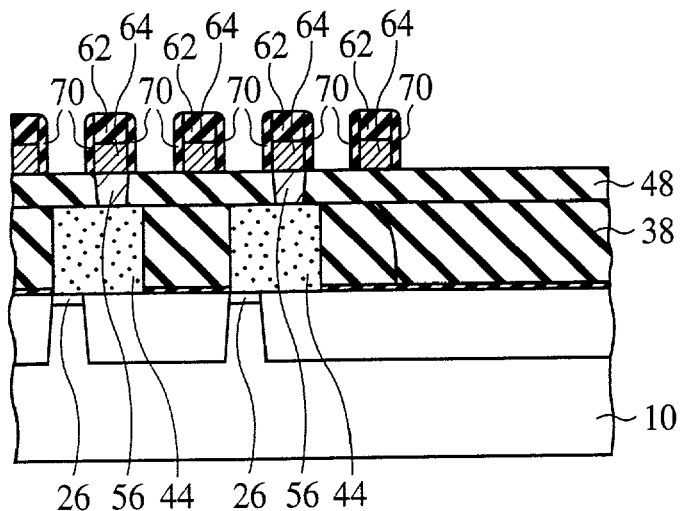

Then, a silicon nitride film of, e.g., a 5–20 nm-thick is deposited on the entire surface by, e.g., CVD method and etched back to form the sidewall insulation film 70 on the side walls of the bit lines 64, the interconnection layers 66, 68 and the silicon nitride film 62 (FIG. 8B, FIG.14C, FIG. 19C). The bit lines 64 are not seen in the section shown in FIG. 8B, but a bit line 64 is shown by the dotted line so as to make clear the positional relationships with the other constituent members.

Next, a silicon oxide film of, e.g., a 500 nm-thick is deposited on the entire surface by, e.g., CVD method, and the surface of the silicon oxide film is polished by CMP method until the silicon nitride film 62 is exposed, to form the inter-layer insulation film 72 of the silicon oxide film having the surface planarized.

Next, contact holes 74 are formed in the inter-layer insulation films 72, 48 down to the plugs 46 by lithography and etching. The contact holes can be opened by self-alignment with the silicon nitride film 62 formed on the bit lines 64, and the sidewall insulation film 70.

Figure 8C:
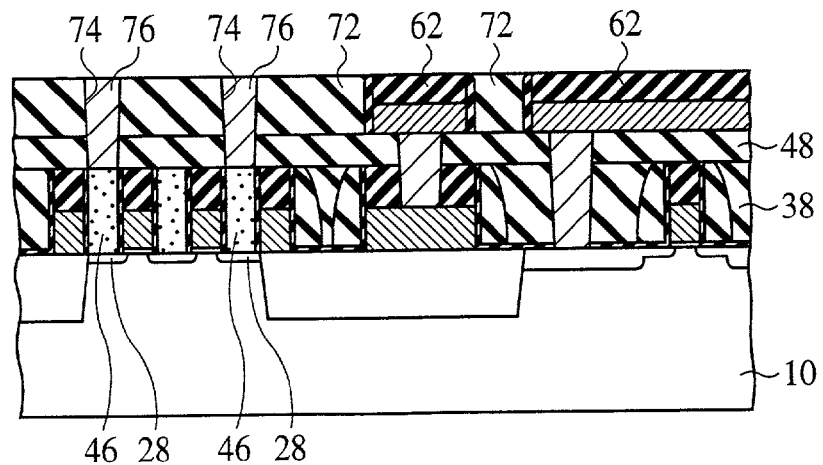
Figure 15A:
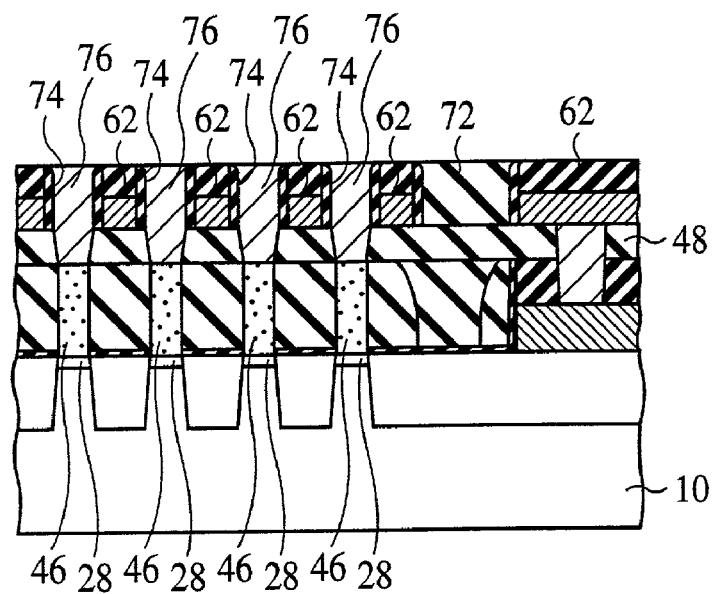
Figure 20A:
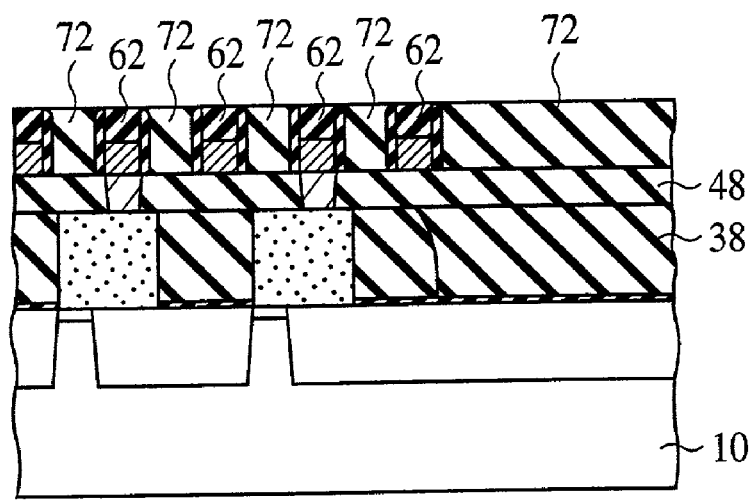
Figure 21A:
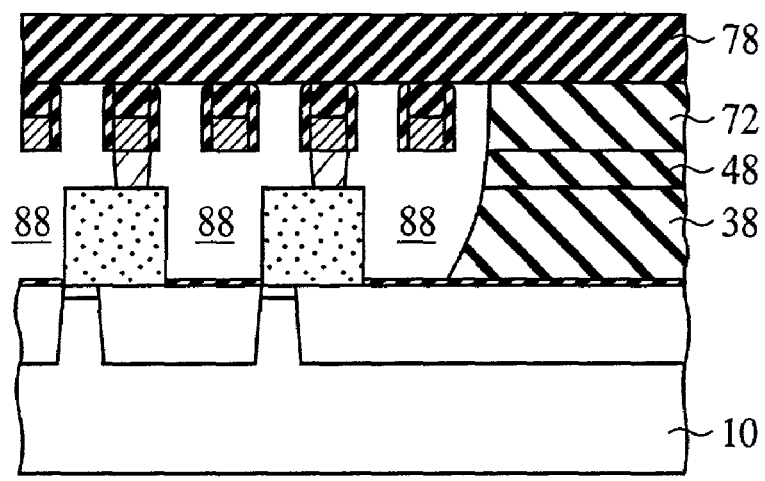

Next, the plugs 76 are buried in the contact holes 74 opened in the inter-layer insulation films 72, 48 (FIG. 8C, FIG. 15A, FIG. 20A). For example, a Ti film, a TiN film and a W film, for example, are sequentially deposited by CVD method and are selectively left in the contact holes 74 by CMP method or etching-back to thereby form the plugs 76 of the W film, the TiN film and the Ti film.

Materials forming the plugs 76 are not limited to W film, TiN film and Ti film. For example, Ru film, etc. may be used in place of the Ti film as a contact metal, WN film and NbN film, etc. can be used in place of the TiN film as a barrier metal, and Ru film, Pt film, TiN film, etc. can be used in place of the W film. These materials have good oxidation resistance and produce the effect of preventing degradation of contact characteristics between the storage electrodes 84 and the plugs 76. That is, when the capacitor dielectric film 90 is formed, it is often a case that the plugs 76 are oxidized through the storage electrodes 84, and contact characteristics between the storage electrodes 84 and the plugs 76 are often degraded. However, the plugs 76 are formed of such materials of good oxidation resistance, whereby the oxidation of the plugs can be prevented, and the degradation of contact characteristics between the storage electrodes 84 and the plugs 76 can be prevented.

Next, a silicon nitride film of, e.g., a 40–80 nm-thick and a silicon oxide film of, e.g., a 900 nm-thick are deposited on the entire surface by, e.g., CVD method to form the inter-layer insulation film 78 of the silicon nitride film and the inter-layer insulation film 80 of the silicon oxide film.

Figure 9A:
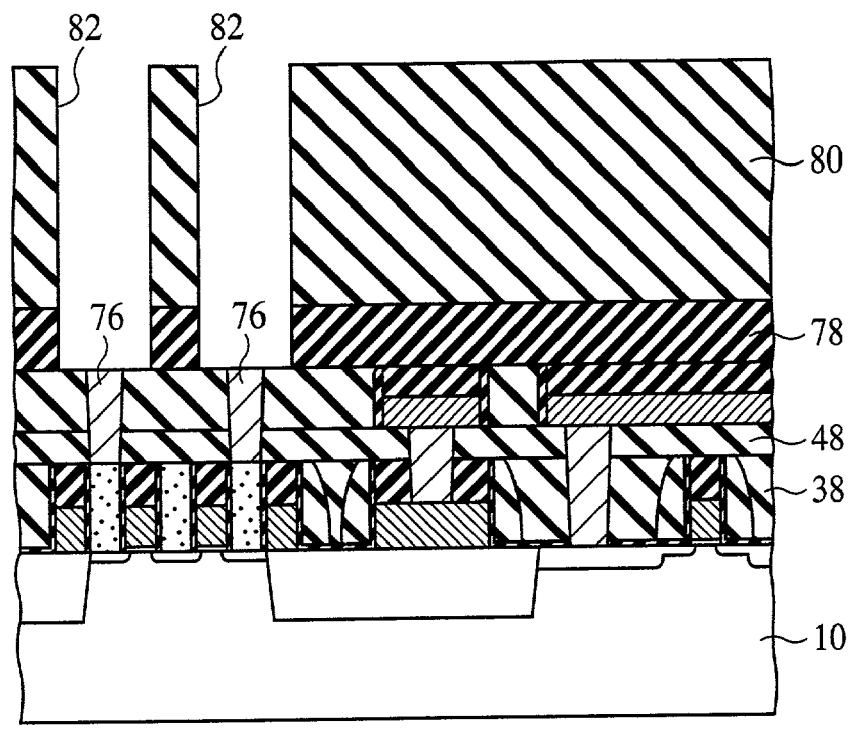
Figure 15B:
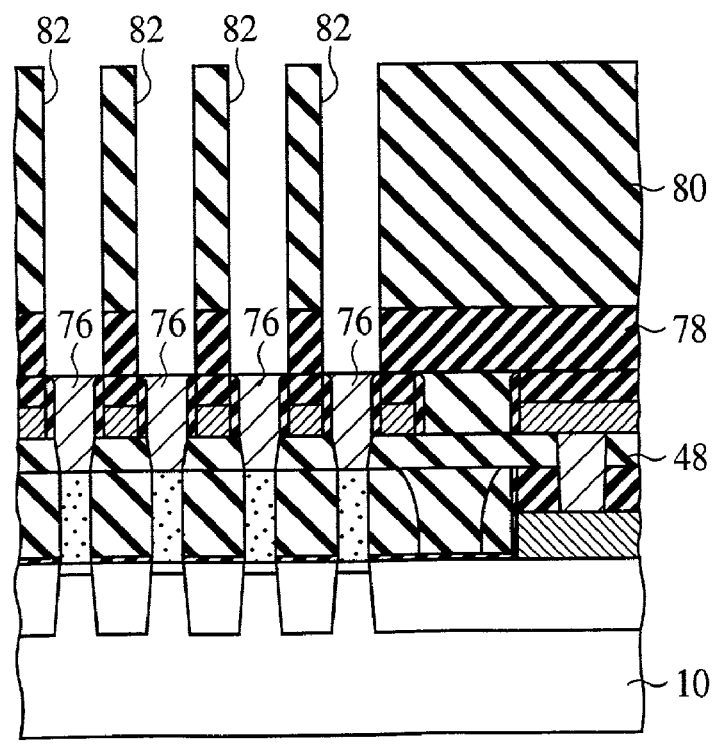
Figure 20B:
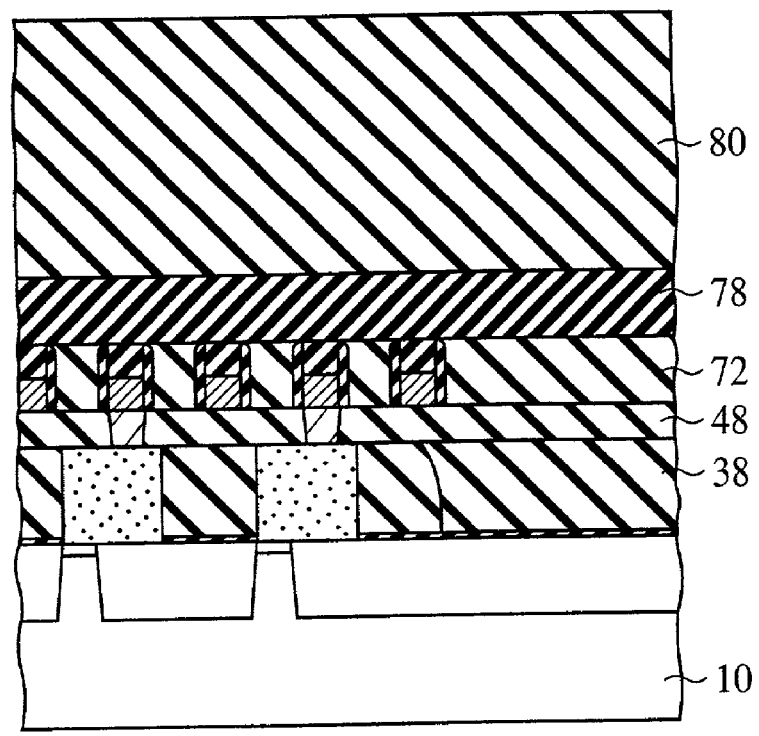

Next, the inter-layer insulation films 80, 78 are patterned by lithography and etching to open openings 82 down to the plugs 76 (FIG. 9A, FIG. 15B, FIG. 20B). The openings 82 are formed in regions for the storage electrodes to be formed.

Then, an Ru film of, e.g., a 30 nm-thick are formed on the entire surface by, e.g., CVD method. The Ru film is to be the storage electrodes.

As a conducting film forming the storage electrodes, a material having good compatibility with the capacitor dielectric film and poor adhesion at least to the inter-layer insulation film 78 is selected. When a ferroelectric film or a high dielectric constant film is used as a capacitor dielectric film, and a silicon nitride film is used as the inter-layer insulation film 78, a noble metal, such as Ru (ruthenium), Pt (platinum) or others, can be used. In the specification of the present application, poor adhesion to an inter-layer insulation film means a state that in wet-etching with a hydrofluoric acid-based aqueous solution, the solution intrudes between the storage electrodes and the inter-layer insulation film.

In the semiconductor device according to the present embodiment, in which the inter-layer insulation film 80 is formed of silicon oxide film, the adhesion between the conducting film forming the storage electrodes, and the inter-layer insulation film 80 is poor. However, in the method for fabricating the semiconductor device according to the present embodiment, in which the inter-layer insulation film 80 is all etched in a later step, the good adhesion between the conducting film forming the storage electrodes and the inter-layer insulation film 80 is never a barrier to producing the effect of the present invention.

Next, an SOG film, for example, is deposited on the entire surface by, e.g., spin coating method. The SOG film functions as an inside protection film for protecting the inside regions of the storage electrodes when the storage electrodes are formed by polishing in a later step. The SOG film may be replaced by, e.g., a photoresist film.

Figure 9B:
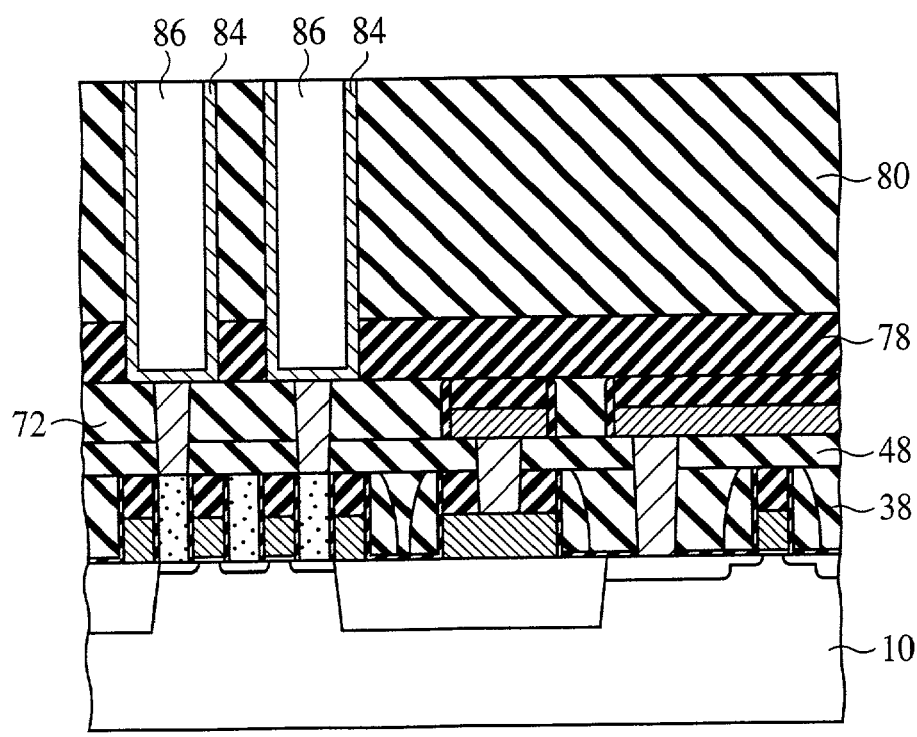
Figure 16A:
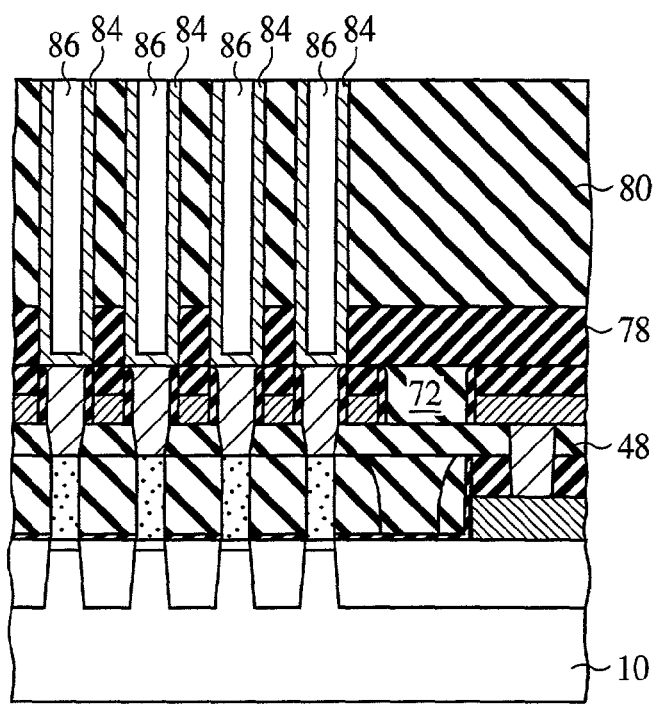

Then, the SOG film and the Ru film are removed, planarized by, e.g., CMP method until the inter-layer insulation film 80 is exposed on the surface to form the storage electrodes 84 of the Ru film formed in the openings 82, and the inner protection film 86 of the SOG film buried in the openings 82 with the storage electrodes 84 formed in (FIG. 9B, FIG. 16A).

Figure 10A:
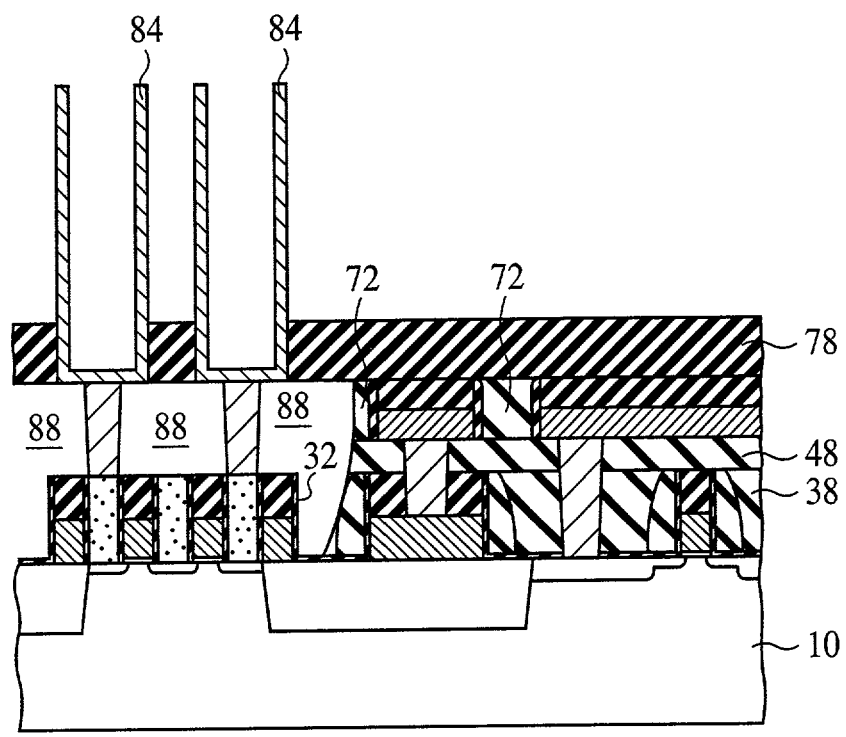
Figure 16B:
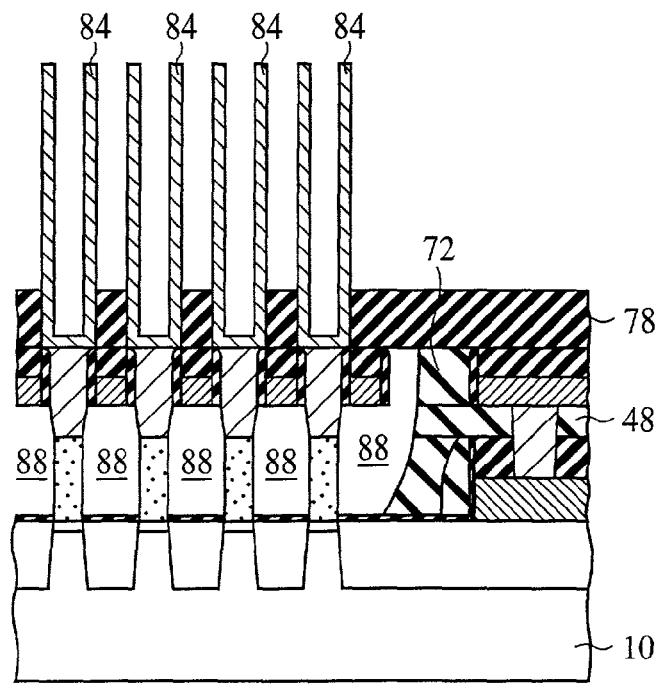

Next, the inter-layer insulation film 80 and the inside protection film 86 are etched by wet etching using, e.g., a hydrofluoric acid-based aqueous solution to expose the outside surfaces of the storage electrodes 84. At this time, because of the poor adhesion between the storage electrodes 84 and the inter-layer insulation film 78, the etchant intrudes into the interface between the storage electrodes 84 and the inter-layer insulation film 78 to etch even the inter-layer insulation films 72, 48, 38 and the sidewall insulation film 34 below the inter-layer insulation film 78. Thus, the cavity 88 is formed in the regions between the word lines (gate electrodes 20), the regions between the bit lines 64, and the regions between the word lines and the bit lines 64 (FIG. 10A, FIG. 16B, FIG. 21A).

The plugs 44, 46 of polycrystalline silicon film, the plugs 56, 76 of W film/TiN film/Ti film, the bit lines 64 of W film, the sidewall insulation film 70 of silicon nitride film, and the silicon nitride films 18, 32, 62, which have etching resistance to hydrofluoric acid-based aqueous solutions, are not etched by the hydrofluoric acid-based aqueous solution. The gate insulation film 14 and the device isolation film 12 are not etched because of the silicon nitride film 32 having etching resistance, which is formed on the side walls of the gate electrodes 20 and on the device isolation film 12.

A risk that the inter-layer insulation film 78 might collapse because of the cavity 88 formed therebelow may be considered. However, the inter-layer insulation film 78 is sufficiently supported by the silicon nitride film 62, and there is no risk that the inter-layer insulation film 78 may collapse. An etching time is suitably controlled to thereby prevent the etching of the inter-layer insulation films 72, 48, 38, and the sidewall insulation film 34 of the peripheral circuit region.

This etching advances isotropically, i.e. substantially spherically, through the interface between the storage electrodes 84 and the inter-layer insulation film 78. Accordingly, the etched surfaces of the inter-layer insulation films 72, 48, 38 and the sidewall insulation film 34 reflect a configuration of the bottom surfaces of the storage electrodes 84. Actually, however, because of the silicon nitride film 62 formed on the bit lines 64, adjacent to the inter-layer insulation film 78, the etching is restricted in the direction of extension of the word lines (gate electrodes 20). That is, in the direction of extension of the bit lines 64, the etching advances isotropically through the interface between the storage electrodes 84 and the inter-layer insulation film 78. On the other hand, in the direction of extension of the word lines, the etching of the inter-layer insulation film 48, etc. on the word lines advances in the direction of extension of the word lines after the inter-layer insulation film 72 between the bit lines 64 has been etched down to the bottom. Accordingly, an apparent etched distance as viewed in plane is smaller by an amount corresponding to a height of the bit lines 64 (refer to FIG. 22). That is, the etched surfaces of the inter-layer insulation films 72, 48, 38 and the sidewall insulation film 34 basically have a configuration corresponding to that of the bottom surfaces of the storage electrodes 84 but is restricted according to arrangements of the bit lines 64 and the word lines.

The cavity 88 drastically decrease an area where the storage electrodes 84, and the inter-layer insulation film 72, etc. contact to each other. Accordingly, even in a case that the storage electrodes 84 are formed of a material, such as Ru, whose diffusion coefficient is high in silicon oxide film, which may cause a risk of heavy metal contamination, the cavity 88 can block paths for the Ru to diffuse and reach the silicon substrate 10. Thus, the cavity 88 produce also the effect of decreasing leakage current to improve retention characteristics.

Figure 10B:
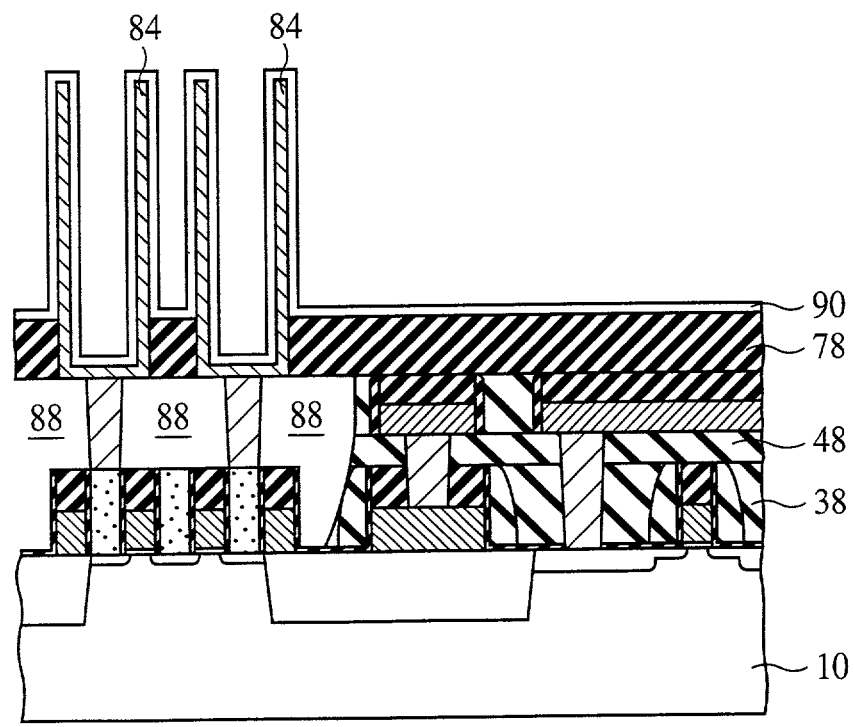
Figure 17A:
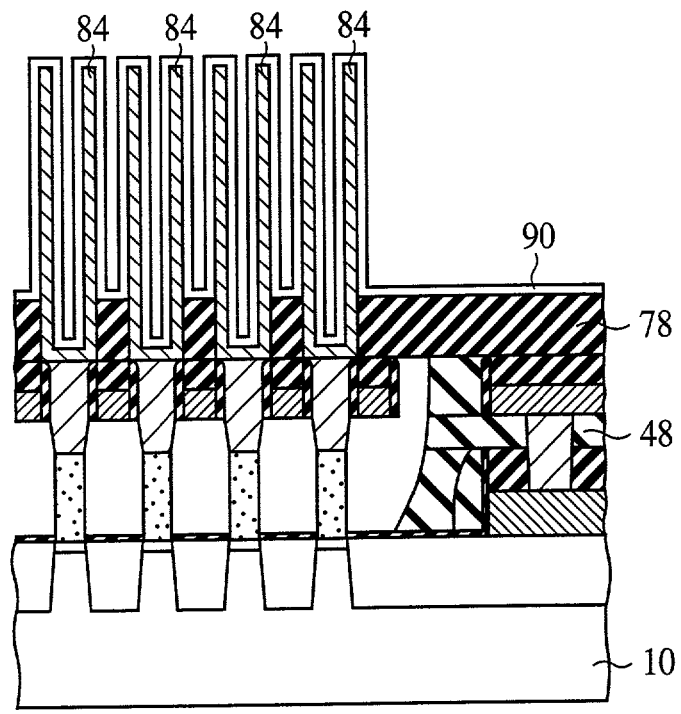

Then, a dielectric film of $Ta_2O_5$ film, BST film TiO film ON film, $Al_2O_3$ film, SBT film, STO film or others of, e.g., a 10–30 nm-thick is deposited on the entire surface by, e.g., CVD method to form the capacitor dielectric film 90 of the dielectric film (FIG. 10B, FIG. 17A).

The etching for forming the cavity 88 is advanced by the intrusion of the etchant into a gap in the interface between the storage electrodes 84 and the inter-layer insulation film 78, but the gap is narrow enough for the inter-layer insulation film 78 to support the storage electrodes 84. Accordingly, the storage electrodes never collapse in the etching step. The gap is closed by the capacitor dielectric film 90, and after the capacitor dielectric film 90 has been formed, the inter-layer insulation film 78 and the storage electrodes 84 can be structurally more stable.

The idea of the process of additionally forming openings and etching the lower insulation films through the openings to form the cavity requires an additional step of closing the opening after the etching. However, the method for fabricating the semiconductor device according to the present embodiment can produce the same effect by forming the capacitor dielectric film 90, and accordingly no addition is made to a fabrication step number.

Figure 11A:
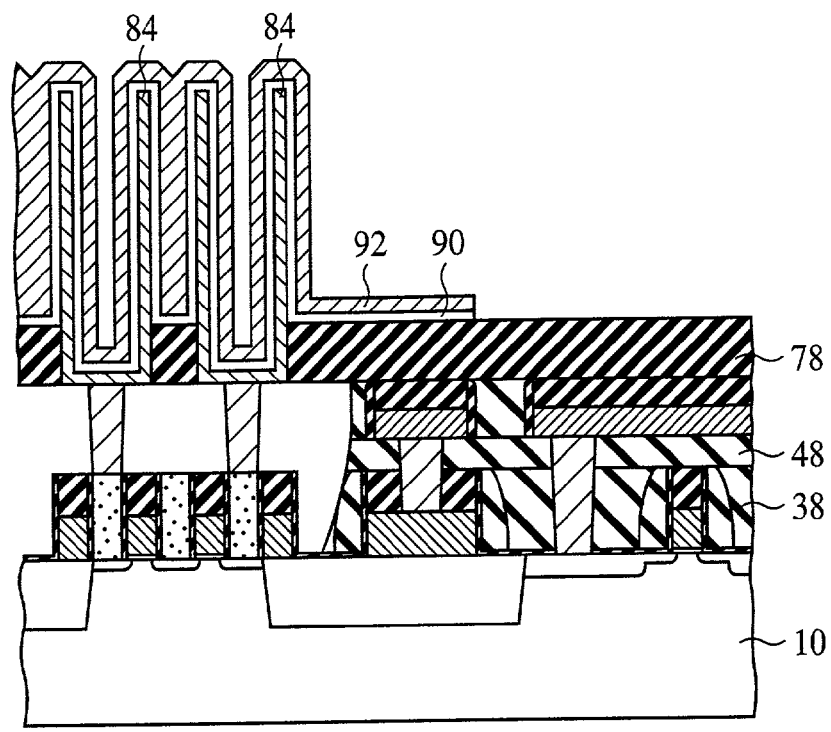
Figure 17B:
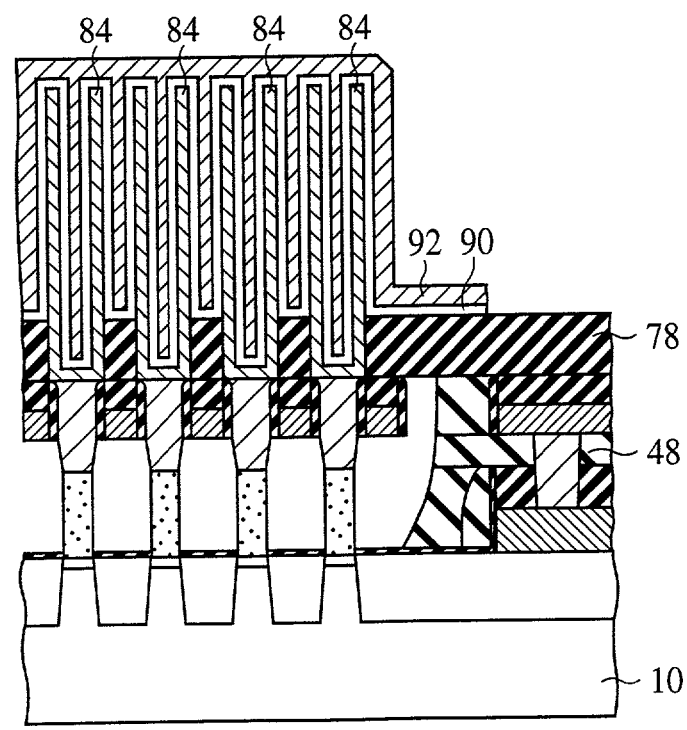
Figure 21B:
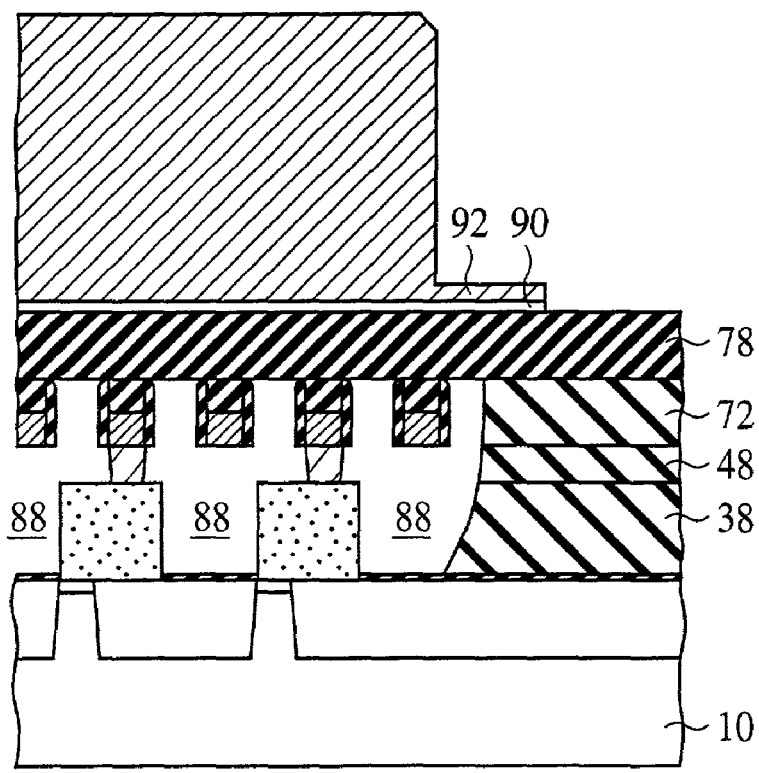
Figure 22:
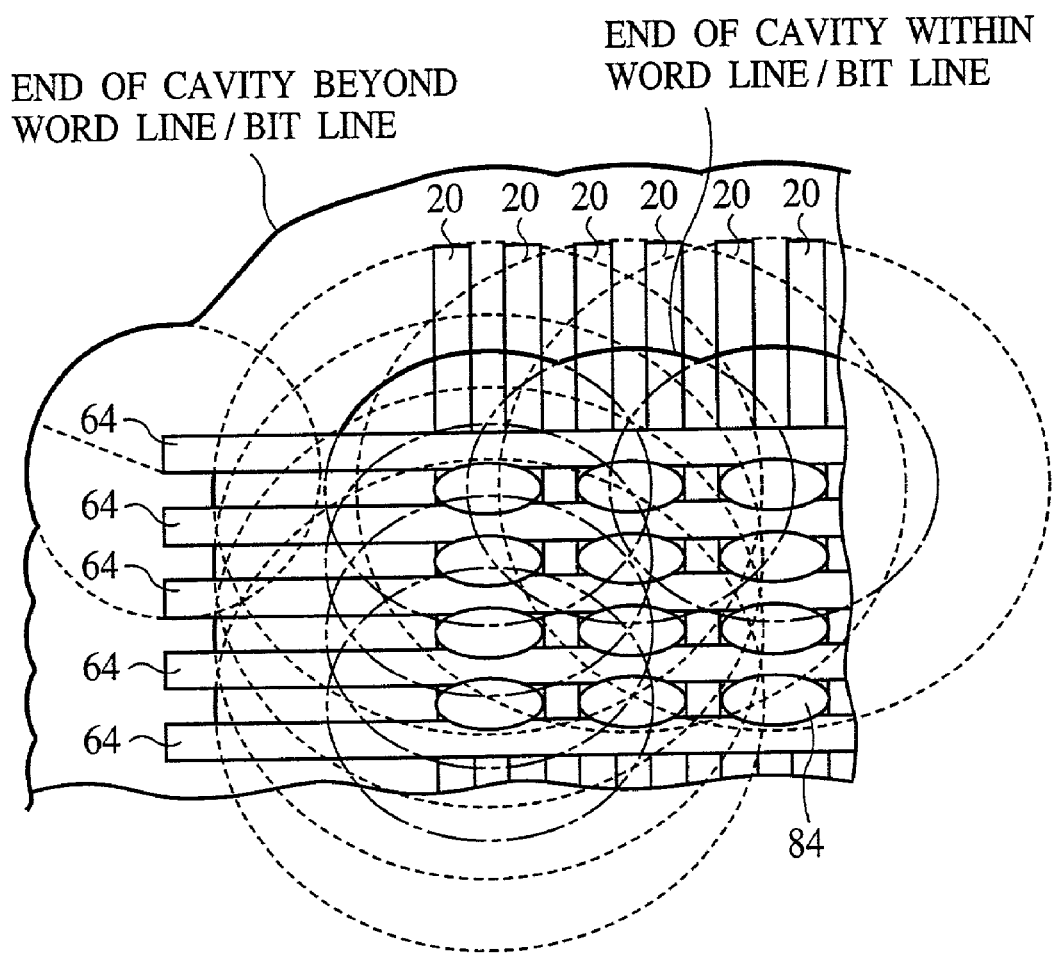
FIG. 22 is a view explaining a process of etching an inter-layer insulation film by the method for fabricating the semiconductor device according to the first embodiment of the present invention.

Next, an Ru film of, e.g., a 50–300 nm-thick is deposited on the entire surface by, e.g., CVD method and patterned by lithography and etching to form the plate electrode 92 of the Ru film (FIG. 11A, FIG. 17B, FIG. 21B). A material of the plate electrodes 92 can be selected suitably in accordance with compatibility with the capacitor dielectric film 90, as is a material of the storage electrodes 84.

Then, a silicon oxide film of, e.g., a 1500 nm-thick is deposited on the entire surface by, e.g., CVD method, and the surface of the silicon oxide film is planarized by, e.g., CMP method to form the inter-layer insulation film 94 of the silicon oxide film having the surface planarized.

Next, the inter-layer insulation films 94, 78, and the silicon nitride film 62 are patterned by lithography and etching to form the contact hole 96 down to the plate electrode 92 and contact hole 98 down to the interconnection layer 68.

Figure 11B:
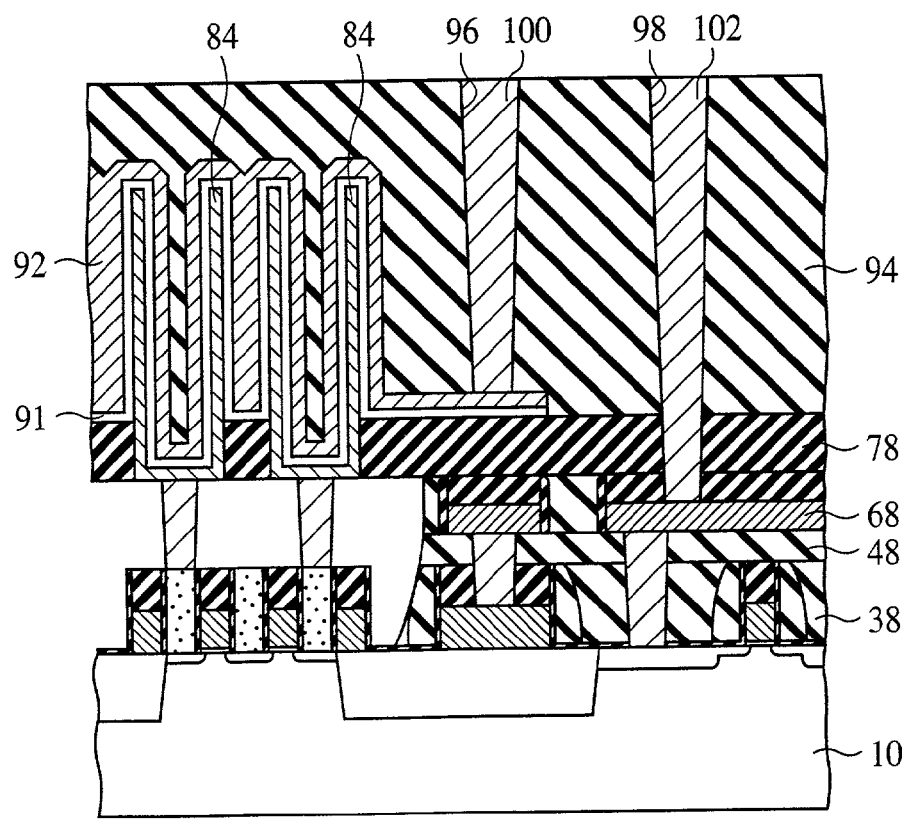

Then, a Ti film, a TiN film and a W film are sequentially deposited on the entire surface by, e.g., CVD method and then polished plane until the surface of the inter-layer insulation film 94 is exposed. Thus, the plugs 100, 102 of the W film, the TiN film and the Ti film buried in the contact holes 96, 98 are formed (FIG. 11B).

Figure 12:
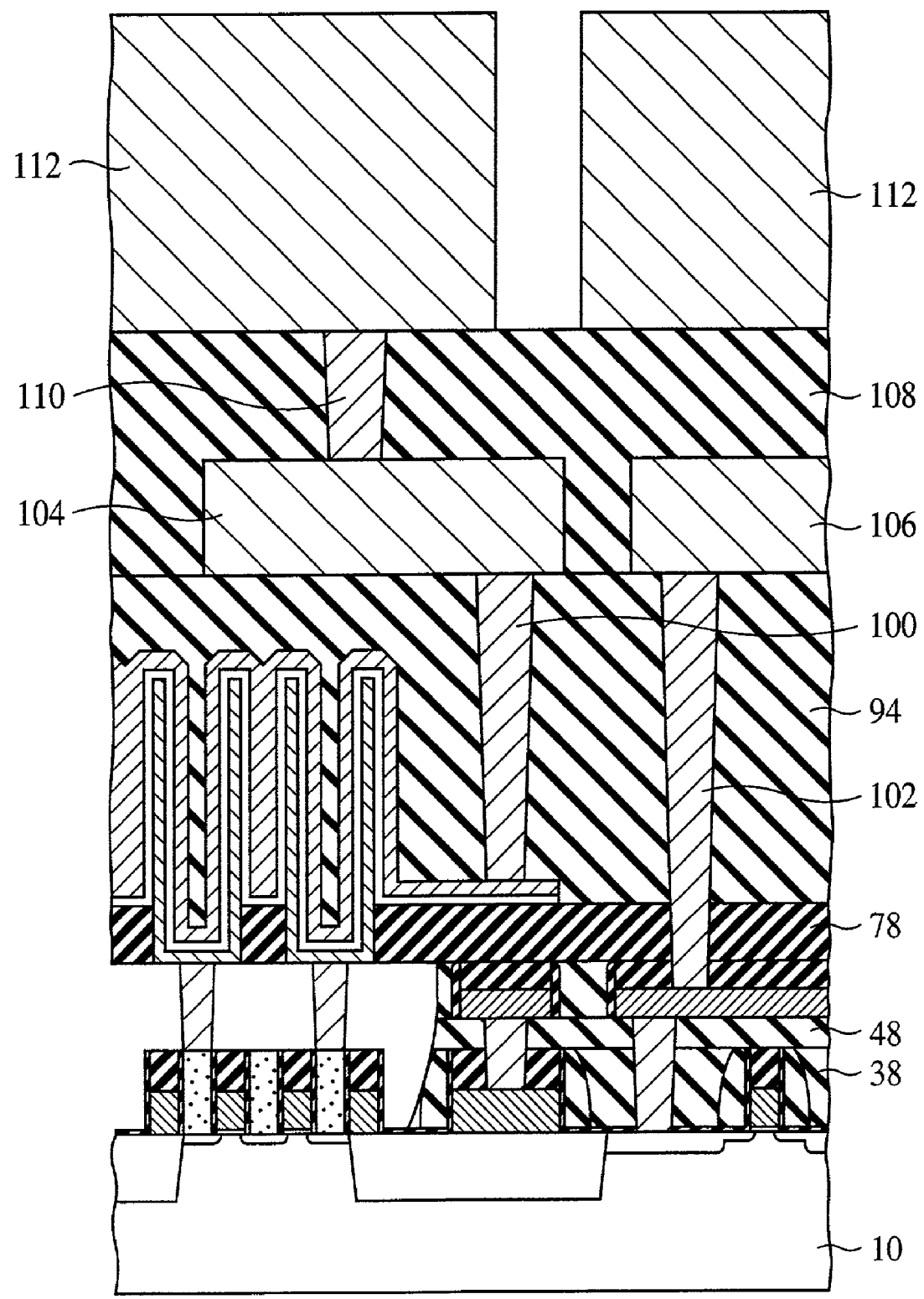

Next, the interconnection layer 104 connected to the plate electrode 92 via the plugs 100, the interconnection layer 106 connected to the interconnection layer 68 via the plugs 102, the inter-layer insulation film 108 covering the interconnection layers 104, 106, plugs 110 connected to the interconnection layer 104 buried in the inter-layer insulation film 108, an interconnection layer 112 connected to the interconnection layer 104 via the plugs 110, etc. are formed on the inter-layer insulation film 94 as required (FIG. 12).

Thus, a DRAM comprising memory cells each including one transistor and one capacitor can be fabricated.

As described above, according to the present embodiment, the cavity is formed in the region between the word lines, the regions between the bit lines and the regions between the word lines and the bit lines, whereby a parasitic capacitance between the word lines, that between the bit lines and that between the word lines and the bit lines can be drastically decreased.

In forming the cavity, the intrusion of the etchant through the interface between the storage electrodes and the inter-layer insulation film is utilized, which makes it unnecessary to form openings for forming the cavity by additional lithography step and etching step. The etching step for forming the cavity can use the etching step of exposing the outer surfaces of the cylindrical storage electrodes. The openings used for the etching are slight slits which can be easily closed upon forming a known capacitor dielectric film. Accordingly, no additional step of closing the openings is required. Thus, the object of the present invention of decreasing parasitic capacitance can be attained without complicating the fabrication steps.

[A Second Embodiment]

The semiconductor device and the method for fabricating the same according to a second embodiment of the present invention will be explained with reference to FIGS. 23, 24A–24B, 25A–25C, 26A–26C, 27A–27C, 28A–28B, 29A–29C, 30A–30B, 31A–31B, and 32A–32B. The same members of the present embodiments as those of the semiconductor device and the method for fabricating the same according to the first embodiment are represented by the same reference numbers not to repeat or to simplify their explanation.

Figure 23:
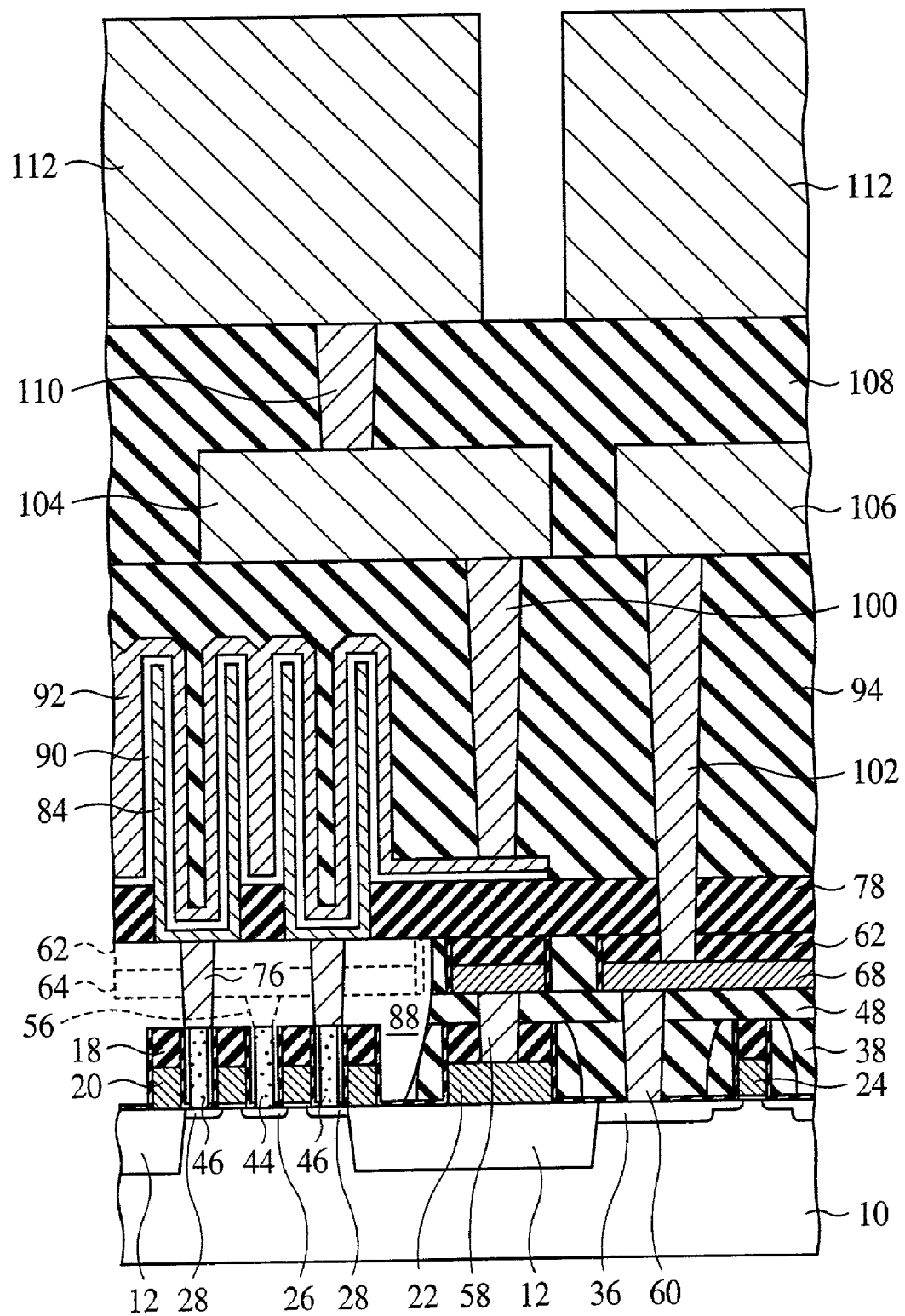
FIG. 23 is a diagrammatic sectional view of the semiconductor device according to a second embodiment of the present invention, which shows a structure thereof.
Figure 24A:
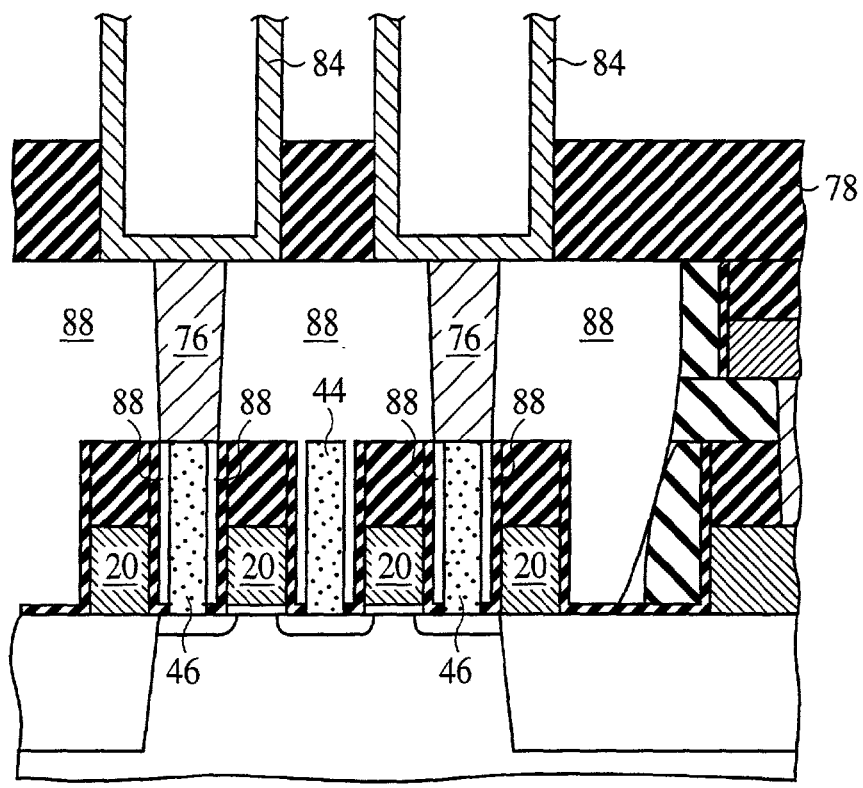
FIGS. 24A and 24B are enlarged views of the memory cell region of the semiconductor device according to the second embodiment of the present invention, which shows the structure thereof.
Figure 24B:
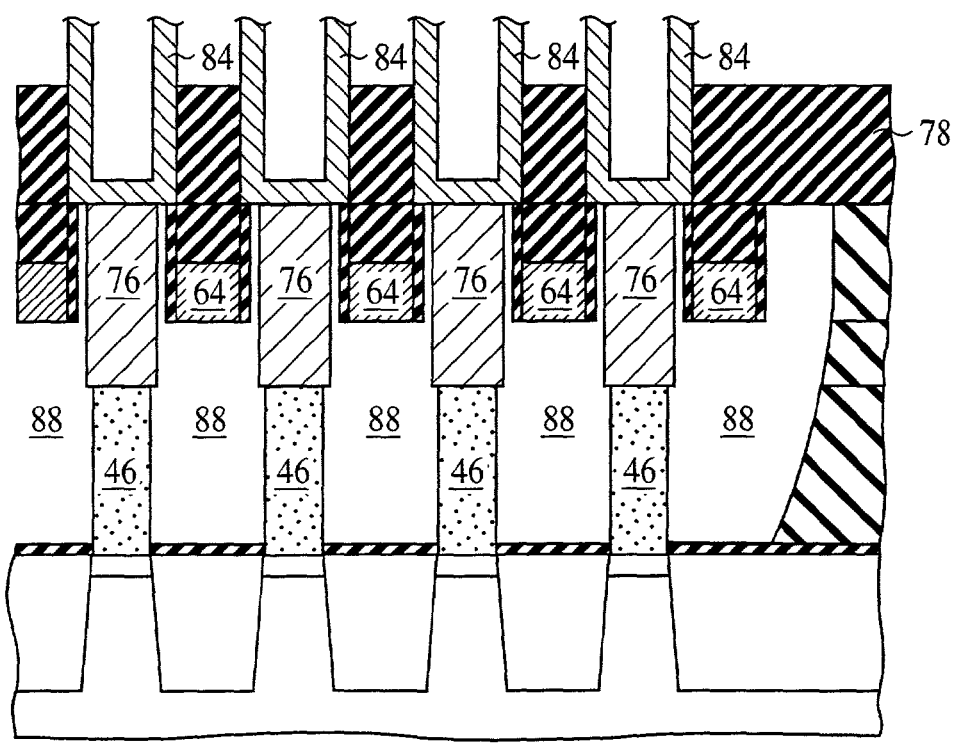

FIG. 23 is a diagrammatic sectional view of the semiconductor device according to the present embodiment, which shows a structure thereof. FIGS. 24A and 24B are enlarged sectional views of the semiconductor device according to the present embodiment, which show the structure thereof. FIGS. 25A–25C, 26A–26C, 27A–27C, 28A–28B, 29A–29C, 30A–30B, and 31A–31B are sectional views of the semiconductor device according to the present embodiment in the steps of the method for fabricating the same, which show the method. FIGS. 32A and 32B are views of results of the observation of the sectional structure of the semiconductor device according to the present embodiment by a scanning electron microscope.

First, the structure of the semiconductor device according to the present embodiment will be explained with reference to FIGS. 23, 24A and 24B. FIG. 23 is the diagrammatic sectional view along the line A–A' in FIG. 1. FIG. 24A is the enlarged sectional view of the memory cell region along the line A–A' in FIG. 1. FIG. 24B is the enlarged sectional view of the memory cell region along the line B–B' in FIG. 1.

As shown in FIG. 23, the semiconductor device according to the present embodiment is basically the same as the semiconductor device according to the first embodiment. The semiconductor device according to the present embodiment is characterized mainly in that the cavity 88 is formed also between word lines (gate electrodes 20) and plugs 44, 46 (refer to FIG. 24A) and also between bit lines 64 and plugs 76 (refer to FIG. 24B). The thus-structured semiconductor device can drastically decrease the parasitic capacitance between the word lines 20 and the plugs 44, between the word lines 20 and the plugs 46 and between the bit lines 64 and the plugs 76.

Next, the method for fabricating the semiconductor device according to the present embodiment will be explained with reference to FIGS. 25A–25C, 26A–26C, 27A–27C, 28A–28B, 29A–29C, 30A–30B, and 31A–31B.

FIGS. 25A–25C, 26A–26C, 27A–27C, and 28A–28B are sectional views of the semiconductor device along the line A–A' in FIG. 1 in the steps of the semiconductor device fabrication method. FIGS. 29A–29C, 30A–30B, and 31A–31B are sectional views of the semiconductor device along the line B–B' in FIG. 1 in the steps of the semiconductor device fabrication method.

First, in the same way as in, e.g., the method for fabricating the semiconductor device according to the first embodiment, a device isolation film 12, memory cell transistors, peripheral circuit transistors, a silicon nitride film 32, sidewall insulation film 34, an inter-layer insulation film 38, etc. are formed. In the present embodiment, a thickness of the silicon nitride film 32 is, e.g., 10 nm.

Figure 25A:
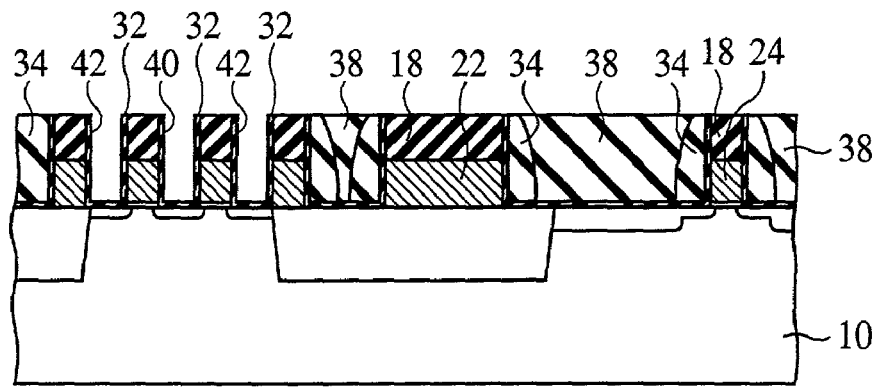
FIGS. 25A–25C, 26A–26C, 27A–27C, 28A–28B, 29A–29C, 30A–30B, and 31A–31B are sectional views of the semiconductor device according to the second embodiment of the present invention in the steps of the method for fabricating the same, which show the method.

Then, the sidewall insulation film 34 on the source/drain diffusions layer 26, 28 is patterned by lithography and etching by self-alignment with gate electrodes 20 and the silicon nitride film 32 to form contact holes 40 down to the silicon nitride film 32 on the source/drain diffusion layer 26, and contact holes 42 down to the silicon nitride film 32 on the source/drain diffusion layer 28 (FIG. 25A).

Then, a 20 nm-thick silicon oxide film is deposited on the entire surface by, e.g., CVD method.

Next, the silicon oxide film is anisotropically etched by dry etching to leave a sidewall insulation film 114 of the silicon oxide film on the side walls of the contact holes 40, 42.

Figure 25B:
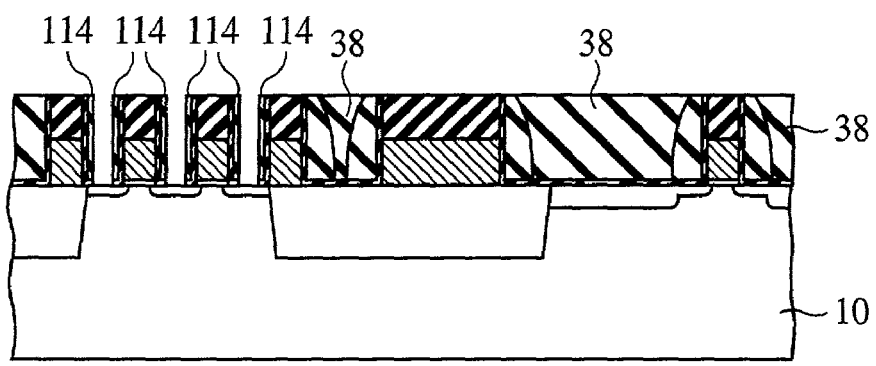

Then, the silicon nitride film 32 on the bottoms of the contact holes 40,42 is selectively removed by dry etching to expose the source/drain diffusion layers 26, 28 in the contact holes 40, 42 (FIG. 25B).

Figure 25C:
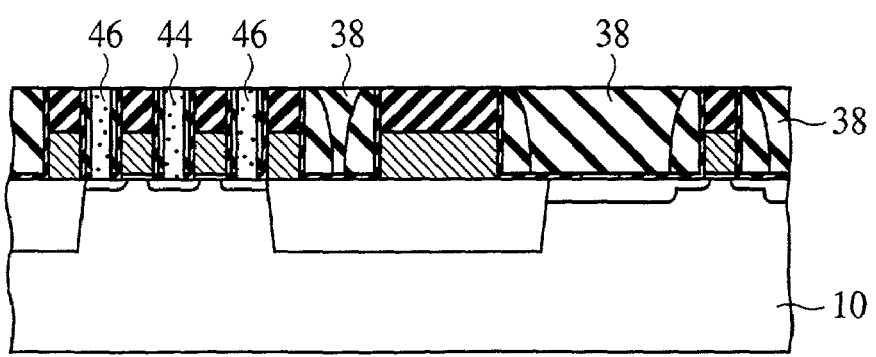

Next, plugs 44, 46 are buried in the contact holes 40, 42 (FIG. 25C). The plugs 44, 46 are formed by, e.g., depositing and etching back a doped polycrystalline silicon film by CVD method to leave the doped polycrystalline silicon film only in the contact holes 40, 42.

Then, a silicon oxide film of, e.g., a 100 nm-thick is deposited on the entire surface by, e.g., CVD method to form an inter-layer insulation film 48 of the silicon oxide film.

Next, the inter-layer insulation films 48, 38, the silicon nitride films 18, 32 are patterned by lithography and etching to form a contact hole 50 down to the plug 44, a contact hole 52 down to the gate electrode 22, and a contact hole 54 down to the source/drain diffusion layer 36.

Figure 26A:
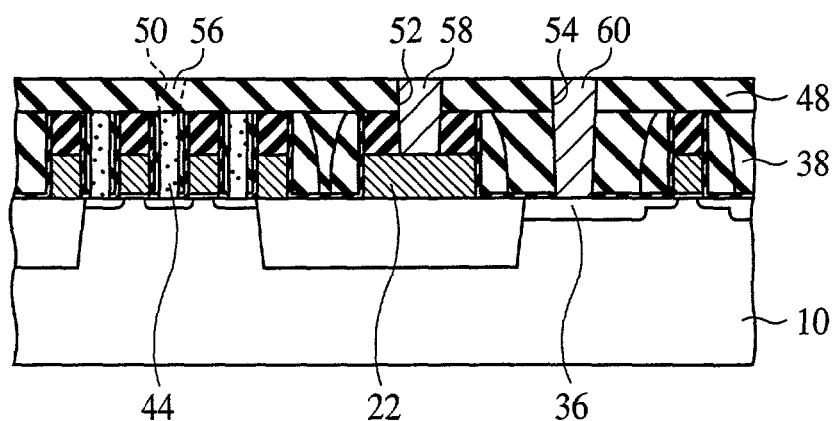

Then, a Ti film, a TiN film and a W film are sequentially deposited on the entire surface by, e.g., CVD method and polished, planarized until the surface of the inter-layer insulation film 48 is exposed. Plugs 56, 58, 60 formed of the W film, the TiN film and the Ti film and buried in the contact holes 50, 52, 54 are formed (FIG. 26A).

Then, a 50 nm-thick W film and a 200 nm-thick silicon nitride film are sequentially deposited on the entire surface by, e.g., CVD method and patterned to form the bit lines 64 having the upper surfaces covered by the silicon nitride film 62 and connected to the source/drain diffusion layer 26 via the plugs 56, 44, the interconnection layer 66 having the upper surface covered by the silicon nitride film 62 and connected to the gate electrode 22 via the plug 58, and the interconnection layer 68 having upper surface covered by the silicon nitride film 62 and connected to the source/drain diffusion layer 36 via the plug 60.

Figure 26B:
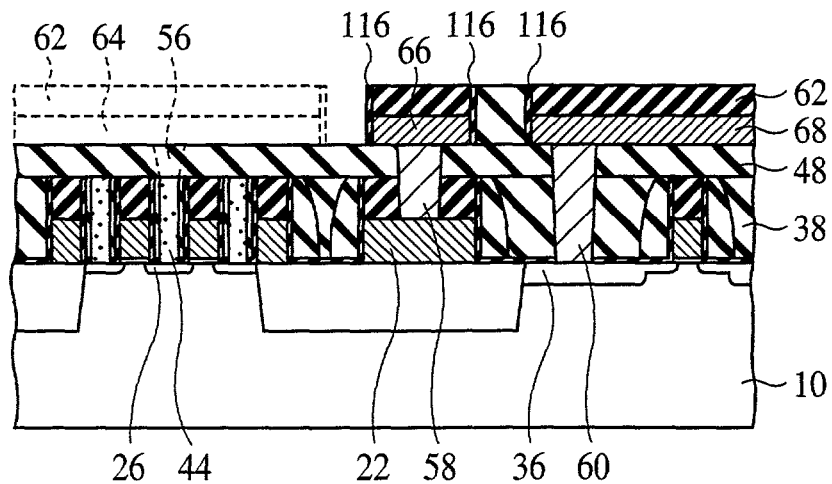
Figure 29A:
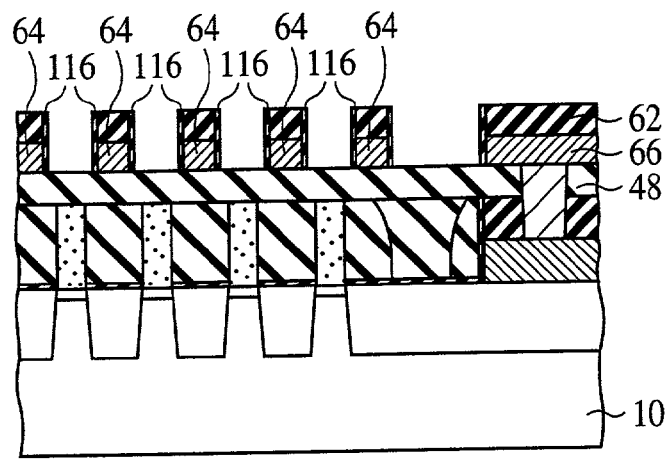

Then, a silicon nitride film of, e.g., a 10 nm-thick is deposited on the entire surface by CVD method and etched back to form a sidewall insulation film 116 of the silicon nitride film on the side walls of the bit lines 64 and the interconnection layers 66, 69 (FIG. 26B, FIG. 29A). The sidewall insulation film 116 is not essential.

Figure 26C:
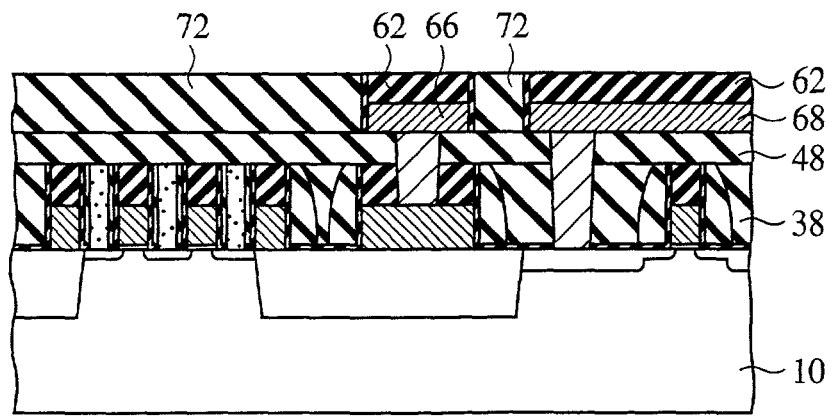
Figure 29B:
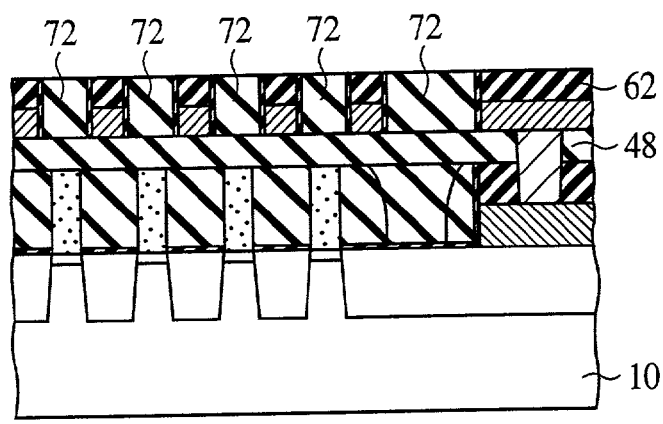

Next, a silicon oxide film of, e.g., a 500 m-thick is deposited on the entire surface by, e.g., CVD method, and the surface of the silicon oxide film is polished by CMP method until the silicon nitride film 62 is exposed to form an inter-layer insulation film 72 of the silicon oxide film having the surface planarized (FIG. 26C, FIG. 29B).

Figure 27A:
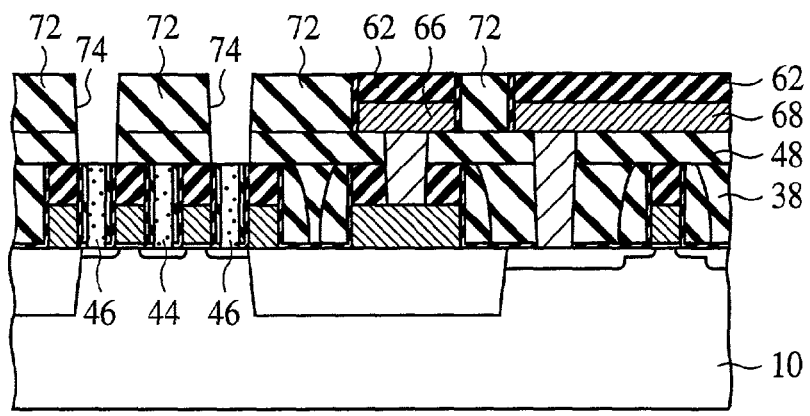
Figure 29C:
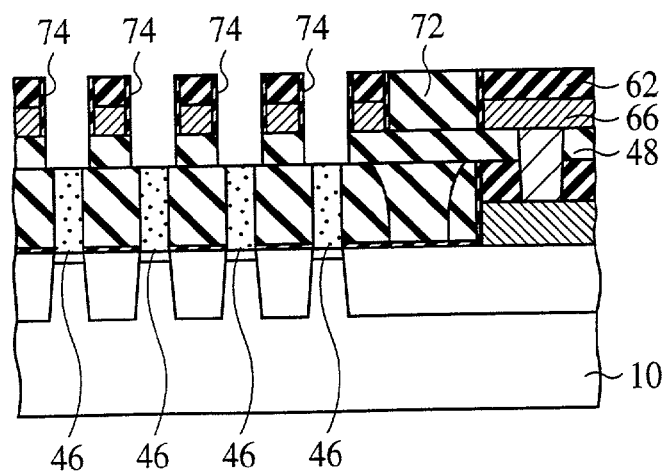

Then, contact holes 74 are formed in the inter-layer insulation films 72, 48 down to the plugs 46 by lithography and etching (FIG. 27A, FIG. 29C). The contact holes 74 can be opened by self-alignment with the silicon nitride film 62 formed on the bit lines 64 and the sidewall insulation film 116.

Figure 27B:
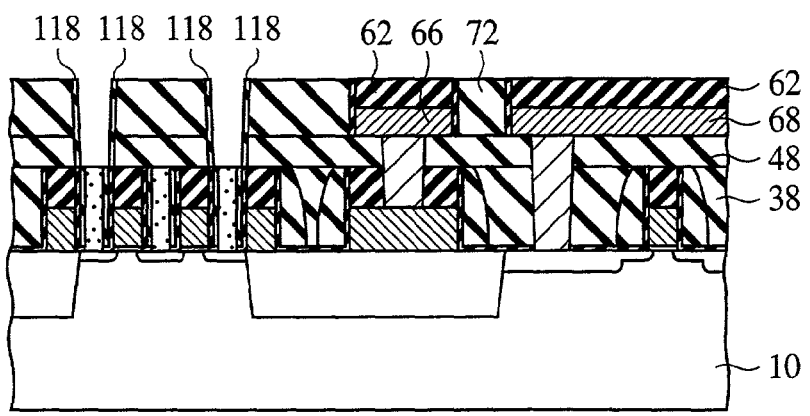
Figure 30A:
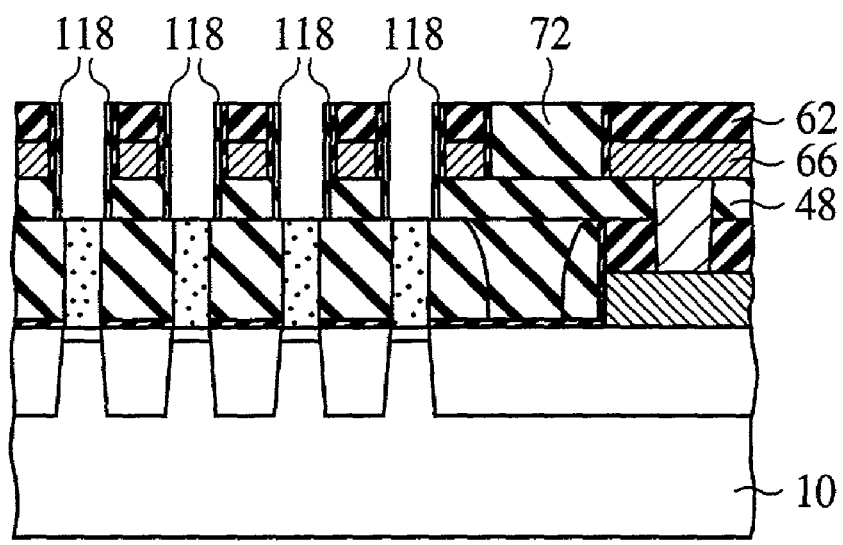

Then, a silicon oxide film of, e.g., a 20 nm-thick is deposited on the entire surface by, e.g., CVD method and etched back to form a sidewall insulation film 118 of the silicon oxide film on the inside walls of the contact holes 74 (FIG. 27B, FIG. 30A).

Figure 27C:
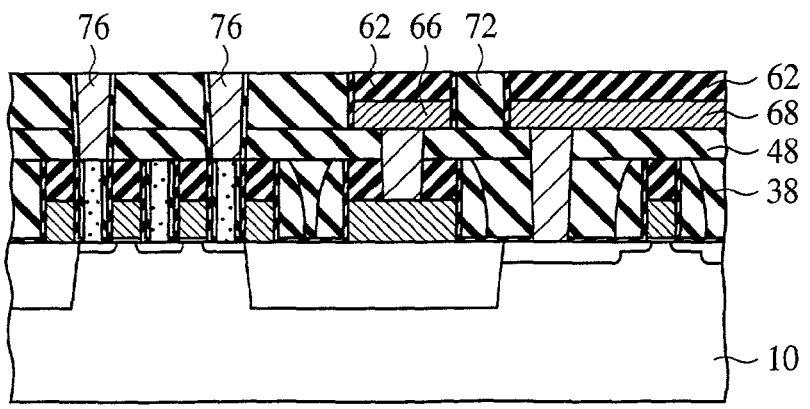
Figure 30B:
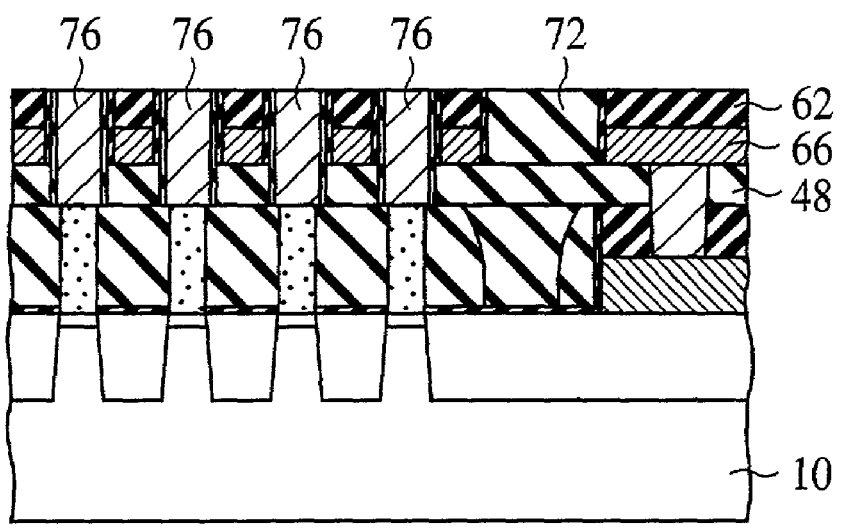

Next, plugs 76 are buried in the contact holes 74 with the sidewall insulation film 118 formed in (FIG. 27C, FIG. 30B). The plugs 76 are formed by sequentially depositing, e.g., a Ti film, a TiN film and a W film by, e.g., CVD method and leaving the W film, the TiN film and the Ti film selectively in the contact holes 74 by CMP method or etching back.

Figure 28A:
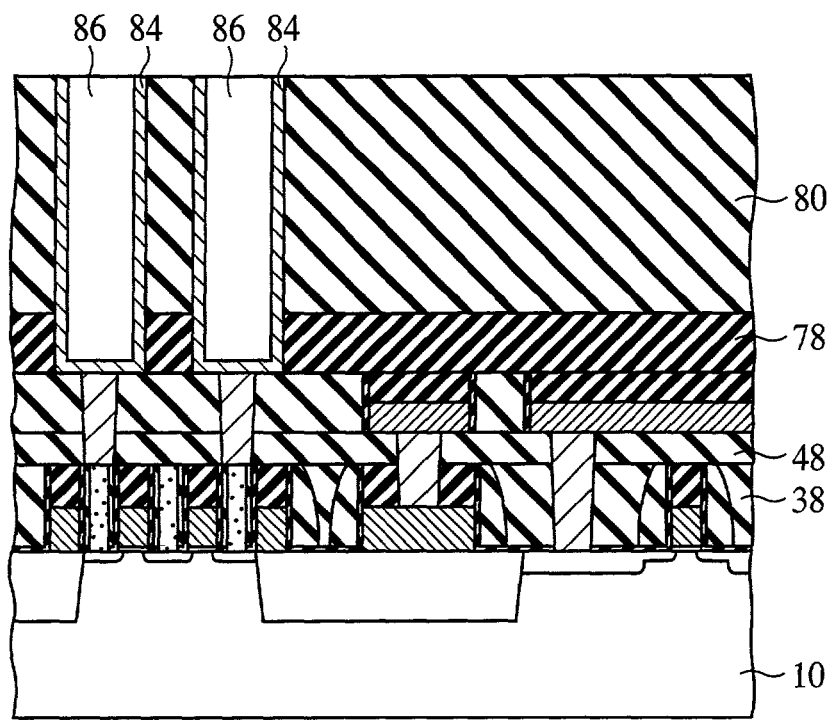
Figure 31A:
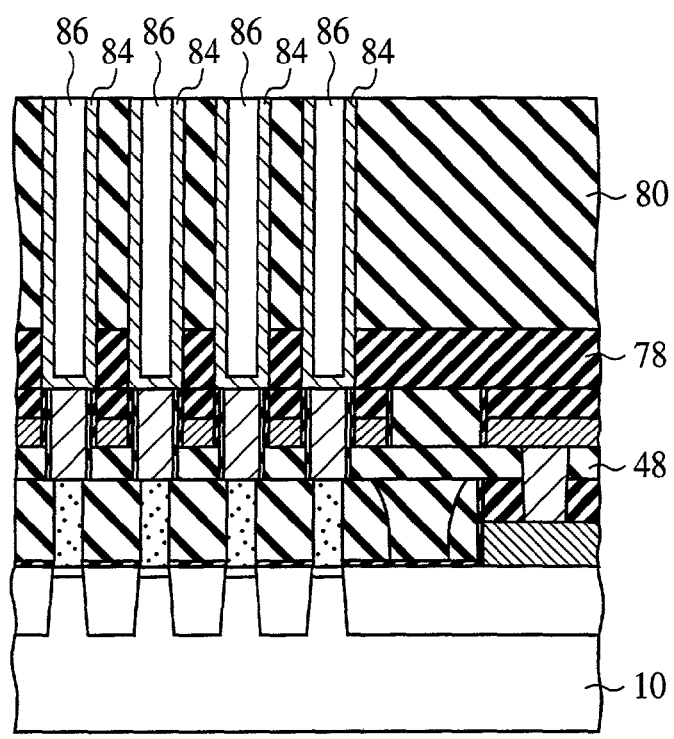
Figure 32A:
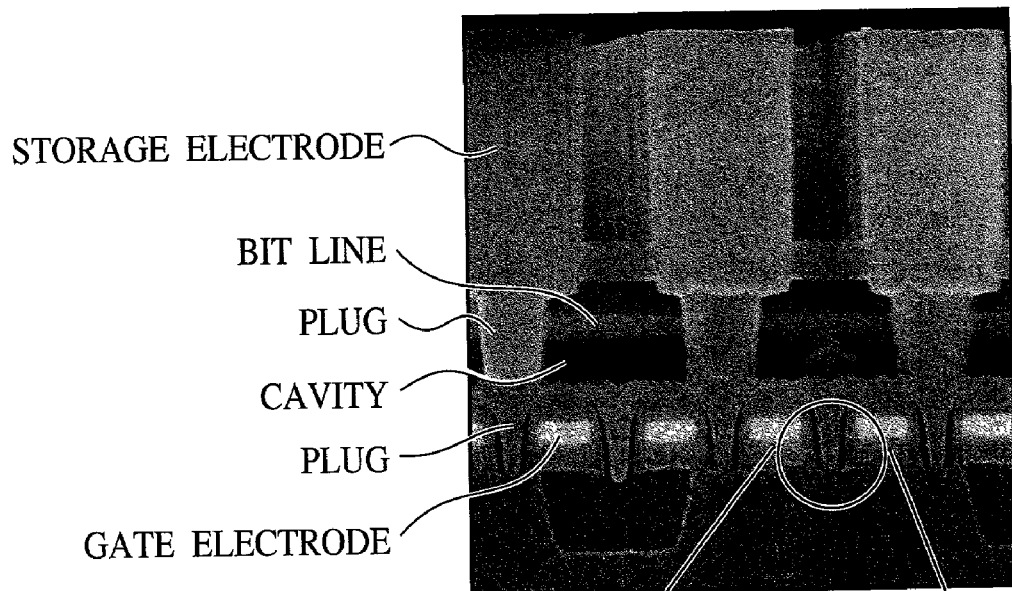
FIGS. 32A and 32B are views of results of the observation of the sectional structure of the semiconductor device according to the second embodiment of the present invention by a scanning electron microscope.
Figure 32B:
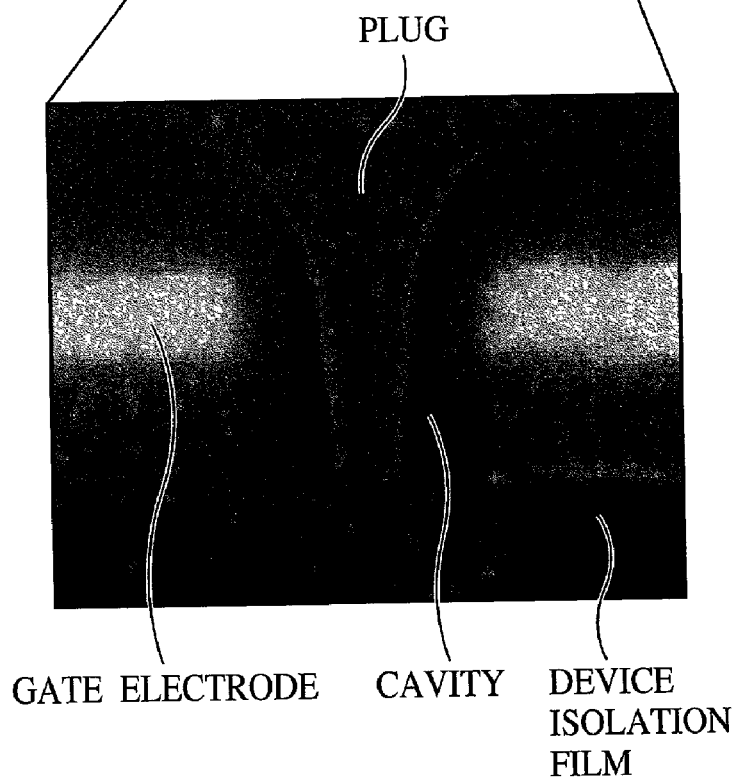

Then, in the same way as in, e.g., the method for fabricating the semiconductor device according to the first embodiment, inter-layer insulation films 78, 80, storage electrodes 84 and an inside protection film 86 are formed (FIG. 28A, FIG. 31A).

Figure 28B:
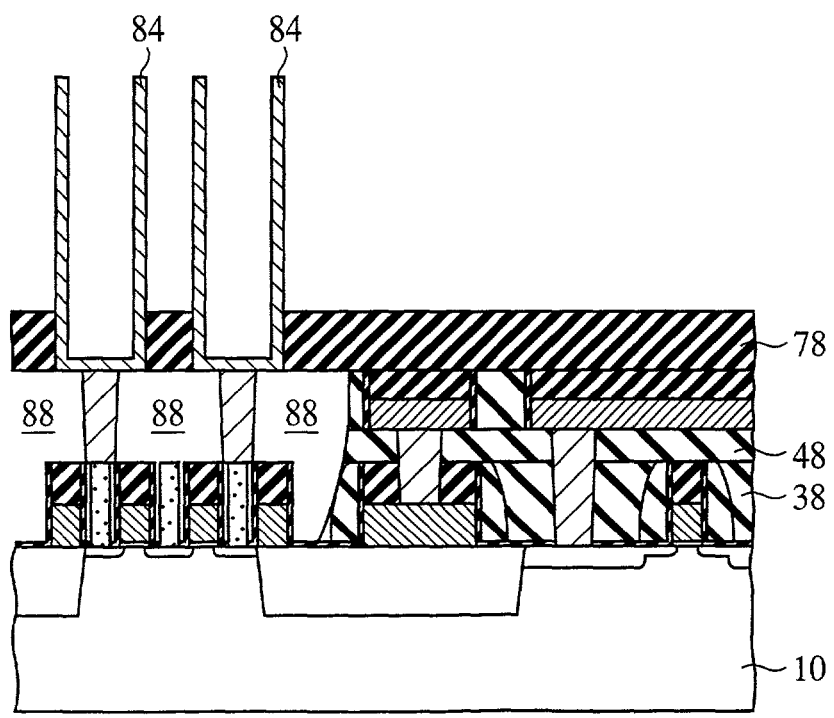
Figure 31B:
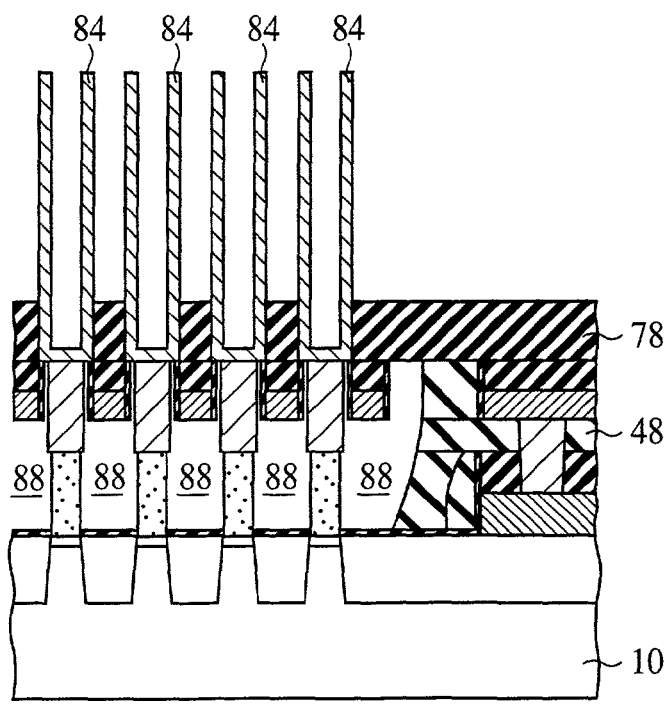

Next, the inter-layer insulation film 80 and the inside protection film 86 are etched by wet etching using, e.g., a hydrofluoric acid-based aqueous solution to expose the outside surfaces of the storage electrodes 84 while the inter-layer insulation films 72, 48, 38 below the inter-layer insulation film 78, and the sidewall insulation films 34, 114, 118 are etched, whereby cavity 88 is formed in the regions between the word lines (gate electrodes 29), the regions between the bit lines 64, the regions between the word lines and the bit lines 64, the regions between the word lines 20 and the plugs 44, 46 and the regions between the bit lines 64 and the plugs 76 (FIG. 28B, FIG. 31B).

The bottom of the sidewall insulation film 114 is closed by the silicon nitride film 32 and the plugs 44, 46 (refer to FIG. 24A). The adhesion between the silicon nitride film 32 and the plugs 44, 46 of the polycrystalline silicon film is good enough to prohibit the etchant from intruding through the interface between the silicon nitride film 32 and the plugs 44, 46 and etching the device isolation film 12 and the gate insulation film 14.

Next, in the same way as in, e.g., the method for fabricating the semiconductor device according to the first embodiment, a capacitor dielectric film 90, plate electrode 92, interconnection layers 104, 106, 112, etc. are formed.

Thus a DRAM comprising memory cells each including one transistor and one capacitor is fabricated.

FIGS. 32A and 32B show results of the observation of the sectional structure of the semiconductor device fabricated by the above-described fabrication method, given by a scanning electron microscope. FIG. 32A shows a section of the region of the memory cell transistors including the capacitors. FIG. 32B shows an enlarged section of the region between the gate electrodes.

In FIG. 32A, it can be seen that the cavity are formed between the plugs, and the bit lines are inner of the plugs. As shown in FIG. 32B, the side walls of the gate electrodes are partially removed, and the cavity is formed there. Thus, the structure having the cavity between the bit lines and between the word lines, which is the same as shown in FIG. 23 can be realized.

Parasitic capacitance par bit line of the conventional semiconductor device having no cavity formed and that of the semiconductor device according to the present embodiment having cavity were measured. A parasitic capacitance of the former was 132.3 fF/BL. A parasitic capacitance of the semiconductor device according to the present embodiment was 74.9 fF/BL. The parasitic capacitance could be decreased by about 57%, which was about 43% of the parasitic capacitance of the conventional semiconductor device. Furthermore, the decrease of the parasitic capacitance of the bit lines makes it possible to decrease a required capacitance per one cell of the storage capacitance from 30 fF/cell to 21 fF/cell. As a whole, a total power consumption could be decreased by about 25.4%.

As described above, according to the present embodiment, the cavity is formed in the region between the word lines, the region between the bit lines, the regions between the word lines and the bit lines, the regions between the word lines and the plugs and the regions between the bit lines and the plugs, whereby a parasitic capacitance between the word lines, a parasitic capacitance between the bit lines, a parasitic capacitance between the word lines and the bit lines, a parasitic capacitance between the word liens and the plugs, and a parasitic capacitance between the bit lines and the plugs can be drastically decreased.

In the present embodiment, the sidewall insulation film 70 of silicon nitride film is left on the side walls of the bit lines 64, but the sidewall insulation film 70 may not be formed, without any problem in the structure and the fabrication steps.

In the present embodiment, the cavity 88 is formed by forming the sidewall insulation film 118 of silicon oxide film in the contact holes 74 down to the plugs 46 and then removing the sidewall insulation film 118. However, the cavity 88 may be formed on side walls of the bit lines 64 in the same way as in the method for fabricating the semiconductor device according to a fourth embodiment of the present invention which will be described later.

[A Third Embodiment]

The semiconductor device and the method for fabricating the same according to a third embodiment of the present invention will be explained with reference to FIGS. 33 and 34A–34B. The same members of the present embodiment as those of the semiconductor device and the method for fabricating the same according to the first and the second embodiments are represented by the same reference numbers not to repeat or to simplify their explanation.

Figure 33:
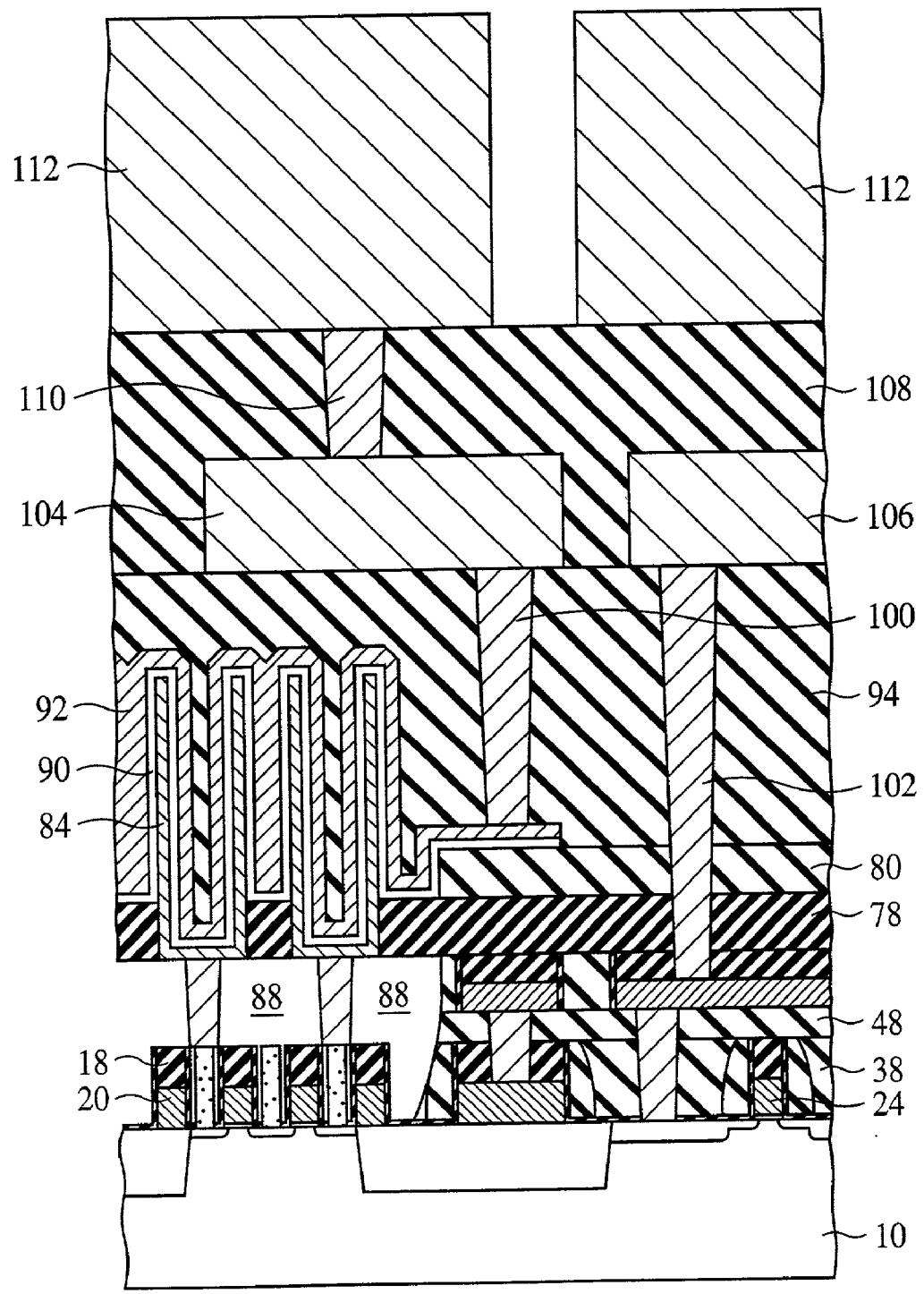
FIG. 33 is a diagrammatic sectional view of the semiconductor device according to a third embodiment of the present invention, which shows a structure thereof.

FIG. 33 is a diagrammatic sectional view of the semiconductor device according to the present embodiment, which shows a structure thereof. FIGS. 34A–34B are sectional views of the semiconductor device according to the present embodiment in the steps of the method for fabricating the same, which show the method.

First, the structure of the semiconductor device according to the present embodiment will be explained with reference to FIGS. 33 and 34. FIG. 33 is a diagrammatic sectional view along the line A–A' in FIG. 1.

As shown in FIG. 33, the semiconductor device according to the present embodiment is basically the same as the semiconductor device according to the second embodiment. The semiconductor device according to the present embodiment is characterized mainly in that a part of an inter-layer insulation film 80 used in forming cylindrical storage electrodes 84 remain in a peripheral circuit region.

Such structure of the semiconductor device is an example provided by suitably controlling etching amounts of insulation films below the inter-layer insulation film 78. The significance and effects of controlling etching amounts of the insulation films below the inter-layer insulation film 78 will be detailed along the method for fabricating the semiconductor device according to the present embodiment shown in FIGS. 34A and 34B. FIGS. 34A and 34B are sectional views of the semiconductor device along the line A–A' in FIG. 1 in the steps of the method for fabricating the same.

Figure 34A:
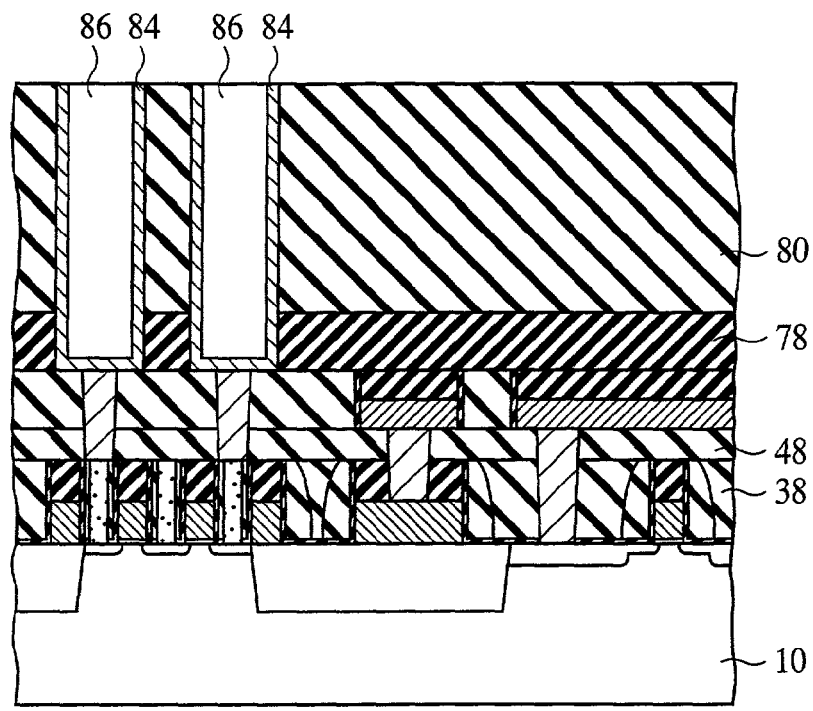
FIGS. 34A and 34B are sectional views of the semiconductor device according to the third embodiment of the present invention in the steps of the method for fabricating the same, which explain the method.

First, in the same way as in, e.g., the method for fabricating the semiconductor device according to the second embodiment, memory cell transistors, peripheral circuit transistors, storage electrodes 84, etc. are formed (FIG. 34A).

Figure 34B:
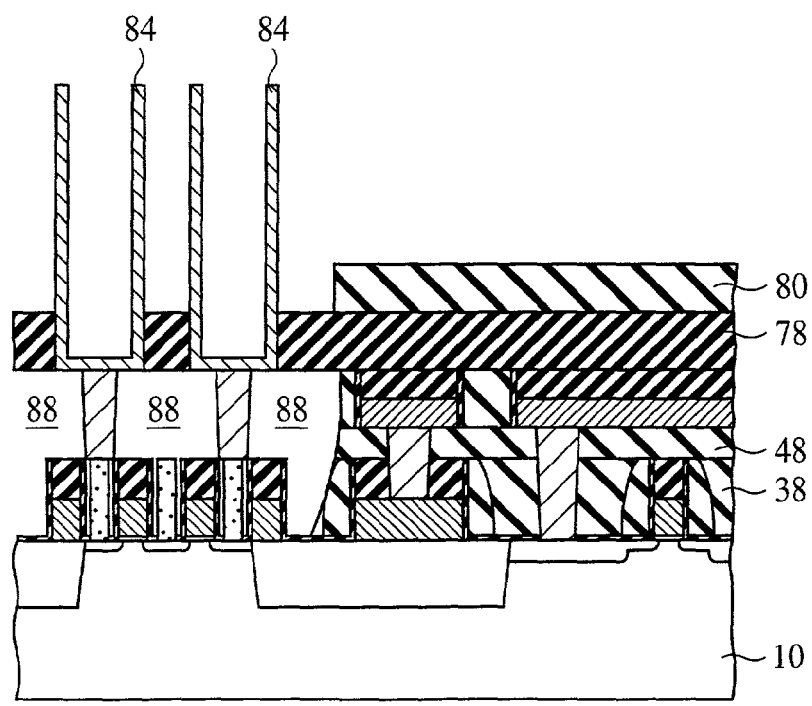

Next, the inter-layer insulation film 80 and an inside protection film 86 are etched by wet etching using, e.g., hydrofluoric acid aqueous solution to expose the outside surfaces of the storage electrodes 84 while inter-layer insulation films 72, 48, 38 and sidewall insulation films 34, 114, 118 below the inter-layer insulation film 78 are etched, whereby cavity 88 is formed (FIG. 34B).

At this time, an etching time is controlled lest the etching of the inter-layer insulation films 72, 48, 38, etc. below the inter-layer insulation film 78 should excessively advance toward the peripheral circuit region to form the cavity 88 also in regions where no structure for supporting the inter-layer insulation film 78 (e.g., bit lines or others) is present, with a result that the inter-layer insulation film 78 may collapse.

In a case that a material of the inter-layer insulation films 78, 80 has poor adhesion to a material of the storage electrodes 84, the intrusion of the etchant into the interface between the storage electrodes 84 and the inter-layer insulation films 70, 80 has already advance even at the early stage of the etching. Accordingly, the etching of the inter-layer insulation film 80 advances from the upper surface of the inter-layer insulation film 80 toward the lower layers while advancing horizontally through the interface between the storage electrodes 84 and the inter-layer insulation film 80. Even at the stage where the inter-layer insulation film 80 has not been completely removed, the etching of the inter-layer insulation films 72, 48, 38, etc. below the inter-layer insulation film 78 advances.

On the other hand, the inter-layer insulation film 80 is often made very thick for the purpose of ensuring a sufficient storage capacitance. In such case, in removing all the inter-layer insulation film 80 after the storage electrodes 84 have been formed, the etching of the inter-layer insulation films 72, 48, 38, etc. below the inter-layer insulation film 78 excessively advances toward the peripheral circuit region to thereby form the cavity in the regions where no structure for supporting the inter-layer insulation film 78 (e.g., bit lines or others) is present.

In the method for fabricating the semiconductor device according to the present embodiment, an etching time is controlled to thereby prohibit the problem that the etching of the inter-layer insulation films 72, 48, 38, etc. below the inter-layer insulation film 78 excessively advances toward the peripheral circuit region to collapse the inter-layer insulation film 78.

It is considered that thus controlling the etching time may leave the inter-layer insulation film 80 in the peripheral circuit region as shown in FIG. 34B. However, the remaining inter-layer insulation film 80 does not make any influence and oppositely can produce a side-effect of decreasing a global step between the memory cell region and the peripheral circuit region. The etching of the inter-layer insulation film 80 advances through the interface between the inter-layer insulation film 80 and the storage electrodes 84 to remove all the inter-layer insulation film 80 in the memory cell region at the early stage of the etching while leaving the inter-layer insulation film 80 in the peripheral circuit region, whereby a capacitance of the capacitors never decreases.

Next, in the same way as in the method for fabricating the semiconductor device according to the first embodiment, a capacitor dielectric film 90, plate electrode 92, interconnection layers 104, 106, 11, etc. are formed.

Thus, a DRAM comprising memory cells each including one transistor and one capacitor can be fabricated.

As described above, according to the present embodiment, the etching of forming the cavity is prohibited from excessively advancing, whereby fabrication yield decrease due to the collapse of the inter-layer insulation film 78 can be prevented.

In the present embodiment, an etching amount of the inter-layer insulation film 80 is controlled to thereby prevent the etching of the inter-layer insulation films 72, 48, 38, etc. below the inter-layer insulation film 78 from excessively advancing toward the peripheral region, but the excessive advance of the etching of the inter-layer insulation films 72, 48, 38, etc. toward the peripheral region may be prohibited by, e.g. forming the inter-layer insulation films 72, 48, 38, etc. below the inter-layer insulation film 78 of non-doped silicon oxide film and forming the inter-layer insulation film 80 of BPSG film or others whose etching rate is high, whereby all the inter-layer insulation film 80 is removed before the inter-layer insulation films 72, 48, 38, etc. have been excessively etched.

It is possible that a hard mask formed of a material which has etching characteristics different from those of the inter-layer insulation films 78, 80 (e.g., amorphous silicon) is formed on the inter-layer insulation film 80 so that the etching of the inter-layer insulation film 80 can advance only through the interface between the inter-layer insulation film 80 and the storage electrodes 84. This allows conditions for the etching to be set in consideration of only etching amounts of the inter-layer insulation films 72, 48, 38, etc.

In the present embodiment, etching amounts of the inter-layer insulation films are controlled in the semiconductor device and the method for fabricating the same according to the second embodiment but is applicable to the semiconductor device and the method for fabricating the same according to the first embodiment.

[A Fourth Embodiment]

The semiconductor device and the method for fabricating the same according to a fourth embodiment of the present invention will be explained with reference to FIGS. 35, 36A–36C, 37A–37B, 38A–38C, and 39A–39B. The same members of the present embodiment as those of the semiconductor device according to the first to the third embodiments are represented by the same reference numbers not to repeat or to simplify their explanation.

Figure 35:
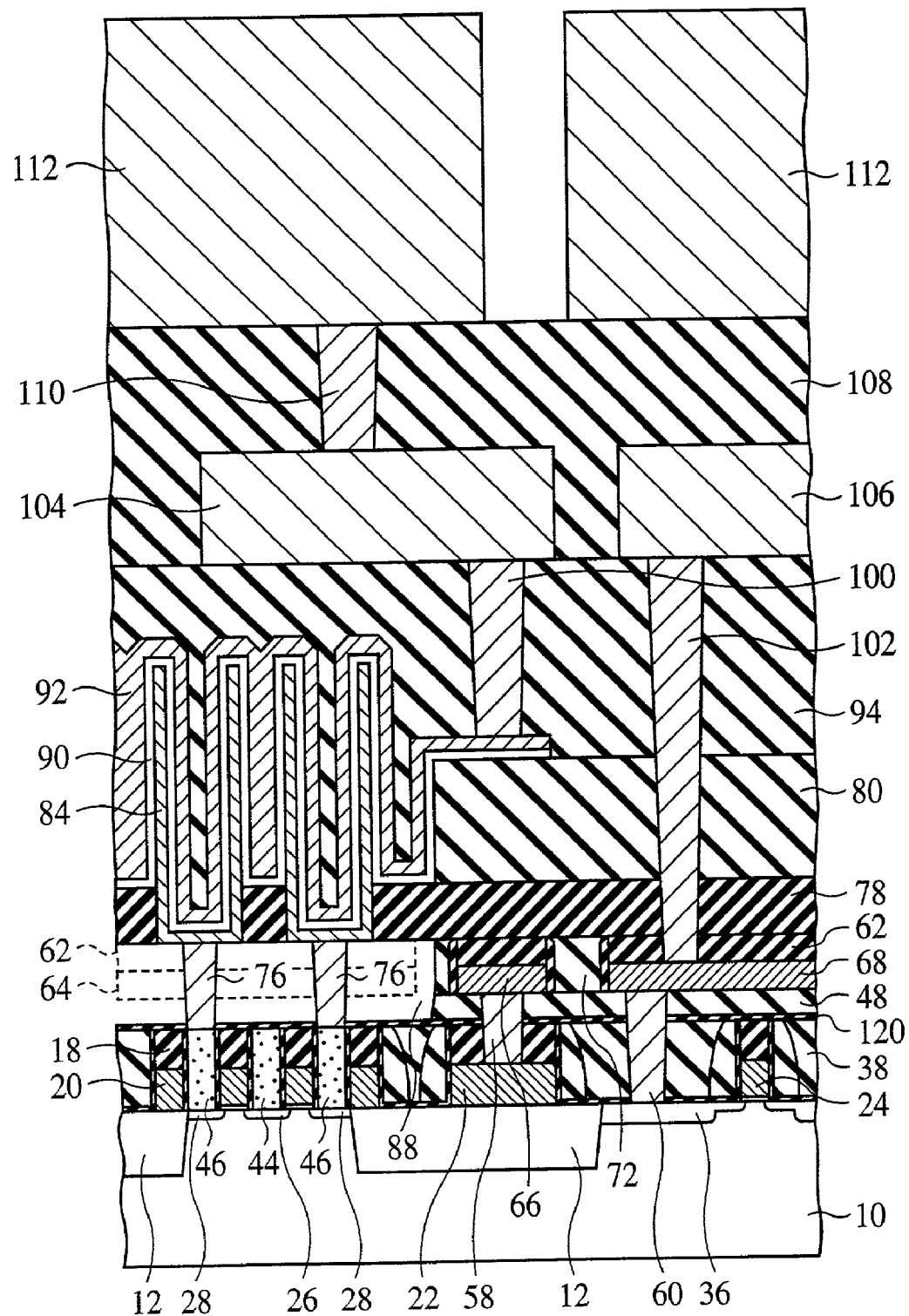
FIG. 35 is a diagrammatic sectional view of the semiconductor device according to a fourth embodiment of the present invention, which shows a structure thereof.

FIG. 35 is a diagrammatic sectional view of the semiconductor device according to the present embodiment, which shows the structure thereof. FIGS. 36A–36C, 37A–37B, 38A–38C, and 39A–39B are sectional views of the semiconductor device according to the present embodiment in the steps of the method for fabricating the same, which show the method.

First, the structure of the semiconductor device according to the present embodiment will be explained with reference to FIG. 35. FIG. 35 is a diagrammatic sectional view along the line A–A' in FIG. 1.

As shown in FIG. 35, the semiconductor device according to the present embodiment is basically the same as the semiconductor device according to the first embodiment. The semiconductor device according to the present embodiment is characterized mainly in that the cavity 88 is formed in the inter-layer insulation films 48, 72, and the inter-layer insulation film 38 and the sidewall insulation film 34 near word lines 20 are not removed. The semiconductor device according to the present embodiment is also characterized in that all the sidewall insulation film on the side walls of bit lines is removed, and cavity 88 is formed there.

The semiconductor device having such structure cannot decrease the parasitic capacitance between the word lines and the parasitic capacitance between the word lines and the plugs, as can be in the semiconductor device according to the first to the third embodiment, but the parasitic capacitance between the word lines and the bit lines and the parasitic capacitance between the bit liens and the plugs can be drastically decreased.

In the semiconductor device according to the present embodiment, the insulation films below the inter-layer insulation film 48 are not removed, and an etching time for forming the cavity 88 can be accordingly short. Accordingly, in applying the method for fabricating the semiconductor device according to the third embodiment, the inter-layer insulation film remaining on the inter-layer insulation film 78 can be thicker (refer to FIG. 35). Accordingly, an effect that a global step between the memory cell region and the peripheral circuit region can be more reduced can be produced.

Next, the method for fabricating the semiconductor device according to the present embodiment will be explained with reference to FIGS. 36A–36C, 37A–37B, 38A–38C, and 39A–39B. FIGS. 36A–36C and 37A–37B are sectional views of the semiconductor device along the line A–A' in FIG. 1 in the steps of the method for fabricating the same. FIG. 38A–38C and 39A–39B are sectional views of the semiconductor device along the line B–B' in FIG. 1 in the steps of the method for fabricating the same.

First, memory cell transistors, peripheral circuit transistors, the inter-layer insulation film 38, etc. are formed in the same way as in, e.g., the method for fabricating the semiconductor according to the first embodiment. In the semiconductor device and the method for fabricating the same according to the present embodiment, it is not essential to form a silicon nitride film 32.

Then, a silicon nitride film of, e.g., a 20 nm-thick is deposited on the entire surface by, e.g., CVD method to form an etching stopper film 120 of the silicon nitride film.

Then, a silicon oxide film of, e.g., a 100 nm-thick is formed on the etching stopper film 120 by, e.g., CVD method to form the inter-layer insulation film 48 of the silicon oxide film.

Next, the inter-layer insulation film 48, the etching stopper film 120, the inter-layer insulation film 38 and the silicon nitride films 18, 32 are patterned by lithography and etching to form a contact hole 50 down to plug 44, a contact hole 52 down to the gate electrode 22, and a contact hole 54 down to the source/drain diffusion layer 36.

Figure 36A:
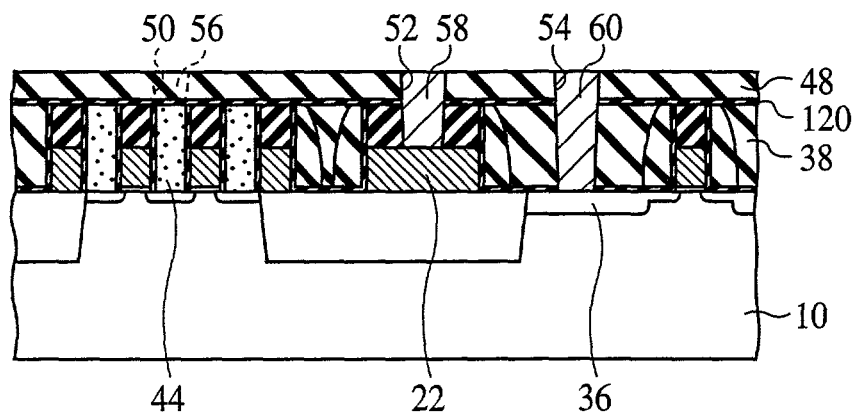
FIGS. 36A–36C, 37A–37B, 38A–38C, and 39A–39B are sectional views of the semiconductor device according to the fourth embodiment of the present invention in the steps of the method for fabricating the same, which show the method.
Figure 38A:
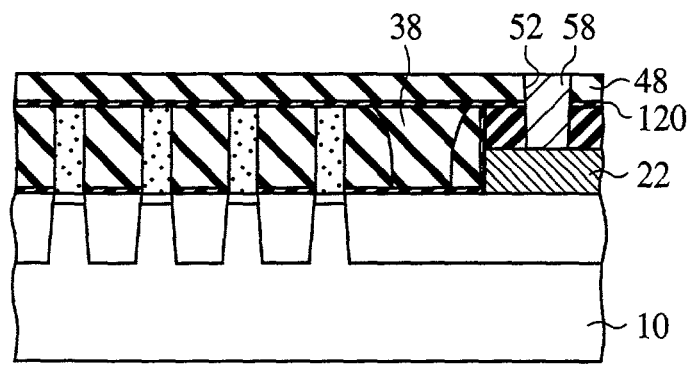

Then, a Ti film, a TiN film and a W film are sequentially deposited on the entire surface by, e.g., CVD method and polished plane until the surface of the inter-layer insulation film 48 is exposed. Thus, plugs 56, 58, 60 of the W film, the TiN film and the Ti film buried in the contact holes 50, 52, 54 are formed (FIG. 36A, FIG. 38A).

Then, a 50 nm-thick W film and a 200 nm-thick silicon nitride film are sequentially deposited on the entire surface by, e.g., CVD method and patterned to form the bit lines 64 having the upper surfaces covered by the silicon nitride film 62 and connected to the source/drain diffusion layers 26 via the plugs 56, 44, an interconnection layer 66 having the upper surface covered by the silicon nitride film 62 and connected to gate electrodes 22 via the plug 58, and an interconnection layer 68 having the upper surface covered by the silicon nitride film 62 and connected to the source/drain diffusion layer 36 via the plug 60.

Figure 36B:
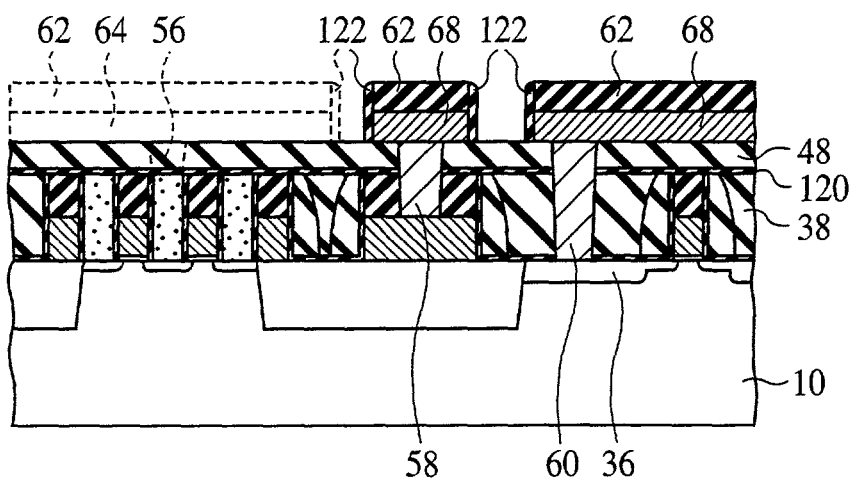
Figure 38B:
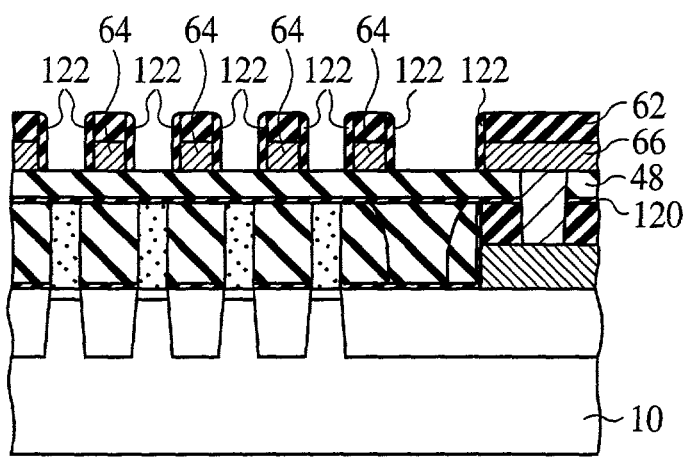

Next, a silicon nitride film of, e.g., a 30 nm-thick is deposited on the entire surface by, e.g., CVD method and etched back to form a sidewall insulation film 122 on the side walls of the bit lines 64, the interconnection layers 66, 68 and the silicon nitride film 62 (FIG. 36B, FIG. 38B). At this time, the silicon nitride film forming the sidewall insulation film 122 is deposited by, e.g., using hexachlorodisilane as a raw material gas at a low temperature of 600–650° C. Silicon nitride film deposited by CVD method at such low temperature has resistance to dry etching of silicon oxide film but no resistance to hydrofluoric acid aqueous solution, and can be easily etched.

Silicon nitride film having resistance also to hydrofluoric acid aqueous solution can be formed by, e.g., using dichlorosilane as a raw material gas at a high temperature of 700–800° C. The silicon nitride film 32, the inter-layer insulation film 78 and the etching stopper film 120 etc. which may be undesirably exposed to hydrofluoric acid aqueous solution but must be left is formed under such conditions.

Then, a silicon oxide film of, e.g., a 500 nm-thick is deposited on the entire surface by, e.g., CVD method, and the surface of the silicon oxide film is polished plane by CMP method until the silicon nitride film 62 is exposed, to form an inter-layer insulation film 72 having the surface planarized and formed of the silicon oxide film.

Next, contact holes 74 are formed in the inter-layer insulation films 72, 48 and the etching stopper film 120 down to the plugs 46 by lithography and etching. The contact holes 74 can be opened by self-alignment with the silicon nitride film 62 formed on the bit lines 64 and the sidewall insulation film 122.

Figure 36C:
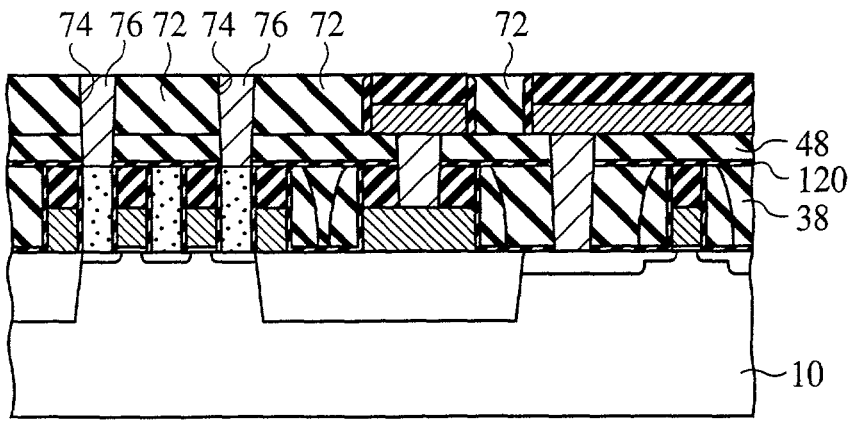
Figure 38C:
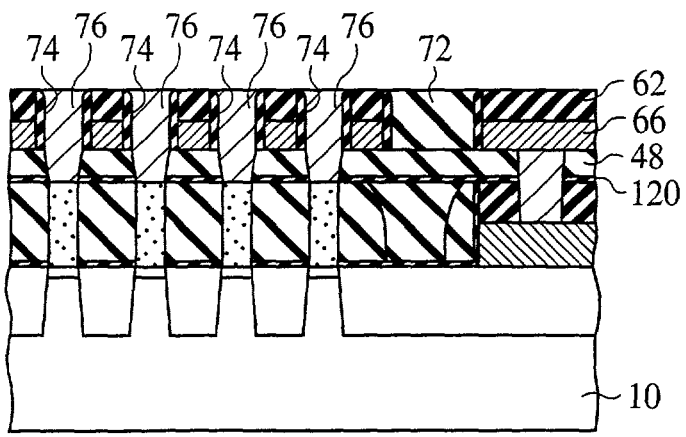

Then, plugs 76 are buried in the contact holes 74 opened in the inter-layer insulation films 72, 48 and the etching stopper film 120 (FIG. 36C, FIG. 38C). The plugs 76 are formed by sequentially depositing, e.g., an Ti film, an TiN film and a W film by, e.g., CVD method and leaving them by etching back in the contact holes 74.

Figure 37A:
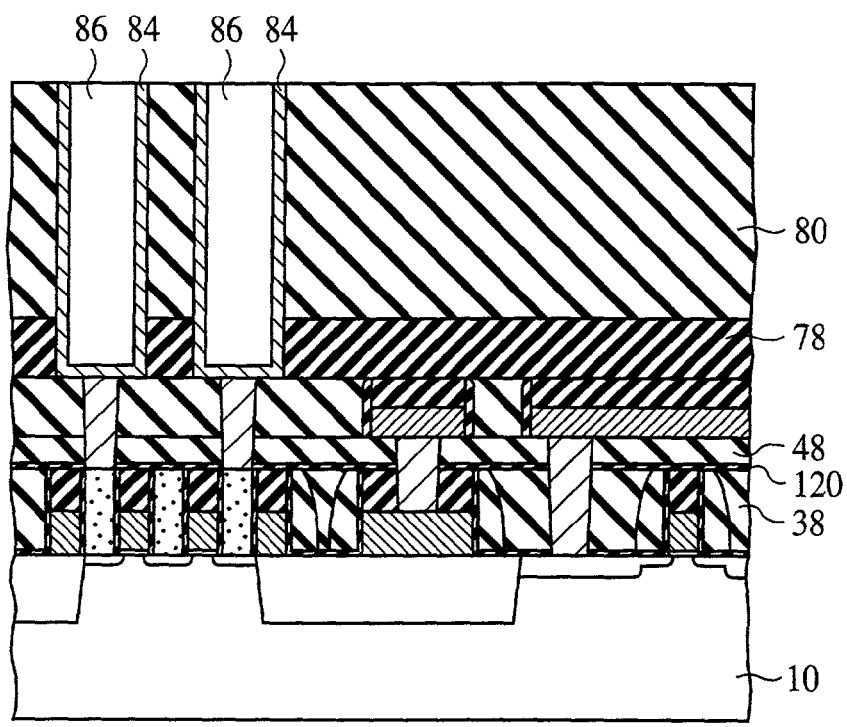
Figure 39A:
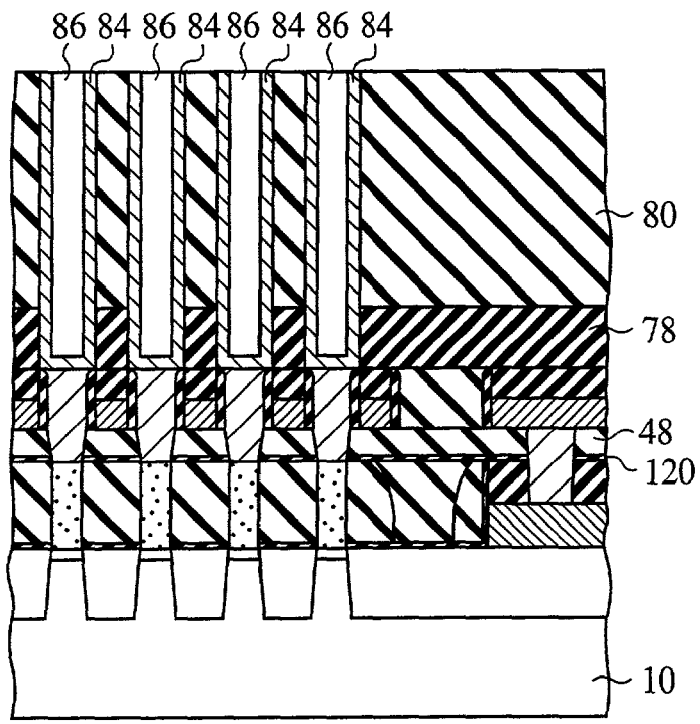

Next, inter-layer insulation films 78, 80, storage electrodes 84 and an inside protection film 86 are formed in the same way as in, e.g., the method for fabricating the semiconductor device according to the first embodiment (FIG. 37A, FIG. 39A).

Figure 37B:
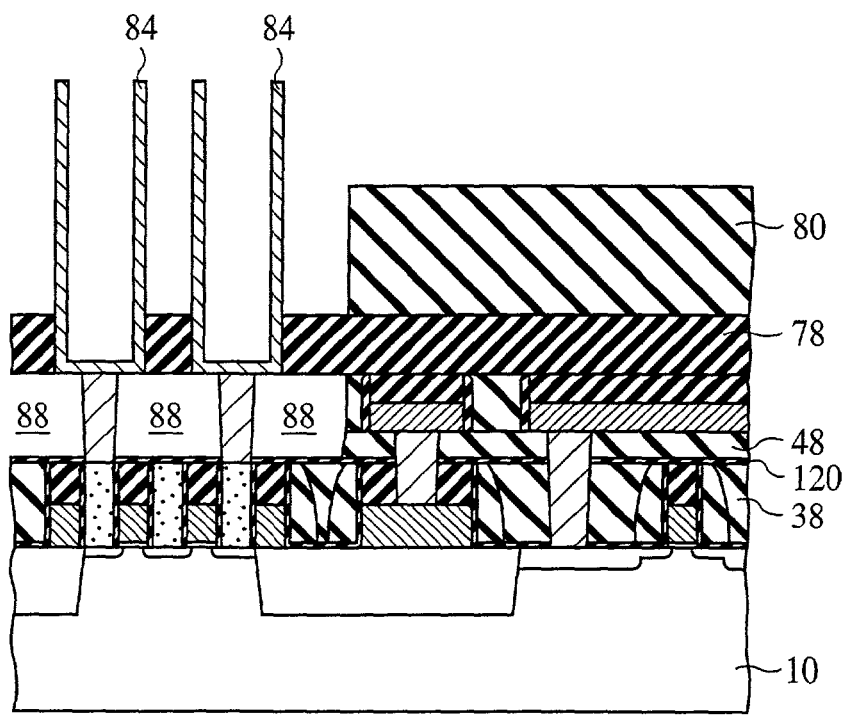
Figure 39B:
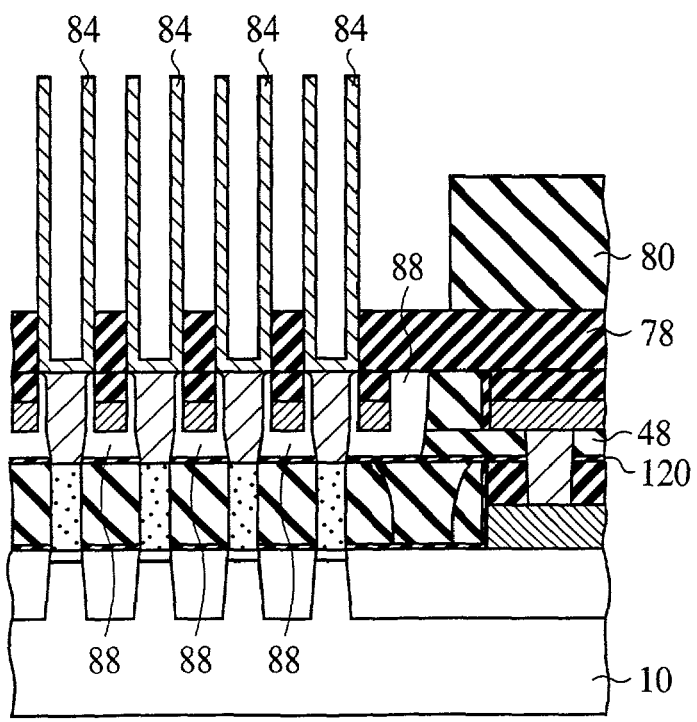

Then, the inter-layer insulation film 80 and the inside protection film 86 are etched by wet etching using, e.g., hydrofluoric acid aqueous solution to expose the outside surfaces of the storage electrodes 84 while etching the inter-layer insulation films 72, 48 below the inter-layer insulation film 78 and the sidewall insulation film 122, to thereby form the cavity 88 (FIG. 37B, FIG. 39B).

The sidewall insulation film 122 of the silicon nitride film, which, as described above, has no resistance to hydrofluoric acid aqueous solution, is etched together with the inter-layer insulation films 72, 48. On the other hand, the etching stopper film 120 of the silicon nitride film, which has resistance to hydrofluoric acid aqueous solution, is formed below the inter-layer insulation film 48, and the plugs 76 of the W film, the TiN film and the Ti film have very good adhesion to the etching stopper film 120 of the silicon nitride film, whereby the hydrofluoric acid aqueous solution does not intrude through the interface between the plug 76 and the etching stopper film 120, and accordingly the inter-layer insulation film 38 and the sidewall insulation film 34 below the etching stopper film 120 are not etched.

Next, in the same way as in, e.g., the method for fabricating the semiconductor device according to the first embodiment, a capacitor dielectric film 90, plate electrode 92, interconnection layers 104, 106, 112, etc. are formed.

Thus, a DRAM comprising memory cells each including one transistor and one capacitor can be fabricated.

Thus, according to the present embodiment, the cavity is formed in the regions between the bit lines, the regions between the word lines and the bit lines, and the regions between the bit lines and the plugs, whereby the parasitic capacitance between the bit liens, the parasitic capacitance between the word lines and the bit lines and the parasitic capacitance between the bit liens and the plugs can be drastically decreased.

Figure 40:
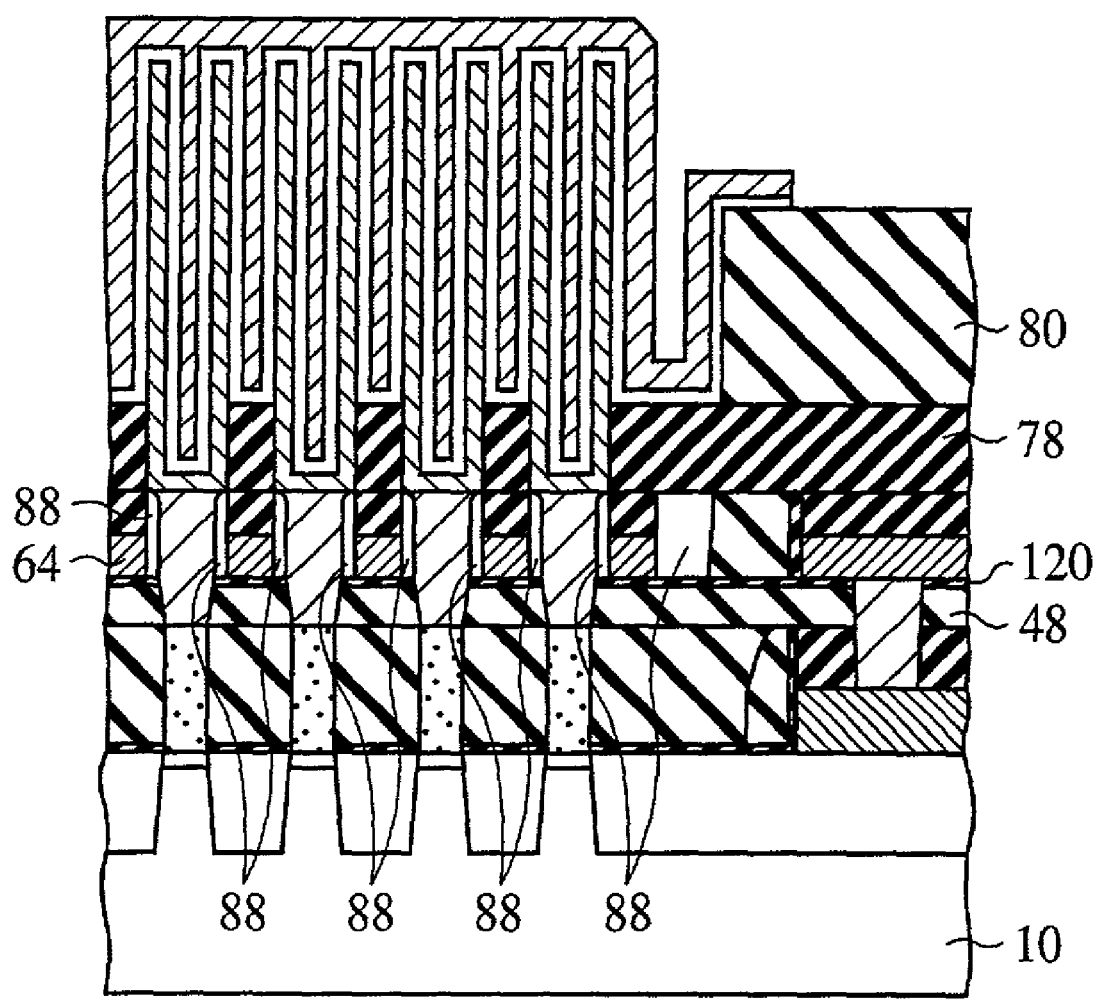
FIG. 40 is a diagrammatic sectional view explaining one modification of the semiconductor device and the method for fabricating the same according to the fourth embodiment of the present invention.

In the present embodiment, the cavity 88 is formed in the inter-layer insulation films 48, 72, but as exemplified in FIG. 40, it is possible that the sidewall insulation film 122 formed on the side walls of the bit lines 64 and the inter-layer insulation film 72 near the bit lines 64 are removed to form the cavity 88 in these regions, whereby the parasitic capacitance between the bit lines and the parasitic capacitance between the bit lines and the plugs can be drastically decreased. In this case, as shown in FIG. 40, the etching stopper film 120 is formed on the inter-layer insulation film 48, and the inter-layer insulation film 80 and the sidewall insulation film 122 are etched with the etching stopper film 120 as a stopper. Only the sidewall insulation film 122 formed on the side walls of the bit lines 64 is removed to form the cavity 88 in these regions.

In the present embodiment, the inter-layer insulation film 80 is left in the peripheral circuit region, but all the inter-layer insulation film 80 on the inter-layer insulation film 78 may be removed as in the method for fabricating the semiconductor device according to the first embodiment.

[A Fifth Embodiment]

The semiconductor device and the method for fabricating the same according to a fifth embodiment of the present invention will be explained with reference to FIGS. 41, 42A–42B, and 43A–43B. The same members of the present embodiment as those of semiconductor device according to the first to the fourth embodiment are represented by the same reference numbers not to repeat or to simplify their explanation.

Figure 41:
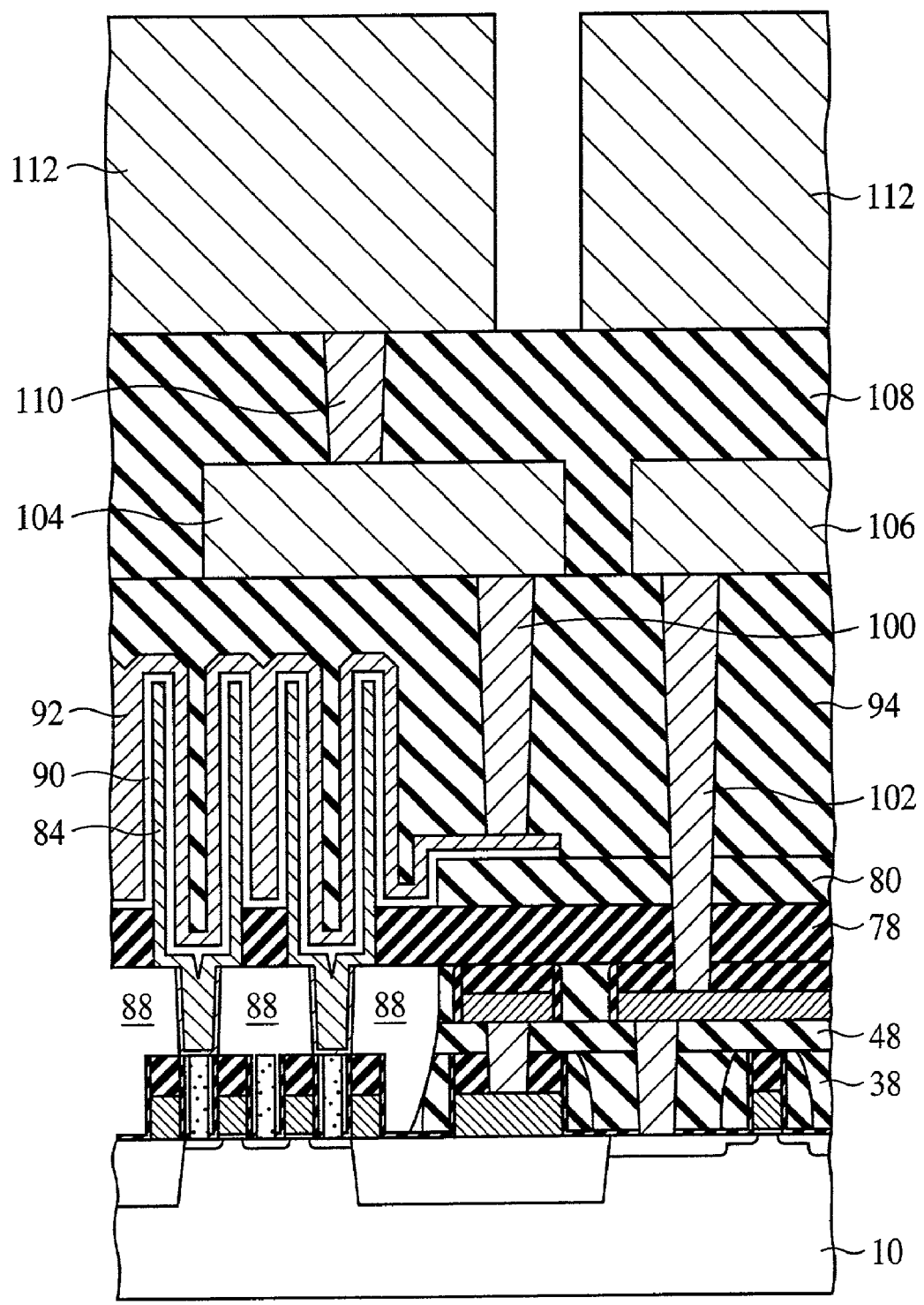
FIG. 41 is a diagrammatic sectional view of the semiconductor device according to a fifth embodiment of the present invention, which shows a structure thereof.

FIG. 41 is a diagrammatic sectional view of the semiconductor device according to the present embodiment, which shows the structure thereof. FIGS. 42A–42B and 43A–43B are sectional views of the semiconductor device in the steps of the method for fabricating the same, which show the method.

First, the structure of the semiconductor device according to the present embodiment will be explained with reference to FIG. 41. FIG. 41 is the diagrammatic sectional view along the line A–A' in FIG. 1.

As shown in FIG. 41, the semiconductor device according to the present embodiment is basically the same as the semiconductor device according to the first embodiment. The semiconductor device according to the present embodiment is characterized mainly in that plugs connected to plugs 44, and storage electrodes are formed integral with each other. The semiconductor device having such structure can have higher mechanical strength around the storage electrodes 84, whereby the risk of the storage electrodes 84 collapsing due to the cavity 88 can be reduced.

Next, the method for fabricating the semiconductor device according to the present embodiment will be explained with reference to FIGS. 42A–42B and 43A–43B. FIGS. 42A–42B and 43A–43B are sectional views of semiconductor device along the line A–A' in FIG. 1.

Figure 42A:
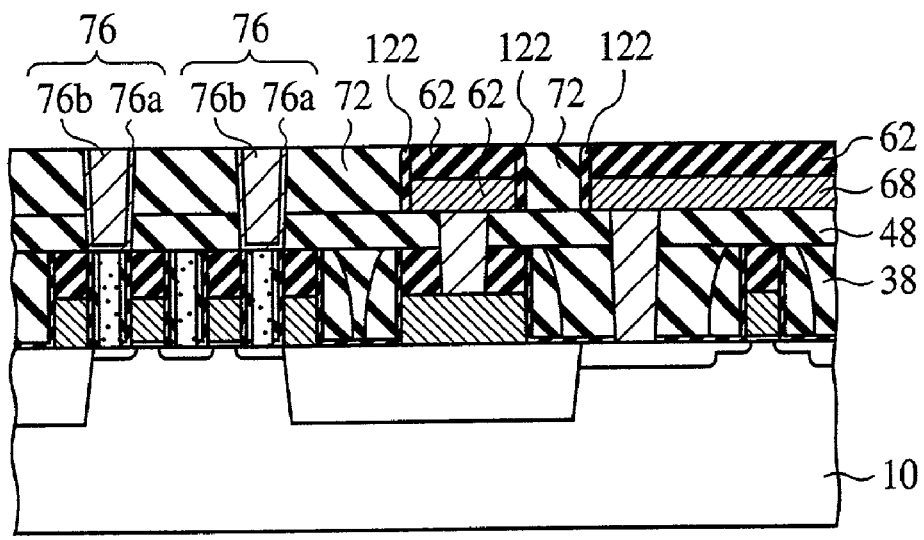
FIGS. 42A–42B and 43A–43B are sectional views of the semiconductor device according to the fifth embodiment of the present invention in the steps of the method for fabricating the same, which show the method.

First, in the same way as in, e.g., the method for fabricating the semiconductor device according to the first to the fourth embodiments, memory cell transistors, peripheral circuit transistors, bit lines 64, interconnection layers 66, 68, plugs 76, etc. are formed (FIG. 42A). In the present embodiment, the structure of the sidewall insulation film formed on the side walls of the word lines 20 is the structure used in the above-described second embodiment, and the structure of the sidewall insulation film formed on the side walls of the bit lines 64 is the structure used in the above-described fourth embodiment.

In the following description, the region of each plug 76, which is formed of a TiN film/a Ti film will be called a barrier metal 76a, and the region of each plug 76, which is formed of a W film will be called a dummy plug 76b.

As a material of the dummy plugs 76b, a material which can ensure etching selectivity to a material of the barrier metals 76a and the inter-layer insulation films 78, 80 is used. In addition to W, conducting materials, such as Al (aluminum), Ti (titanium), Cu (copper), C (carbon), etc., insulating materials, such as SOG film, BPSG film, BSG film, etc., whose etching rates are higher than etching rates of the inter-layer insulation films 78, 80 can be used, and when processing temperatures can be generally lower, organic films, etc. can be also used.

As a material of the barrier metals 76a, a material which is difficult to react with materials of the dummy plugs 76b, the lower electrodes (pugs 46), etc. and has good adhesion to the storage electrodes 84 to be formed later is used. In addition to TiN film, WN (tungsten nitride) film, NbN (niobium nitride) film, TiSi (titanium silicide) film, Wsi (tungsten silicide) film, CoSi (cobalt silicide) film, etc. can be used.

As in the semiconductor device according to the present embodiment, in order to decrease the contact resistance with respect to the lower electrodes, a multi-layer structure having a contact metal sandwiched between a barrier metal material and lower electrodes (e.g., TiN+Ti, WN+Ti) can be used. In the present embodiment, the contact metal and the barrier metals are represented as a whole by the barrier metals 76a.

As in the semiconductor device according to the present embodiment, it is possible that materials forming the usual electrode plugs are selected as materials of the barrier metals 76a and the dummy plugs 76b, and concurrently with forming the barrier metals 76a and the dummy plugs 76b, the usual electrode plugs may be formed in the peripheral circuit region.

Next, a silicon nitride film of, e.g., a 40–80 nm-thick and a silicon oxide film of, e.g., a 900 nm-thick are deposited on the entire surface by, e.g., CVD method to form the inter-layer insulation film 78 of the silicon nitride film and the inter-layer insulation film 80 of the silicon oxide film.

Then, the inter-layer insulation films 80, 78 are patterned by lithography and etching to form openings 82 down to the plug 76.

Figure 42B:
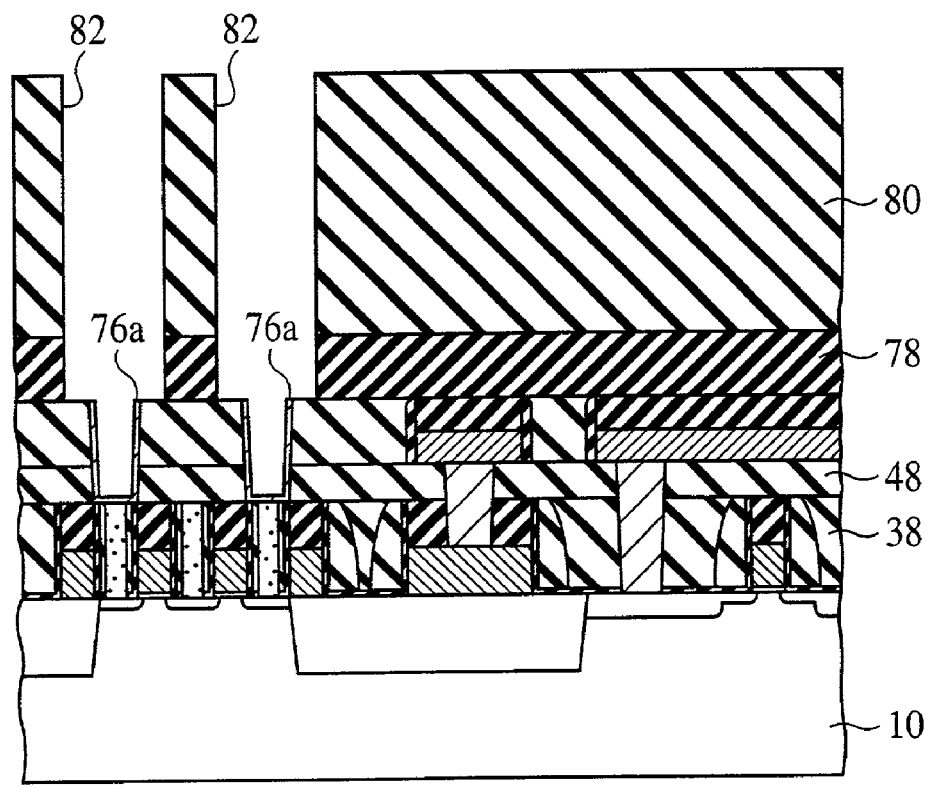

Next, the dummy plugs 76b are removed selectively with respect to the inter-layer insulation films 78, 80 and the barrier metals 76a (FIG. 42B). When the dummy plugs 76b are formed of W film, the dummy plugs can be removed selectively with respect to the inter-layer insulation films 78, 80 and the barrier metals 76a by isotropical dry etching using, e.g., $CF_4+O_2+Cl_2$ gas or isotropical wet etching using persulfuric acid.

Then, an Ru film of, e.g., a 30 nm-thick is deposited on the entire surface by, e.g., CVD method.

Next, an SOG film, for example, is deposited on the entire surface by, e.g., spin coating method.

Figure 43A:
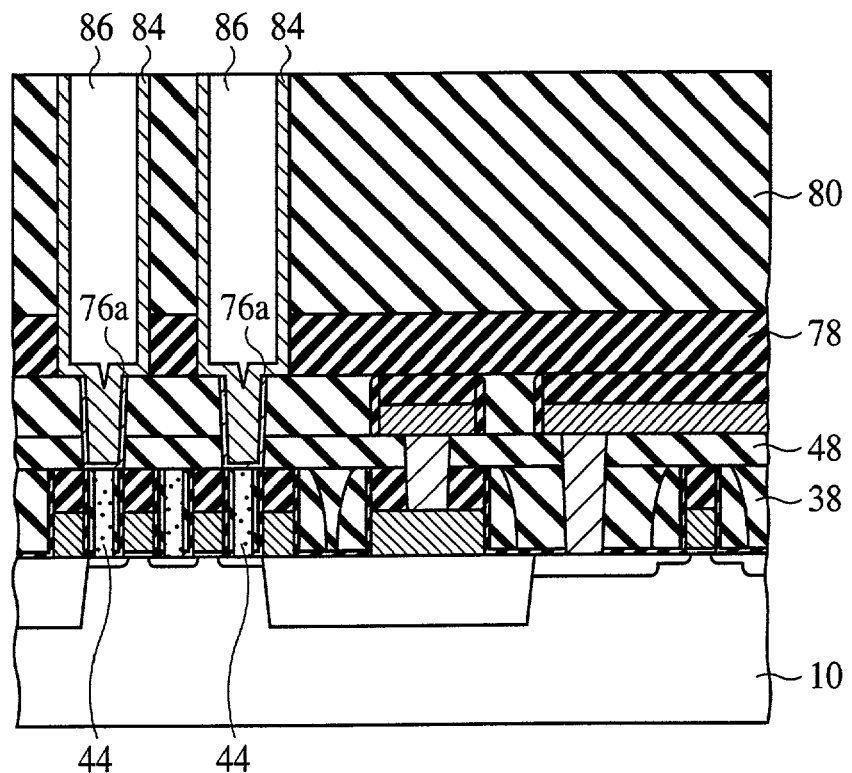

Then, the SOG film and the Ru film are removed plane by, e.g., CMP method until the surface of the inter-layer insulation film 80 is exposed to form the storage electrodes 84 of the Ru film in the openings 82, an inside protection film 86 of the SOG film buried in the openings with the storage electrodes 84 (FIG. 43A). Thus, the storage electrodes 84 are connected to the plugs 46 via the barrier metals 76a, and the plugs connected to the plugs 44, and the storage electrodes 84 can be formed integral with each other.

Figure 43B:
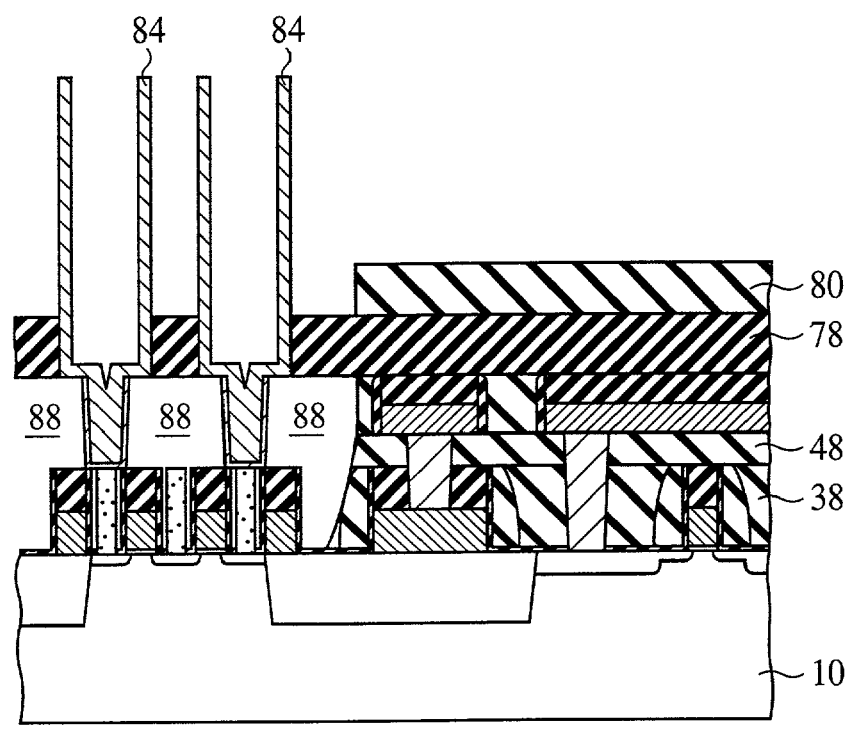

Next, the inter-layer insulation film 80 and the inside protection film 86 are etched by wet etching using, e.g., hydrofluoric acid aqueous solution to expose the outside surfaces of the storage electrodes 84 while etching the inter-layer insulation films 72, 48, 38 and the sidewall insulation films 34, 114, 122 below the inter-layer insulation film 78 to form the cavity 88 in the regions between the word lines (gate electrodes 20), the regions between the bit lines 64, the regions between the word lines and the bit lines 64, the regions between the word lines 20 and the plugs 44, 46 and the regions between the bit liens 64 and the storage electrode 84 (FIG. 43B).

Next, in the same way as in, e.g., the method for fabrication the semiconductor device according to the first embodiment, a capacitor dielectric film 90, plate electrode 92, interconnection layers 104, 106, 112, etc. are formed.

Thus a DRAM comprising memory cells each including one transistor and one capacitor can be fabricated.

As described above, according to the present embodiment, the plugs connected to the plugs 44, and the storage electrodes are formed integral with each other, whereby the mechanical strength around the storage electrodes can be higher, with a result that the risk of the storage electrodes 84 collapsing due to the cavity can be reduced.

In the present embodiment, the inter-layer insulation film 80 remains in the peripheral circuit region, but as in the method for fabricating the semiconductor device according to the first embodiment, all the inter-layer insulation film 80 on the inter-layer insulation film 78 may be removed.

In the present embodiment, the cavity is formed between the word lines 20 and the plugs 44 and also between the bit liens 64 and the plugs 74, but the cavity 88 may not be formed in these regions, as in the first embodiment.

[A Sixth Embodiment]

The semiconductor device and the method for fabricating the same according to a sixth embodiment of the present invention will be explained with reference to FIGS. 44, 45A–45B, and 46A–46B. The same members of the present embodiment as those of the semiconductor device according to the first to the fifth embodiments are represented by the same reference numbers not to repeat or to simplify their explanation.

Figure 44:
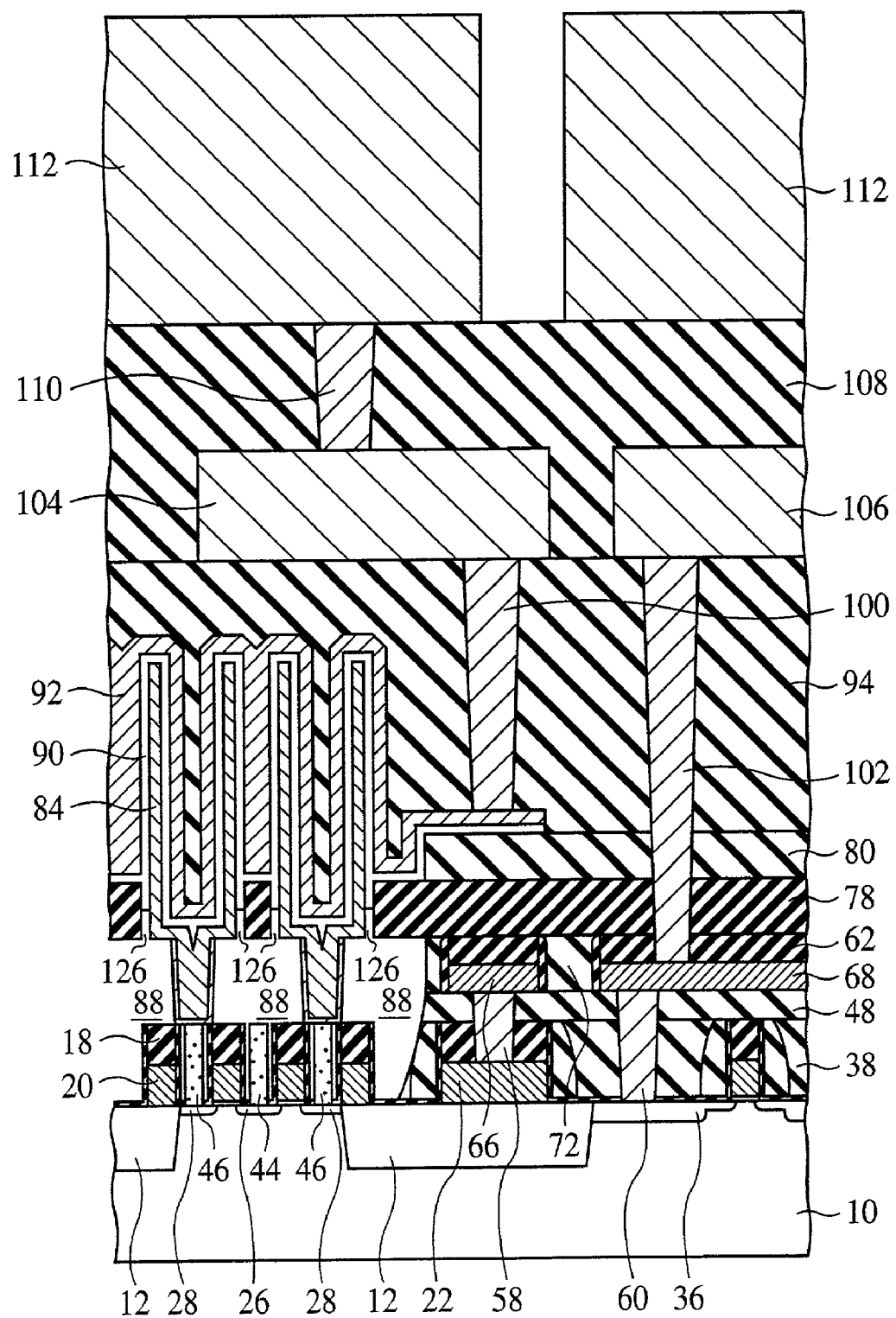
FIG. 44 is a diagrammatic sectional view of the semiconductor device according to a sixth embodiment of the present invention, which shows a structure thereof.

FIG. 44 is a diagrammatic sectional view of the semiconductor device according to the present embodiment, which shows the structure thereof. FIGS. 45A–45B and 46A–46B are sectional views of the semiconductor device according to the present embodiment in the steps of the method for fabricating the same, which show the method.

First, the structure of the semiconductor device according to the present embodiment will be explained with reference to FIG. 44. FIG. 44 is the diagrammatic sectional view along the line A–A' in FIG. 1.

The semiconductor device according to the present embodiment is basically the same as the semiconductor device according to the fifth embodiment shown in FIG. 41. The semiconductor device according to the present embodiment is characterized mainly in that gaps 126 are formed between the inter-layer insulation film 78 and storage electrodes 84, and the gaps 126 are closed by a capacitor dielectric film 90.

Next, the method for fabricating the semiconductor device according to the present embodiment will be explained with reference to FIGS. 45A–45B and 46A–46B. FIGS. 45A–45B and 46A–46B are sectional views of the semiconductor device along the line A–A' in FIG. 1.

First, in the same way as in, e.g., the method for fabricating the semiconductor device according to the fifth embodiment, inter-layer insulation films 78, 80 are formed, and openings 82 are formed in the inter-layer insulation films 78, 80.

Figure 45A:
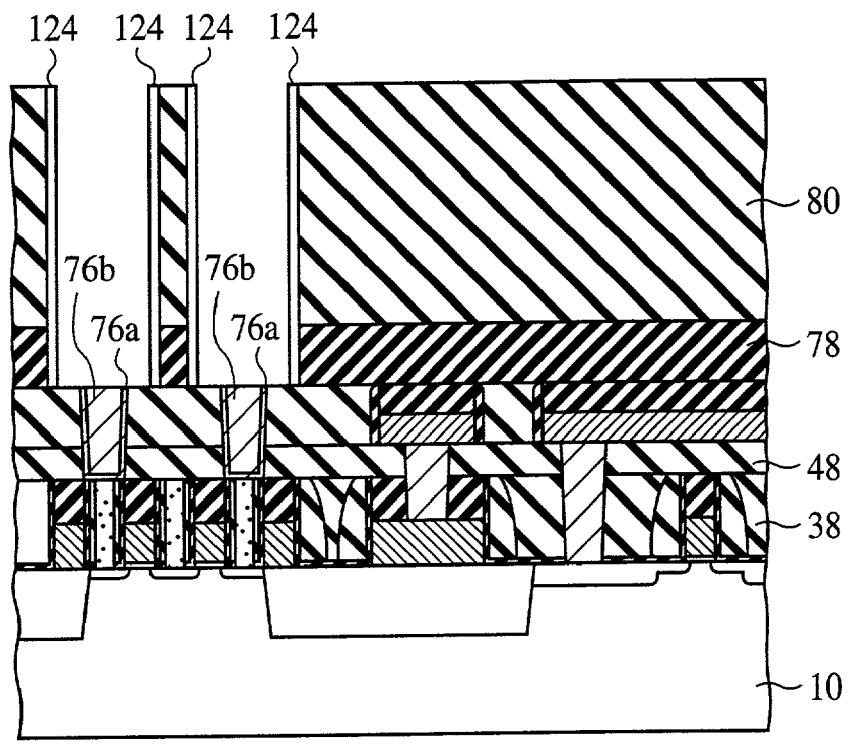
FIGS. 45A–45B and 46A–46B are sectional views of the semiconductor device according to the sixth embodiment of the present invention in the steps of the method for fabricating the same, which show the method.

Then, an amorphous silicon film of, e.g., a 5 nm-thick is deposited on the entire surface by, e.g., CVD method and etched back to form a selectively removable film 124 of the amorphous silicon film on the side walls of the openings 82 (FIG. 45A). The selectively removable film 124 is formed of a material which can be removed selectively with respect to the inter-layer insulation films 72, 78, 80 and the plugs 76.

Next, the dummy plugs 76b are removed selectively with respect to the selectively removable film 124, the inter-layer insulation films 72, 78, 80 and the barrier metals 76a.

Figure 45B:
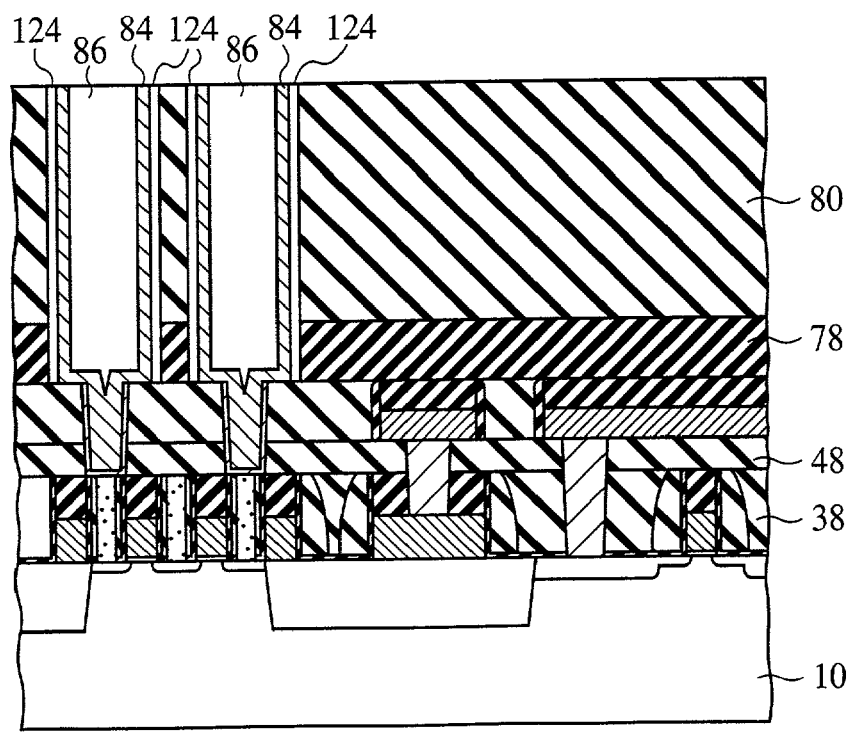

Then, in the same way as in, e.g., the method for fabricating the semiconductor device according to the first embodiment, storage electrodes 84, and an inside protection film 86 are formed (FIG. 45B).

Figure 46A:
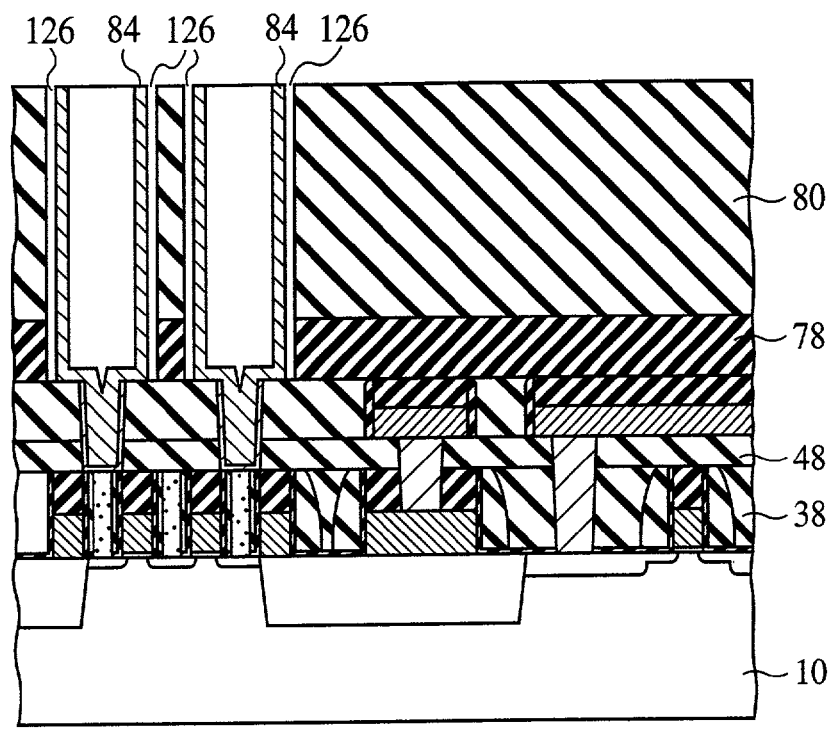

Next, the selectively removable film 124 is removed selectively with respect to the inter-layer insulation films 72, 78, 80, the storage electrodes 84, the inside protection film 84 to form the gaps 126 between the inter-layer insulation films 78, 80 and the storage electrodes 84 (FIG. 46A). The selectively removable film 124 of amorphous silicon film can be selectively removed by wet etching using, e.g., an aqueous solution of hydrofluoric acid and nitric acid.

Figure 46B:
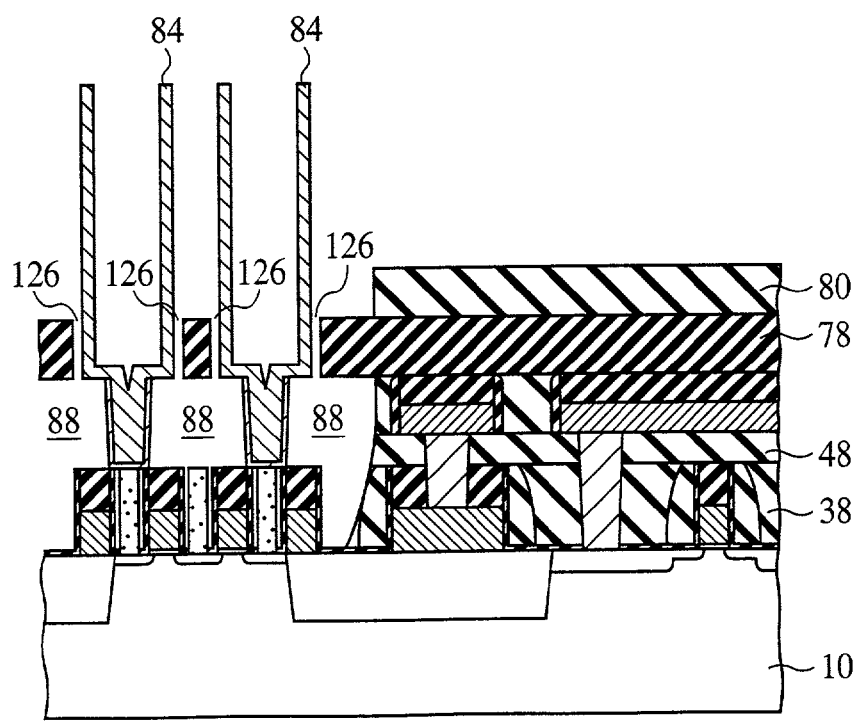

Then, the inter-layer insulation film 80 and the inside protection film 86 are etched by wet etching using, e.g., hydrofluoric acid based-aqueous solution to expose the outside surfaces of the storage electrodes 84. At this time, the etchant intrudes through the gaps 126, which are formed between the storage electrodes 84 and the inter-layer insulation films 78, 80 to etch the inter-layer insulation films 72, 48, 38 and the sidewall insulation films 34, 114, 122 below the inter-layer insulation film 78. Thus, the cavity 88 is formed in the region between the word lines (gate electrodes 20), the regions between the bit lines 64, the regions between the word lines and the bit lines 64, the regions between the word lines 20 and the plugs 44, 46, and the regions between the bit lines 64 and the storage electrode 84 (FIG. 46B).

In the method for fabricating the semiconductor device according to the present embodiment, the insulation films below the inter-layer insulation film 78 are etched by utilizing the gaps 126, whereby even in a case that the storage electrodes 84 are formed of a material (e.g., TiN, W, WN, STO, etc.) of good adhesion to the inter-layer insulation films 78, 80, the cavity 88 can be formed by utilizing the intrusion of the etchant through the interface between the inter-layer insulation films 78, 80 and the storage electrodes 84.

Then, a dielectric film of, e.g., a 10–30 nm-thick $Ta_2O_5$ film, BST film, TiO film ON film, $Al_2O_3$ film, SBT film, STO film or others is deposited on the entire surface by, e.g., CVD method to form the capacitor dielectric film 90 of the dielectric film. Thus, the gaps 126 between the inter-layer insulation film 78 and the storage electrodes 84 are closed by the capacitor dielectric film 90.

In the same way as in, e.g., the method for fabricating the semiconductor device according to the first embodiment, plate electrode 92, interconnection layers 104, 106, 112, etc. are formed.

Thus, a DRAM comprising memory cells each including one transistor and one capacitor can be fabricated.

As described above, according to the present embodiment, the selectively removable film is formed between the inter-layer insulation films and the storage electrodes and removed to form the gaps, and the cavity is formed by utilizing the gaps, whereby even in a case that the storage electrodes are formed of a material having good adhesion to the inter-layer insulation films, the cavity can be formed by utilizing the intrusion of the etchant through the interface between the storage electrodes and the inter-layer insulation films.

In the present embodiment, the semiconductor device and the method for fabricating the same according to the fifth embodiment uses the selectively removable film 124, but the use of the selectively removable film is applicable in the same way to the semiconductor device and the method for fabricating the same according to the first to the fourth embodiments.

[A Seventh Embodiment]

The semiconductor device and the method for fabricating the same according to a seventh embodiment of the present invention will be explained with reference to FIGS. 47, 48A–48B, 49A–49B, and 50A–50B. The same members of the present embodiment as those of the semiconductor device according to the first to the sixth embodiments are represented by the same reference numbers not to repeat or to simplify their explanation.

Figure 47:
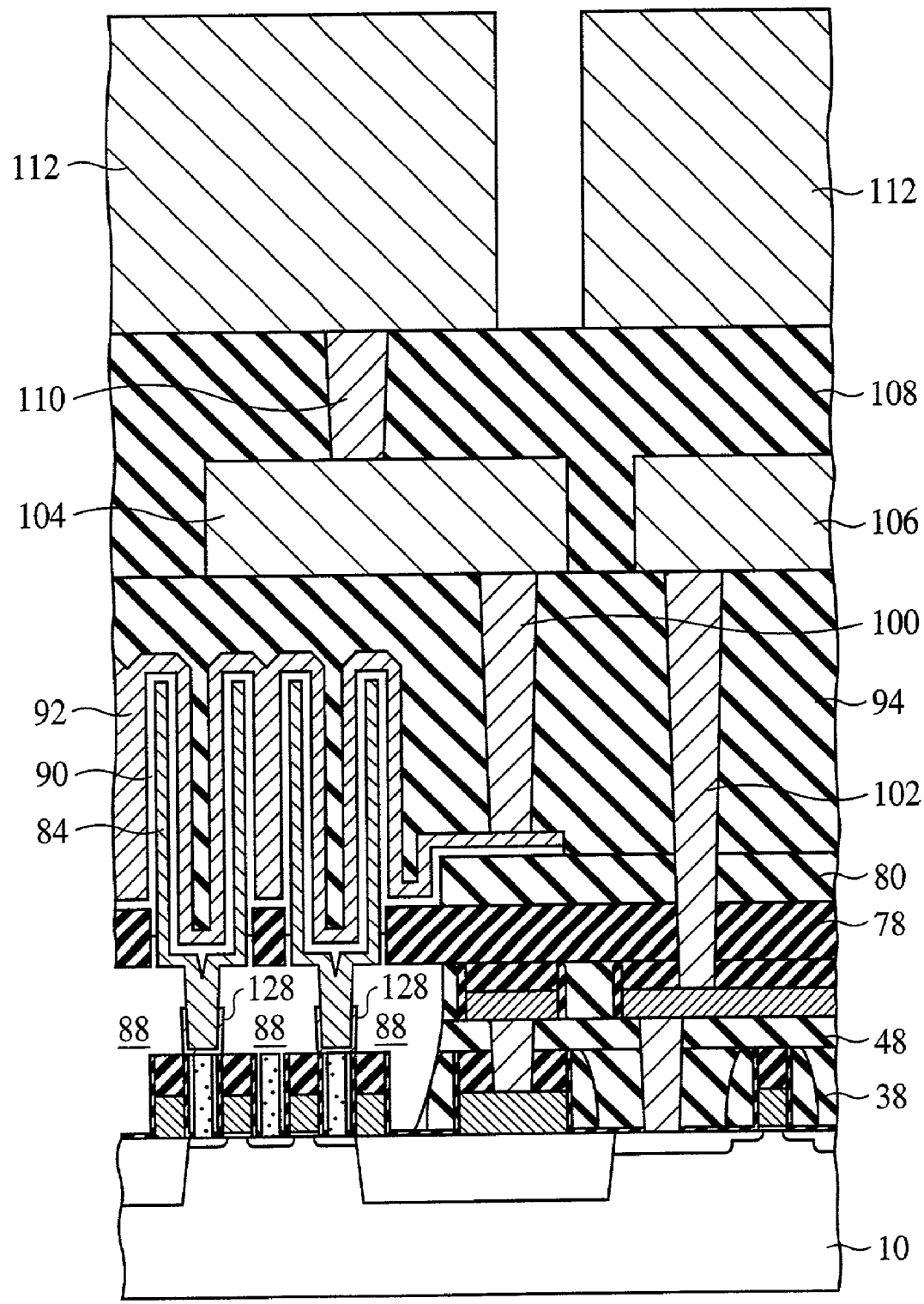
FIG. 47 is a diagrammatic sectional view of the semiconductor device according to a seventh embodiment of the present invention, which shows a structure thereof.

FIG. 47 is a diagrammatic sectional view of the semiconductor device according to the present embodiment, which shows a structure thereof. FIGS. 48A–48B, 49A–49B, and 50A–50B are sectional views of the semiconductor device according to the present embodiment in the steps of the method for fabricating the semiconductor device, which show the method.

First, the structure of the semiconductor device according to the present embodiment will be explained with reference to FIG. 47. FIG. 47 is the diagrammatic sectional view along the line A–A' in FIG. 1.

As shown in FIG. 47, the semiconductor device according to the present embodiment is basically the same as the semiconductor device according to the sixth embodiment shown in FIG. 44. The semiconductor device according to the present embodiment is characterized mainly in that an adhesion layer 128 between plugs 46 and storage electrodes 84 is removed lower of an inter-layer insulation film 78. This structural characteristic is based on the use of the adhesion layer 128 in the method for fabricating the semiconductor device according to the present embodiment in place of the selectively removable layer 124 of the sixth embodiment.

Next, the method for fabricating the semiconductor device according to the present embodiment will be explained with reference to FIGS. 48A–48B, 49A–49B, and

50A–50B. FIGS. 48A–48B, 49A–49B, and 50A–50B are the sectional views along the line A–A' in FIG. 1.

Figure 48A:
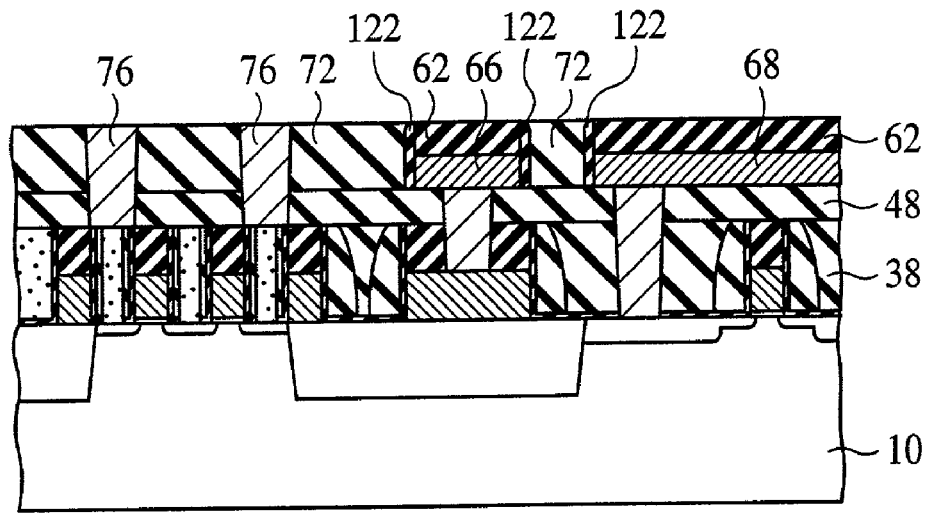
FIGS. 48A–48B, 49A–49B and 50A–50B are sectional views of the semiconductor device according to the seventh embodiment of the present invention in the steps of the method for fabricating the same, which show the method.

First, in the same way as in the method for fabricating the semiconductor device according to the fifth embodiment, a memory cell transistors, peripheral circuit transistors, bit lines 64, interconnection layers 66, 68, plugs 76, etc. are formed (FIG. 48A).

Next, in the same way as in, e.g., the method for fabricating the semiconductor device according to the fifth embodiment, the inter-layer insulation films 78, 80 are formed, and openings 82 are formed therein.

Figure 48B:
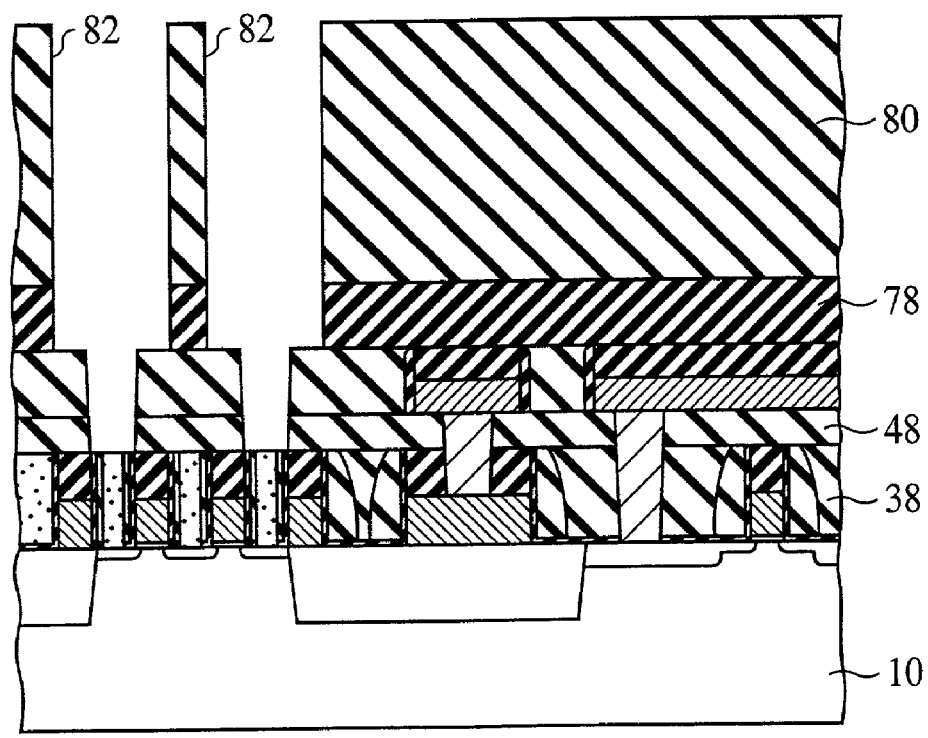

Next, the plugs 76 are removed selectively with respect to the inter-layer insulation films 72, 78, 80 (FIG. 48B). It is possible that barrier metals 76a may be left in contact holes 74 in the same way as in method for fabricating the semiconductor device according to the fifth embodiment.

Then, a 5–10 nm-thick TiN film and an Ru film of, e.g., a 30 nm-thick are deposited on the entire surface by, e.g., CVD method. The TiN film is to be an adhesion layer 128, and the Ru film is to be storage electrodes.

Then, an SOG film, for example, is deposited on the entire surface by, e.g., spin coating method.

Figure 49A:
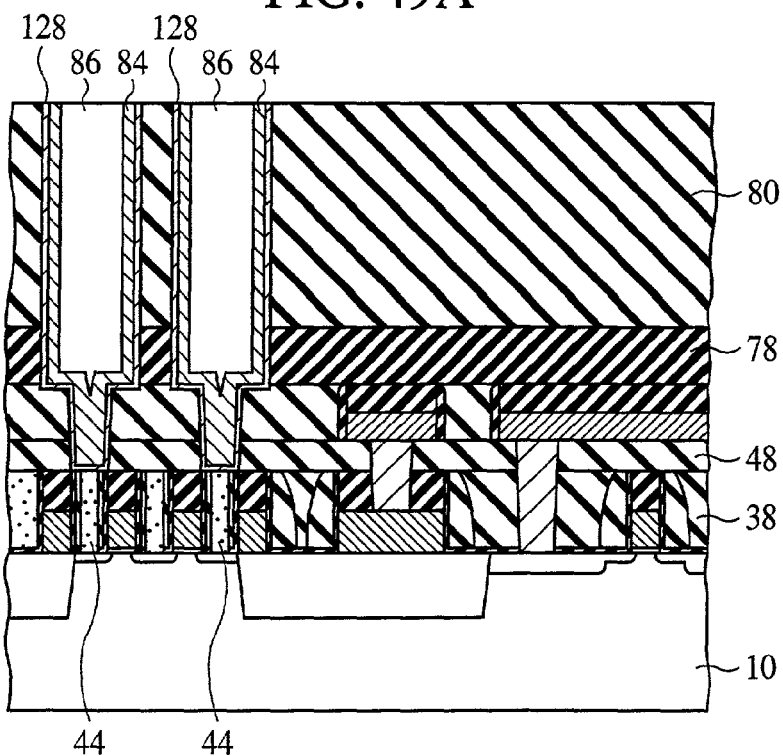

Next, the SOG film the Ru film and the TiN film are removed plane by, e.g., CMP method until the surface of the inter-layer insulation film 80 is exposed to form in the openings 82 the adhesion layer 128 of the TiN film, the storage electrodes 84 of the Ru film and an inside protection film 86 of the SOG film (FIG. 49A).

Figure 49B:
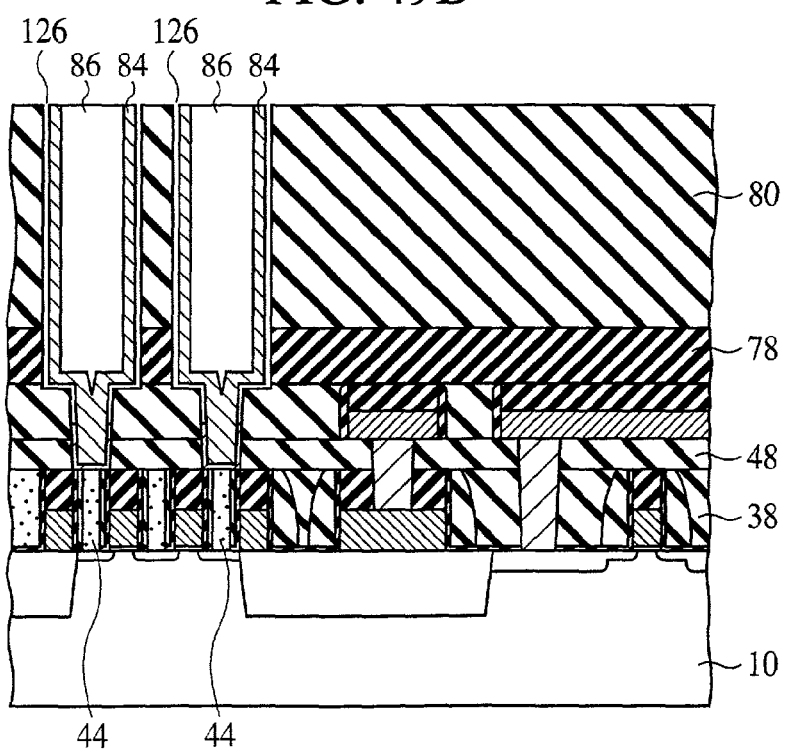

Then, the adhesion layer 128 is etched selectively with respect to the inter-layer insulation films 72, 78, 80, the storage electrode 84, the inside protection film 84 to form gaps 126 between the inter-layer insulation films 72, 78, 80, and the storage electrodes 84 (FIG. 49B). The adhesion layer 128 of the TiN film can be selectively removed by, e.g., wet etching using persulfuric acid.

When an etching amount of the adhesion layer 128 is insufficient, it makes it difficult to remove the lower insulation films by utilizing the intrusion of the etchant in later steps. When a etching amount of the adhesion layer 128 is excessive, contacts between the plugs 46 and the storage electrodes 84 cannot be made. Accordingly, it is necessary to control an etching amount of the adhesion layer 128 so that the etching advances lower of the inter-layer insulation film 78, and the adhesion layer 128 between the plugs 46 and the storage electrodes 84 is not removed.

Figure 50A:
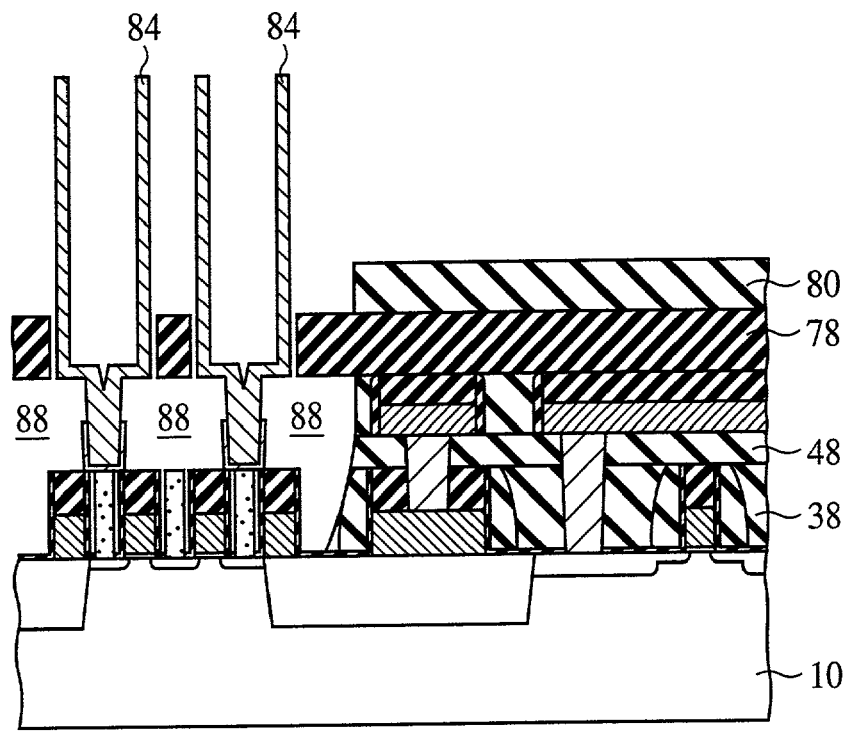

Next, the inter-layer insulation film 80 and the inside protection film 86 are etched by wet etching using, e.g., hydrofluoric acid-based aqueous solution to expose the outside surfaces of the storage electrodes 84. At this time, the etchant intrudes through the gaps 126, which are formed between the storage electrodes 84 and the inter-layer insulation films 78, 80 to etch also the inter-layer insulation films 72, 48, 38 and the sidewall insulation films 34, 114, 122 below the inter-layer insulation film 78. Thus, cavity 88 is formed in the regions between the word lines (gate electrodes 20), the regions between the word lines and the bit lines 64, the regions between the word lines 20 and the plugs 44, 46, and the region between the bit lines 64 and the storage electrode 84 (FIG. 50A).

Then, a dielectric film of, e.g., a 10–30 nm-thick $Ta_2O_5$ film, BST film, TiO film, ON film, $Al_2O_3$ film, SBT film, STO film or others is deposited on the entire surface by, e.g., CVD method to form the capacitor dielectric film 90 of the dielectric film. Thus, the gaps 126 between the inter-layer insulation film 78 and the storage electrodes 84 are closed by the capacitor dielectric film 90.

Figure 50B:
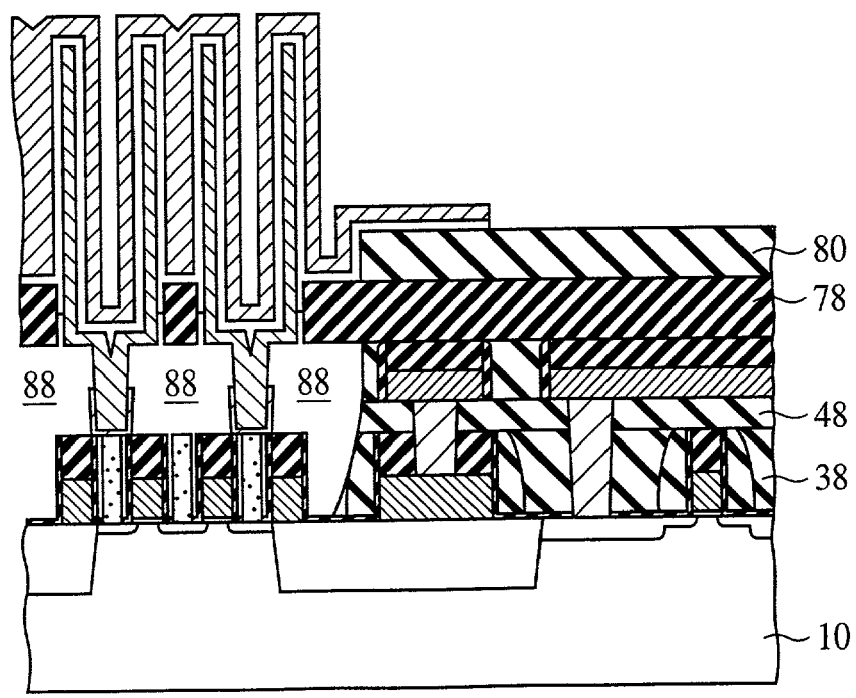

Next, an Ru film of, e.g., a 50–300 nm-thick is deposited on the entire surface by, e.g., CVD method and patterned by lithograph and etching to form plate electrode 92 of the Ru film (FIG. 50B).

Then, in the same way as in, e.g., the method for fabricating the semiconductor device according to the first embodiment, interconnection layers 104, 106, 112, etc. are formed.

Thus, a DRAM comprising memory cells each including one transistor and one capacitor can be fabricated.

As described above, according to the present embodiment, the adhesion layer is formed between the inter-layer insulation films and the storage electrode and is removed to form the gaps, and the cavity is formed by utilizing the gaps, whereby even in a case that the storage electrodes are formed of a material of good adhesion to the inter-layer insulation films, the cavity can be formed by utilizing the intrusion through the interface between the storage electrodes and the inter-layer insulation films.

In the present embodiment, the semiconductor device and the method for fabricating the same according to the fifth embodiment uses the adhesion layer 128 as a selectively removing film, but the use of the adhesion layer is applicable in the same way to the semiconductor device and the method for fabricating the same according to the first to the fourth embodiments.

In the present embodiment, the inter-layer insulation film 80 and the inter-layer insulation films 72, 48, 38, and the sidewall insulation films 34, 114, 122 are etched after the adhesion layer 128 has been etched. However, it is possible that the adhesion layer 128 is etched after the inter-layer insulation film 80 has been removed, and then the inter-layer insulation films 72, 48, 38 and the sidewall insulation films 34, 114, 122 are etched.

[An Eighth Embodiment]

The semiconductor device and the method for fabricating the same according to an eighth embodiment of the present invention will be explained with reference to FIGS. 51, 52A–52B, 53A–53C, 54A–54B, 55A–55B, 56A–56B, and 57A–57B. The same members of the present embodiment as those of the semiconductor device according to the first to the sixth embodiments are represented by the same reference numbers not to repeat or to simplify their explanation.

Figure 51:
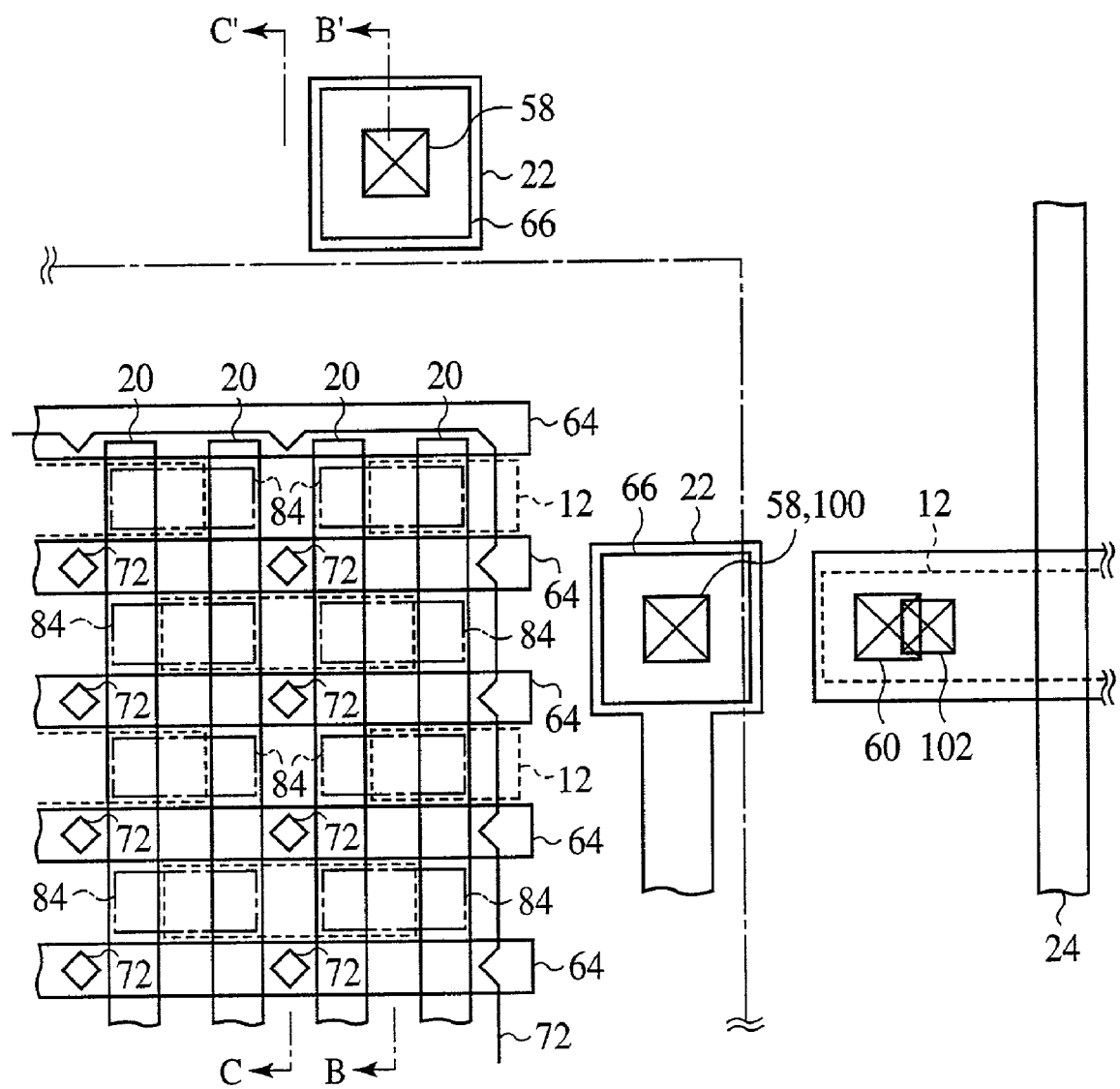
FIG. 51 is a plan view of the semiconductor device according to an eighth embodiment of the present invention, which shows a structure thereof.
Figure 52A:
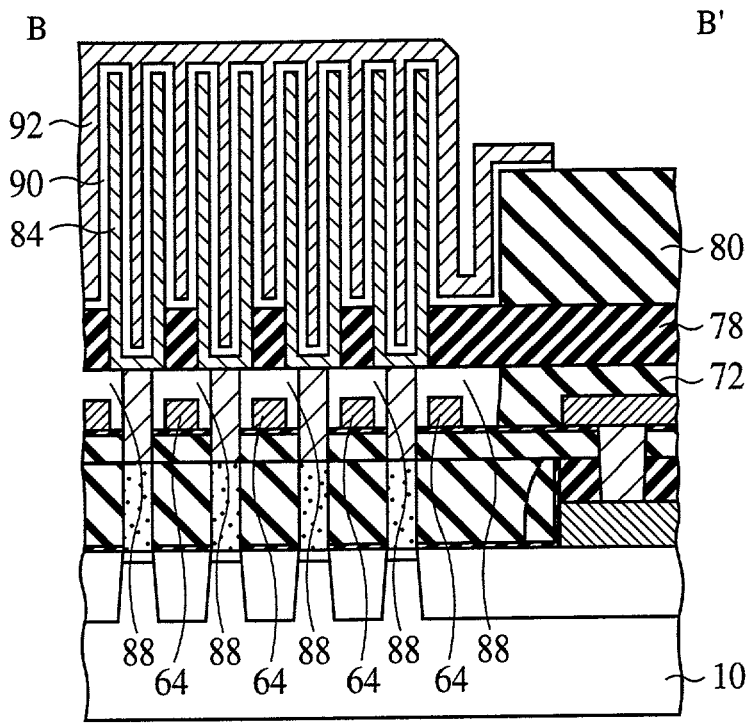
FIGS. 52A and 52B are diagrammatic sectional views of the semiconductor device according to the eighth embodiment of the present invention, which show the structure thereof.
Figure 52B:
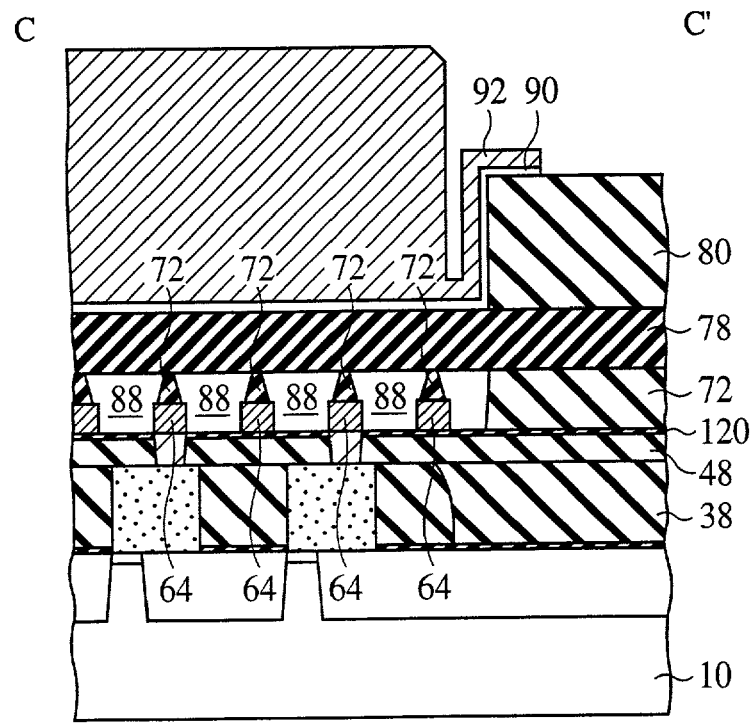

FIG. 51 is a plan view of the semiconductor device according to the present embodiment, which shows a structure thereof. FIGS. 52A and 52B are diagrammatic sectional views of the semiconductor device according to the present embodiment, which shows a structure thereof. FIGS. 53A–53C, 54A–54B, 55A–55B, and 56A–56B are sectional views of the semiconductor device according to the present embodiment in the steps of the method for fabricating the same, which show the method. FIGS. 57A and 57B are views explaining an etching process of inter-layer insulation films.

First, the structure of the semiconductor device according to the present embodiment will be explained with reference to FIGS. 51 and 52A–52B. FIG. 52A is the diagrammatic sectional view along the line B–B' in FIG. 51. FIG. 52B is a diagrammatic sectional view along the line C–C' in FIG. 51.

In the first to the sixth embodiments, the inter-layer insulation film 78 covering the upper surface of the cavity 88 is supported by the silicon nitride film 62 formed on the bit lines 64. However, the inter-layer insulation film 78 can be supported also by other members. In the semiconductor device and the method for fabricating the same according to the present embodiment, as one example, the inter-layer insulation film 78 is supported by the inter-layer insulation film 72 covering the bit lines 64.

As shown in FIGS. 51, 52A and 52B, the semiconductor device according to the present embodiment is characterized mainly in that the inter-layer insulation film 72 remains in a substantially quadrangular cone at the centers of regions enclosed by 4 storage electrodes 84 and forms a structure for supporting the inter-layer insulation film 78. The semiconductor device having such structure can prevent the collapse of the inter-layer insulation film 78 due to cavity 88.

Then, the method for fabricating the semiconductor device according to the present embodiment will be explained with reference to 53A–53C, 54A–54B, 55A–55B, and 56A–56B. FIGS. 53A–53C and 54A–54B are sectional views of the semiconductor device according to the present embodiment in the steps of the method for fabricating the same, which are along the line B–B' in FIG. 51. FIGS. 55A–55B and 56A–56B are sectional views of the semiconductor device according to the present embodiment in the steps of the method for fabricating the same, which are along the line C–C' in FIG. 51.

First, in the same way as in, e.g., the method for fabricating the semiconductor device according to the first embodiment, an inter-layer insulation film 48 is formed, covering memory cell transistors and peripheral circuit transistors.

Next, a 20 nm-thick silicon nitride film is deposited on the inter-layer insulation film 48 by, e.g., CVD method to form an etching stopper film 120 of the silicon nitride film.

Next, plugs 56 connected to plugs 44, and a plug 58 connected to the gate electrode 22 are formed in the etching stopper film 120, the inter-layer insulation film 48 and the silicon nitride film 18.

Figure 53A:
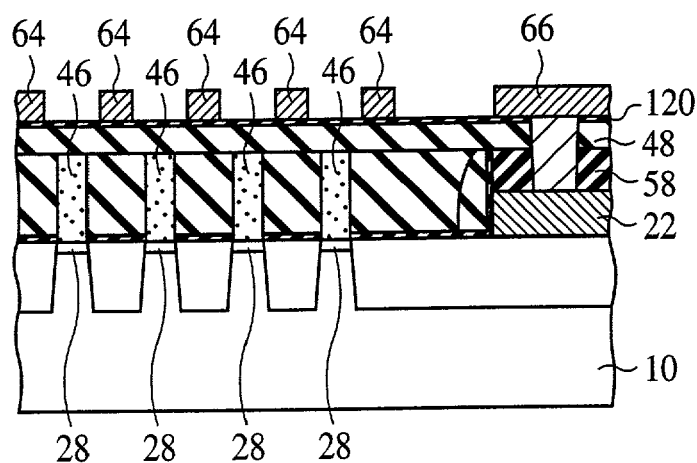
FIGS. 53A–53C, 54A–54B, 55A–55B, and 56A–56B are sectional views of the semiconductor device according to the eighth embodiment of the present invention in the steps of the method for fabricating the same, which show the method.
Figure 55A:
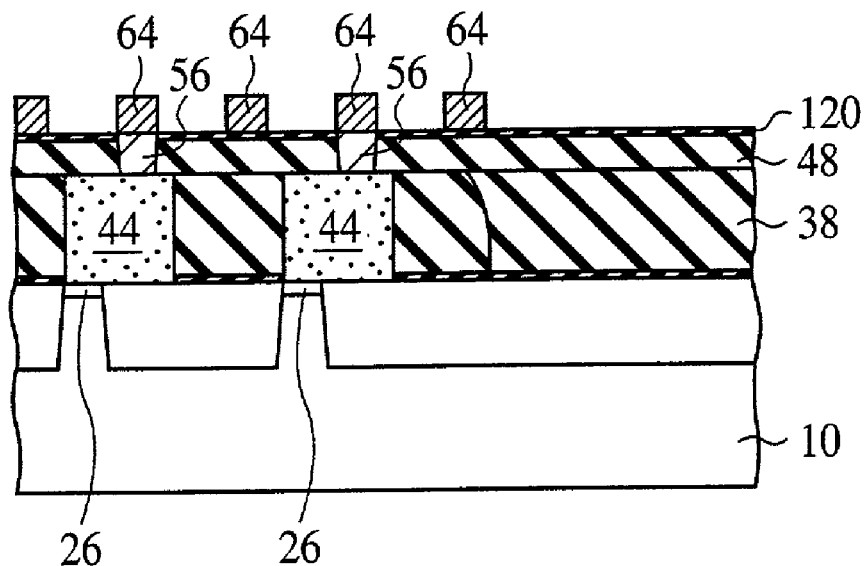

Then, a 50 nm-thick W film is deposited on the inter-layer insulation film 48 by, e.g., CVD method and patterned to form bit lines 64 connected to a source/drain diffusion layer 26 via the plugs 56, 44, and an interconnection layer 55 connected to the gate electrode 22 via the plug 58 (FIG. 53A, FIG. 55A). A width of the bit lines is, e.g., 0.18 μm, and a space between the bit liens is, e.g., 0.18 μm.

Figure 53B:
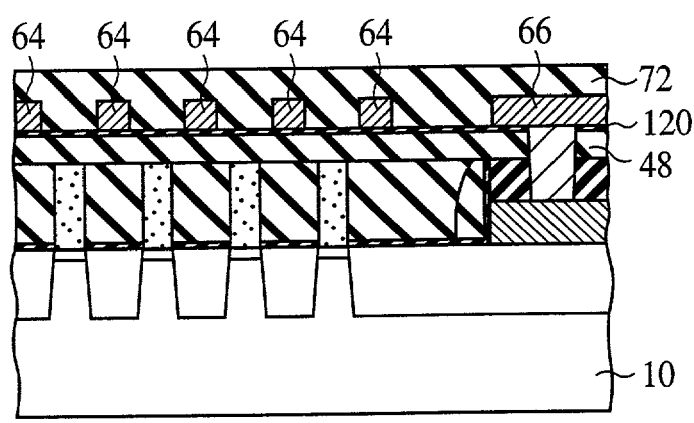
Figure 55B:
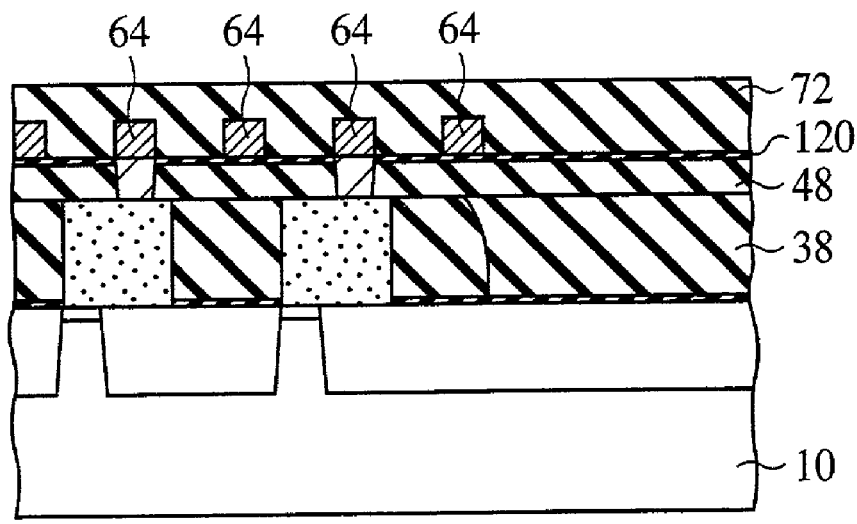

Next, a silicon oxide film is deposited on the entire surface by, e.g., CVD method, and the surface of the silicon oxide film is planarized by CMP method to form on the bit lines 64 the inter-layer insulation film 72 of the silicon oxide film of an about 50 nm-thick (FIG. 53B, FIG. 55B).

Next, contact holes 74 are formed in the inter-layer insulation film 72, the etching stopper film 120 and the inter-layer insulation film 48 down to the plugs 46 by lithography and etching.

Figure 53C:
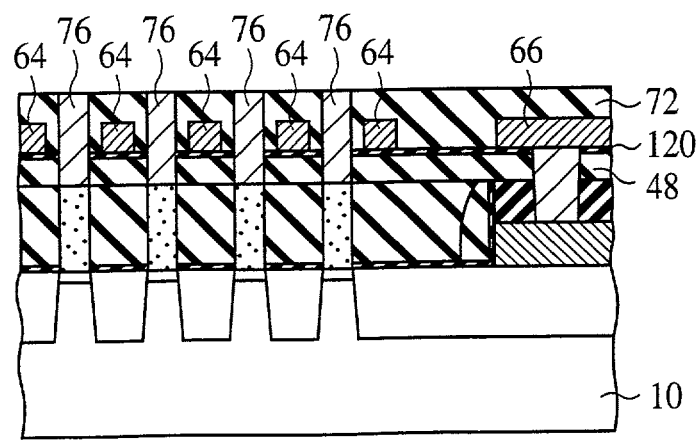

Then, plugs 76 are buried in the contact holes 74 opened in the inter-layer insulation films 72, 48 (FIG. 53C).

Figure 54A:
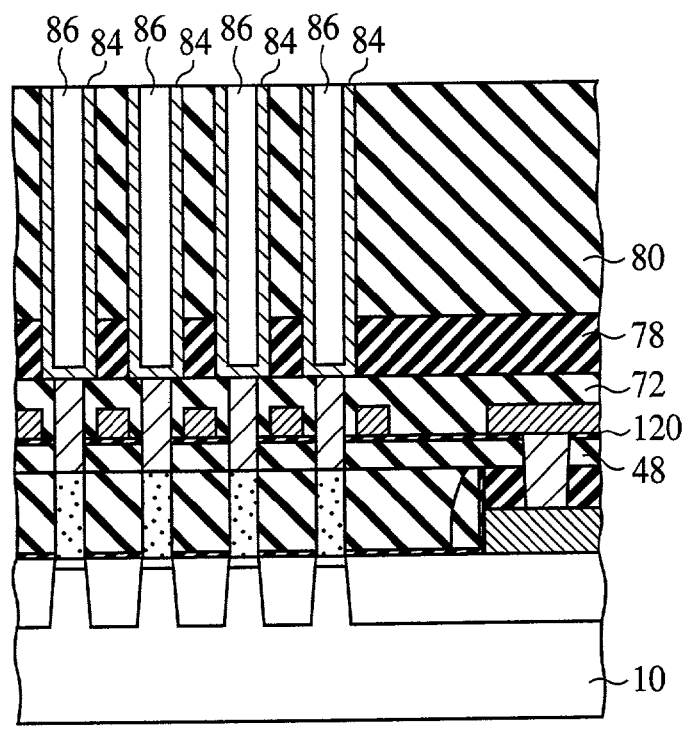
Figure 56A:
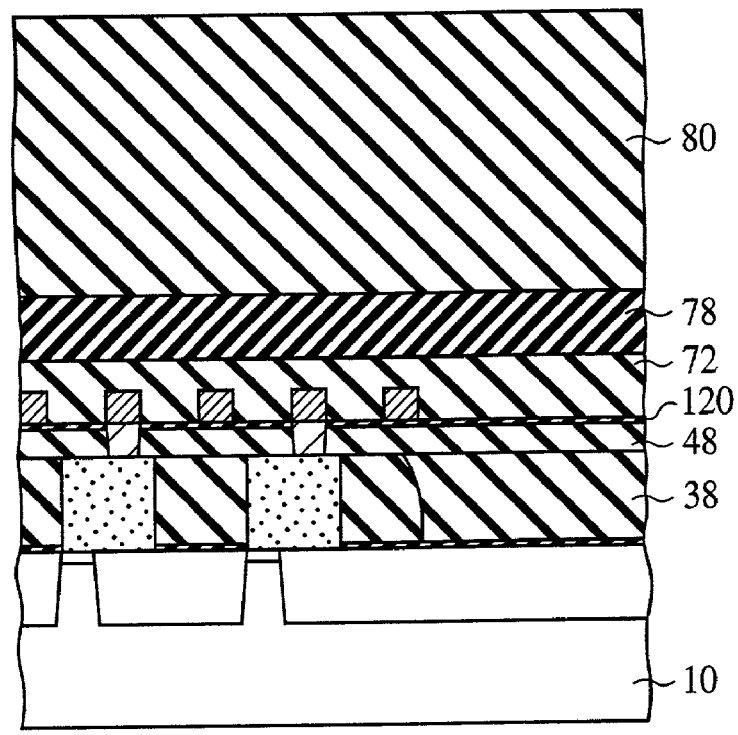
Figure 57A:
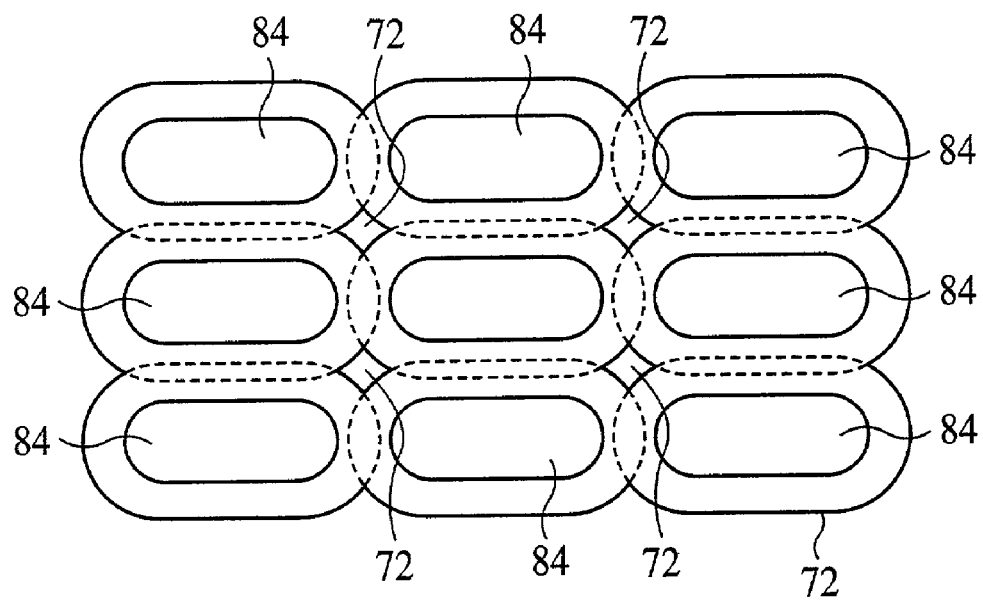
FIGS. 57A and 57B are views explaining an etching process of an inter-layer insulation film in the method for fabricating the semiconductor device according to the eighth embodiment of the present invention.
Figure 57B:
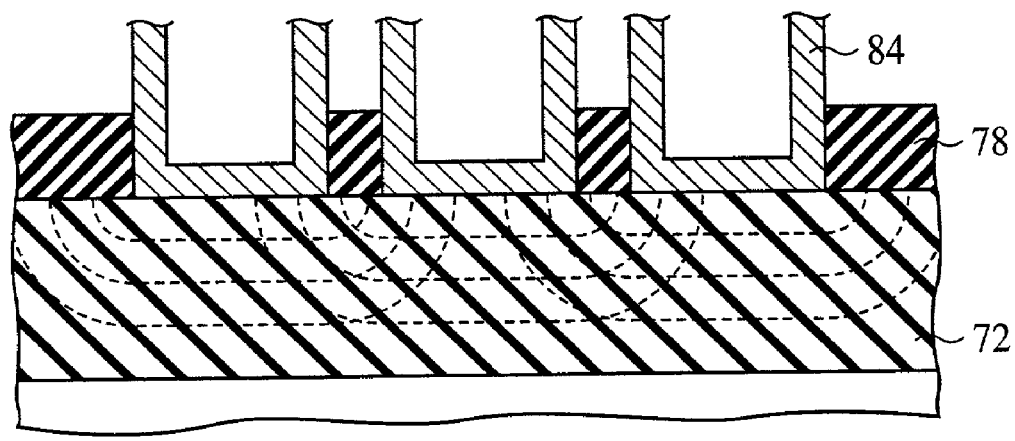

Then, in the same way as in, e.g., the method for fabricating the semiconductor device according to the first embodiment, inter-layer insulation films 78, 80, the storage electrodes 84 and an inside protection film 86 are formed (FIG. 54A, FIG. 56A).

When the 0.18 μm design rule is used, a pitch size along, e.g., the shorter sides of the storage electrodes 84 is 360 nm, and a pitch size along the longer sides of the storage electrodes is 720 nm. In consideration of optical influences in the lithography, a size of the actually formed storage electrodes 84 has, e.g., a 260 nm-width along the shorter sides and a 480 nm-width (240 nm-gap) along the longer side. A pitch of the storage electrodes 84 in the oblique direction is, e.g., 340 nm because of the rounded corners.

Figure 54B:
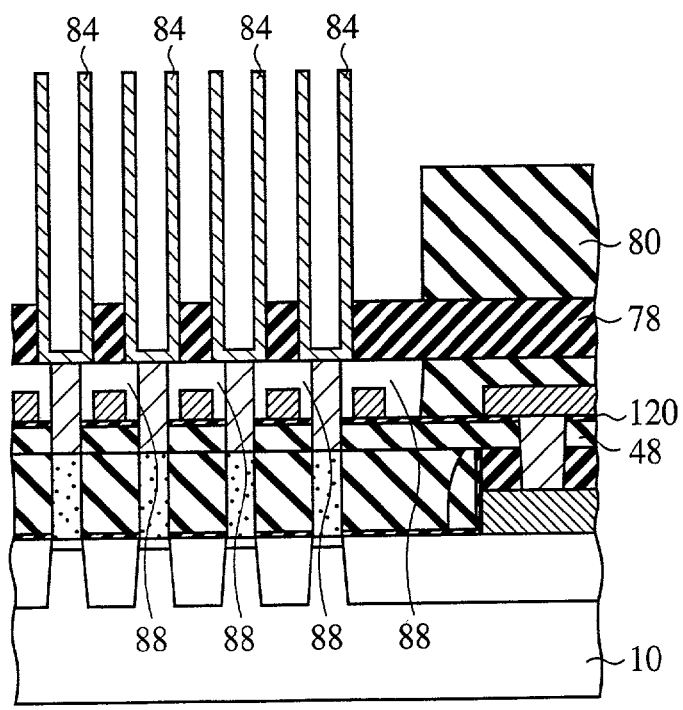
Figure 56B:
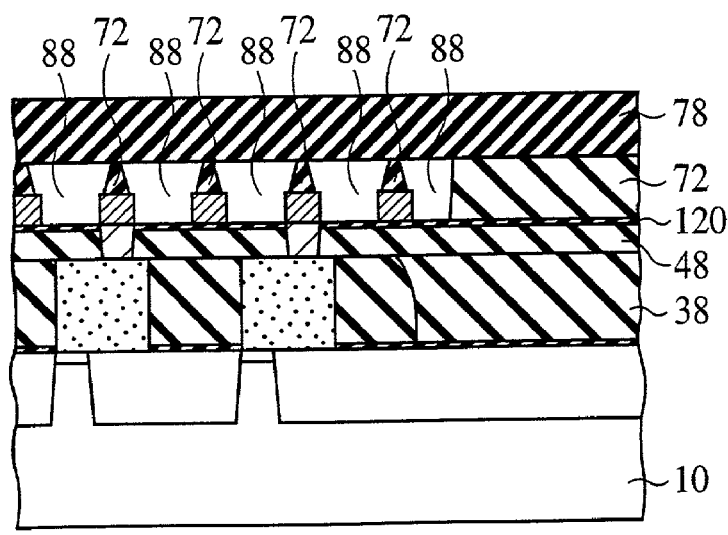

Next, the inter-layer insulation film 80 and the inside protection film 86 are etched by wet etching, e.g., using hydrofluoric acid-based aqueous solution to expose the outside surfaces of the storage electrodes 84 while etching the inter-layer insulation film 72 below the inter-layer insulation film 78, to form cavity 88 in the regions between the bit lines 64 and the region between the bit lines 64 and the plugs 76 (FIG. 54B, FIG. 56B). Because of the etching stopper film 120 formed on the inter-layer insulation film 48, the insulation films below the inter-layer insulation film 48 are not etched.

Here, the etching of the inter-layer insulation film 72 starts from the interface between the inter-layer insulation film 78 and the storage electrodes 84 and isotropically advances. Thus, the etched surface of the inter-layer insulation film 72 reflects a configuration of the storage electrodes 84.

When the above-described device parameter is used, an etching amount of the inter-layer insulation film 72 is set to be about 130 nm in thickness in consideration of, e.g., 30% overetching. Thus, all the inter-layer insulation film 72 can be etched depth-wise down to the upper surface of the etching stopper film 120.

On the other hand, the pitch of the storage electrodes 84 neighboring each other along the shorter sides is about 100 nm, and the pitch of the storage electrodes 84 neighboring each other along the longer sides is about 240 nm. The etching in the horizontal direction removes all the inter-layer insulation film 72 in these regions.

However, the pitch between the storage electrodes 84 obliquely positioned with respect to each other is about 340 nm. Under the above-described etching conditions, all the inter-layer insulation film 72 cannot be etched. Accordingly, as shown in FIGS. 51 and 57A, the substantially rhomboids of the inter-layer insulation film 72 remain at the center of the region enclosed by four storage electrodes 84. As shown in FIG. 57A, a configuration of the inter-layer insulation film 72 reflects a configuration of the storage electrodes 84 at the outer edges of the cavity 88. Etched surfaces reflecting the configuration of the storage electrodes 84 are formed also on the inter-layer insulation film 80.

The etching of the inter-layer insulation film 72 isotropically advances also depth-wise as shown in FIG. 57B. Accordingly, the inter-layer insulation film 72 remaining at the centers of the regions enclosed by 4 storage electrodes 84 have the substantially quadrangular cone which is upwardly tapered as shown in FIG. 52A and FIG. 56B.

The quadrangular cones of the inter-layer insulation film 72 are in contact with both the bit lines 64 and the inter-layer insulation film 78, supporting the inter-layer insulation film 78. The inter-layer insulation film 72 thus remaining in the substantially quadrangular cones can prevent the collapse of the inter-layer insulation film 78.

Then, in the same way as in, e.g., the method for fabricating the semiconductor device according to the first embodiment, a capacitor dielectric film 90, plate electrode 92, interconnection layers 104, 106, 112, etc. are formed.

Thus, a DRAM comprising memory cells each including one transistor and one capacitor can be fabricated.

As described above, according to the present embodiment, the collapse of the inter-layer insulation film 78 due to the cavity can be prevented also by the inter-layer insulation film 72.

[A Ninth Embodiment]

The semiconductor device and the method for fabricating the same according to a ninth embodiment of the present invention will be explained with reference to FIGS. 58A–58B, 59, 60A–60D, 61A–61C, 62A–62B, and 63.

Figure 58A:
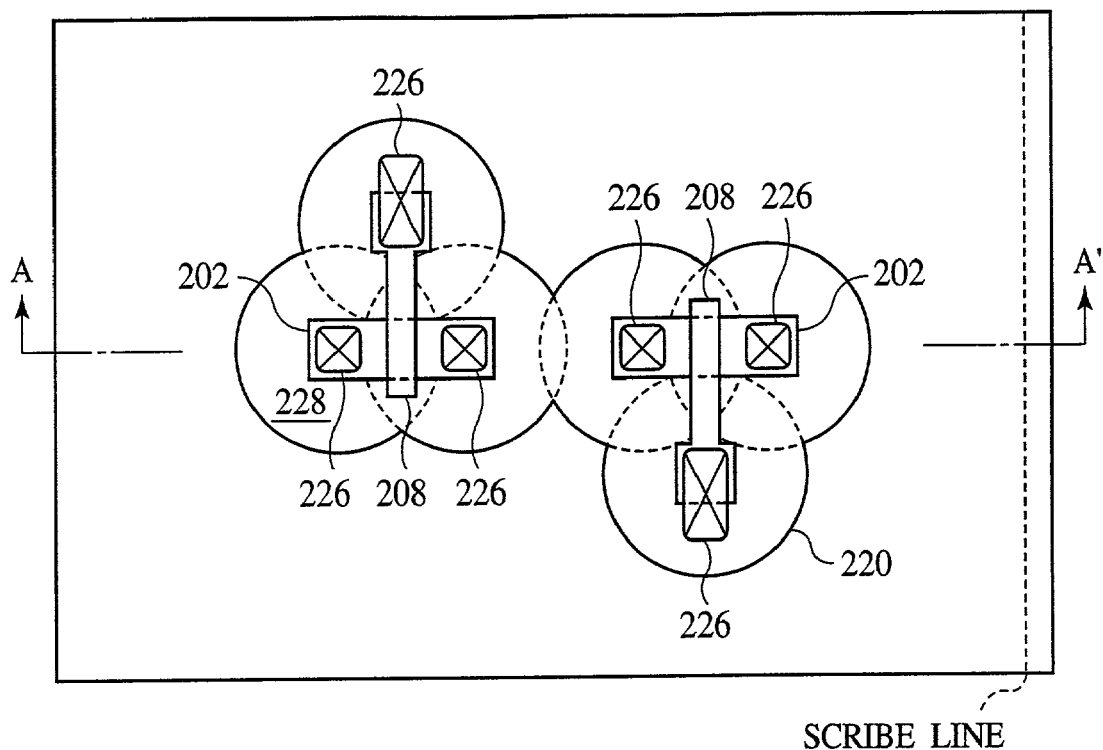
FIGS. 58A and 58B are plan views of the semiconductor device according to a ninth embodiment of the present invention, which show a structure thereof.
Figure 58B:
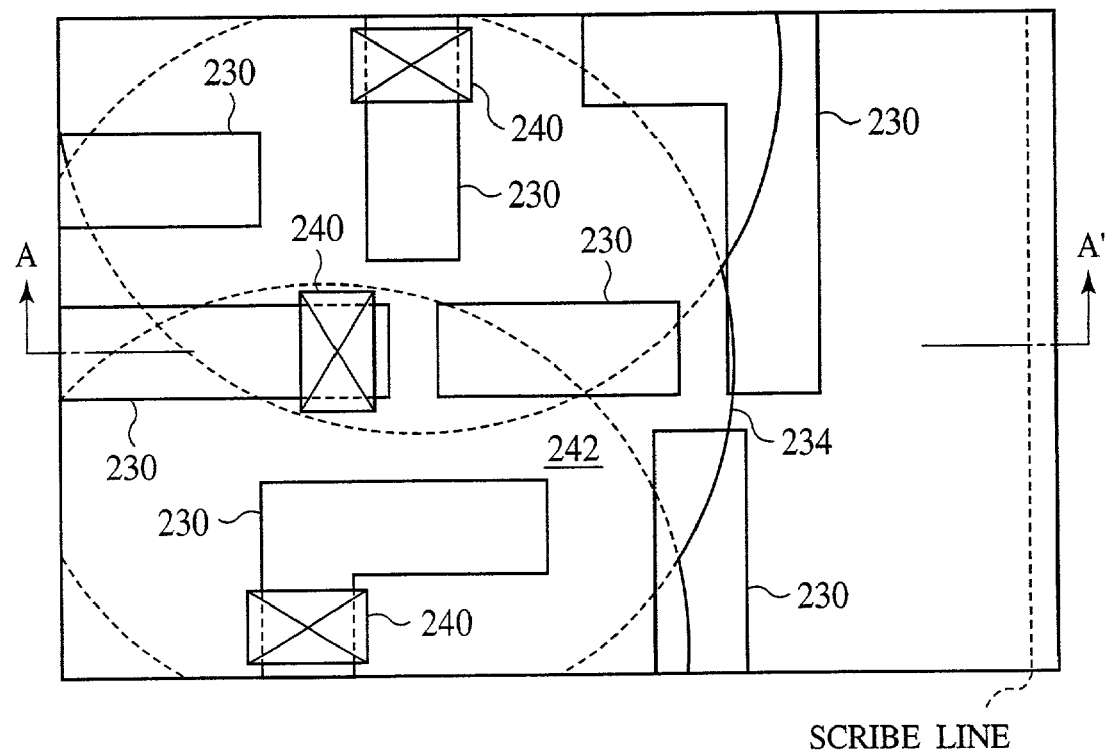
Figure 59:
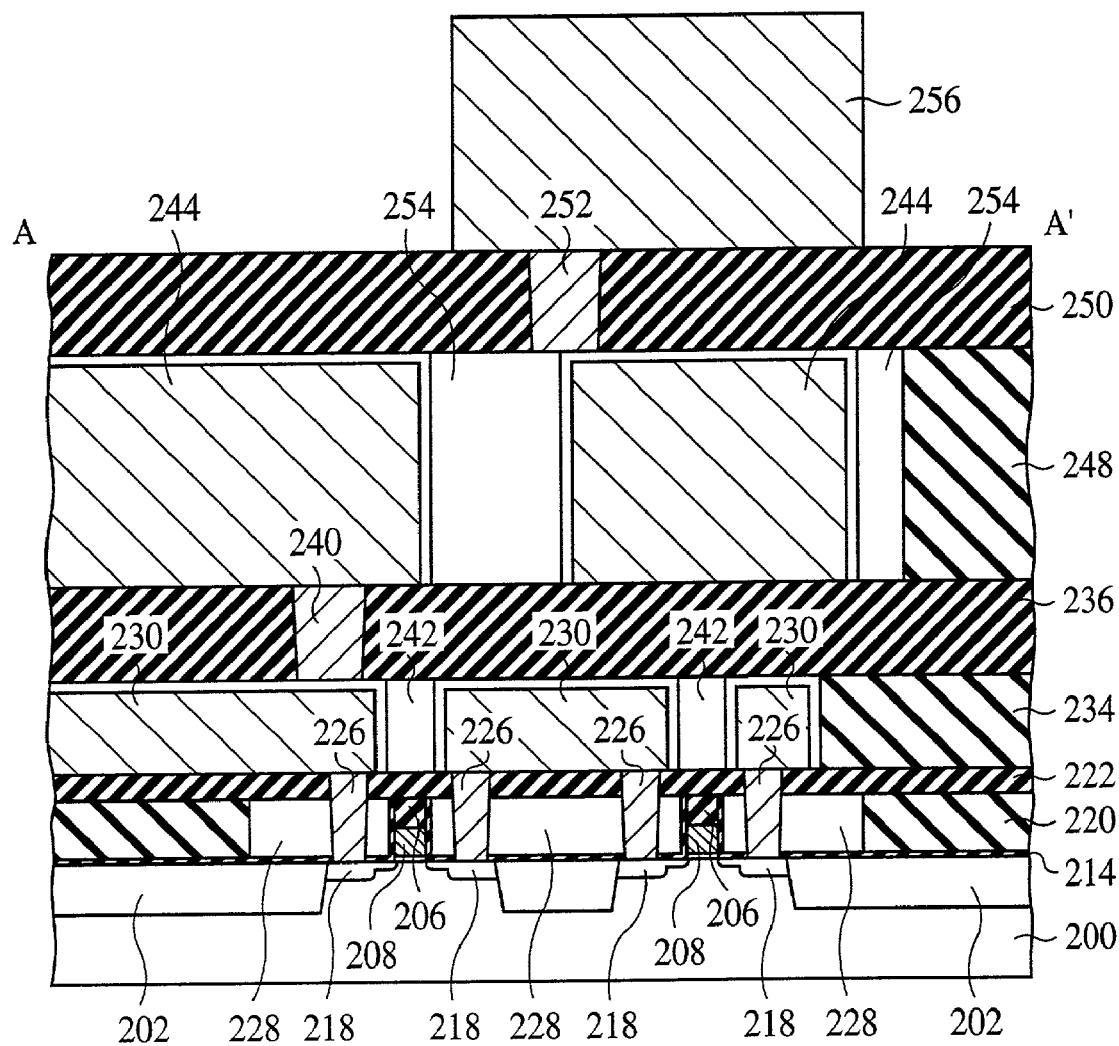
FIG. 59 is a diagrammatic sectional view of the semiconductor device according to the ninth embodiment of the present invention, which shows the structure thereof.

FIGS. 58A and 58B are plan views of the semiconductor device according to the present embodiment, which show a structure thereof. FIG. 59 is a diagrammatic sectional view of the semiconductor device according to the present embodiment, which shows the structure thereof. FIGS. 60A–60D, 61A–61C, 62A–62B, and 63 are sectional views of the semiconductor device according to the present embodiment in the steps of the method for fabricating the same, which show the method.

In the first to the eighth embodiments, the present invention is applied to DRAMs. The present invention is also applicable in the same way to other semiconductor devices, such as SRAM, other memory devices, logic devices, etc. In the present embodiment, one example of the application of the present invention to such other devices will be explained.

First, the structure of the semiconductor device according to the present embodiment will be explained with reference to FIGS. 58, 59A and 59B. FIGS. 59A and 59B are the diagrammatic sectional view along the line A–A' in FIG. 58.

A device isolation film 202 defining device regions is formed on a silicon substrate 200. MOS transistors including gate electrodes 208 having the upper surfaces covered by a silicon nitride film 206, and source/drain diffusion layers 218 are formed on the silicon substrate 200 with the device isolation film 202 formed on.

Inter-layer insulation films 220, 222 are formed on the silicon substrate 100 with the MOS transistors formed on. An interconnection layers 230 connected to the source/drain diffusion layers 210 via plugs 226 are formed on the inter-layer insulation film 222.

Inter-layer insulation films 234, 236 are formed on the inter-layer insulation film 222 with the interconnection layer 230 formed on. An interconnection layer 244 connected to the interconnection layer 230 via the plug 240 is formed on the inter-layer insulation film 236.

Inter-layer insulation films 248, 250 are formed on the inter-layer insulation film 236 with the interconnection layer 244 formed on. An interconnection layer 256 connected to the interconnection layer 244 via the plug 252 is formed on the inter-layer insulation film 250.

Here, the semiconductor device according to the present embodiment is characterized in that the cavity 228 is formed in the inter-layer insulation film 220, cavity 242 is formed in the inter-layer insulation film 234, and cavity 254 is formed in the inter-layer insulation film 248. As shown in FIG. 59, the cavities 228, 242, 254 have a circular shape centered respectively at the plugs 226, 240, 252, and adjacent cavities are connected with each other.

The cavity 228, 242, 254 are formed respectively in the inter-layer insulation films 220, 234, 248, whereby the parasitic capacitances between the interconnection layers can be drastically decreased.

Next, the method for fabricating the semiconductor device according to the present embodiment will be explained with reference to FIGS. 60A–60D, 61A–61C, 62A–62B, and 63. FIGS. 60A–60D, 61A–61C, 62A–62B, and 63 show the sectional views of the semiconductor device in the steps of the method for fabricating the same along the line A–A' in FIGS. 58A and 58B.

First, the device isolation film 202 is formed on the main surface of a semiconductor substrate 200 by, e.g., STI method.

Next, a gate insulation film 204 of silicon oxide film is formed by, e.g., thermal oxidation method, on a plurality of device regions defined by the device isolation film 202.

Next, a polycrystalline silicon film and a silicon nitride film, for example, are sequentially deposited on the entire surface by, e.g., CVD method, and the layer film is patterned to form the gate electrodes 208 of the polycrystalline silicon film having the upper surfaces covered by the silicon nitride film 206. The gate electrodes 208 is not essentially formed of a single layer of polycrystalline silicon film and may have a polycide structure or a polymetal structure, or may be formed of a metal film or others.

Figure 60A:
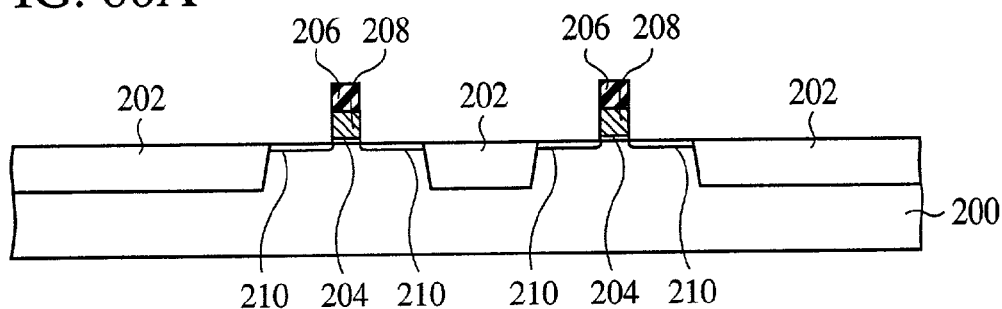
FIGS. 60A–60D, 61A–61C, 62A–62B, and 63 are sectional views of the semiconductor device according to the ninth embodiment of the present invention in the steps of the method for fabricating the same, which show the method.

Then, with the gate electrodes 208 as a mask, ions are implanted to form impurity diffused regions 210 to be LDD regions or extension regions in the silicon substrate 200 on both sides of the gate electrodes 208 (FIG. 60A).

Next, a silicon nitride film 214 of, e.g., a 5–20 nm-thick and a silicon oxide film of, e.g., 70 nm-thick are sequentially formed on the entire surface by, e.g., CVD method.

Then, with the silicon nitride film 214 as a stopper, the silicon oxide film is etched back. Thus, a sidewall insulation film 216 of the silicon oxide film is formed on the side walls of the gate electrodes 208 and the silicon nitride film 214 on the gate electrode 208.

The silicon nitride film 214 is for preventing the device isolation film 202 from being etched when the sidewall insulation film 216 is removed in a later step. The silicon nitride film 214 is not essential in a case that the device isolation film 202 is formed of a film having etching characteristics different from the sidewall insulation film 216 (e.g., a silicon nitride film).

Next, with the gate electrodes 208 and the sidewall insulation film 216 as a mask, ions are implanted to form the source/drain diffusion layers 218 of an LDD structure or an extension structure in the silicon substrate 200 on both sides of the gate electrodes 208.

Figure 60B:
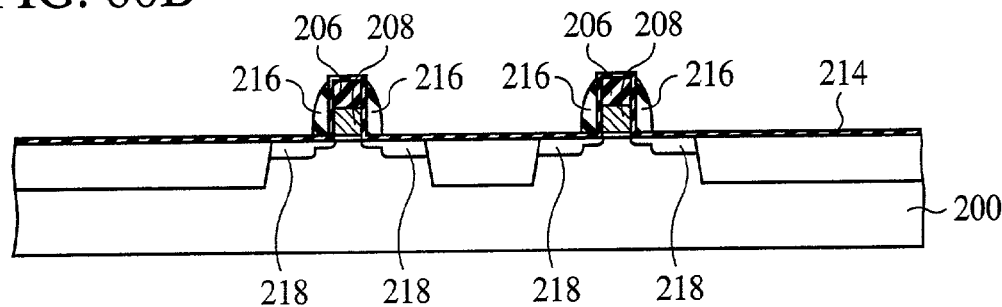

Thus a MOS transistors comprising the gate electrodes 208, and the source/drain diffusion layers 218 formed in the silicon substrate 100 on both sides of the gate electrodes 208 is fabricated (FIG. 60B).

Next, a silicon oxide film of, e.g., a 500 nm-thick is deposited on the entire surface by, e.g., CVD method, and the surface of the silicon oxide film is polished by CMP method or others until the silicon nitride film 106 is exposed to form the inter-layer insulation film 220 of the silicon oxide film having the surface planarized.

Figure 60C:
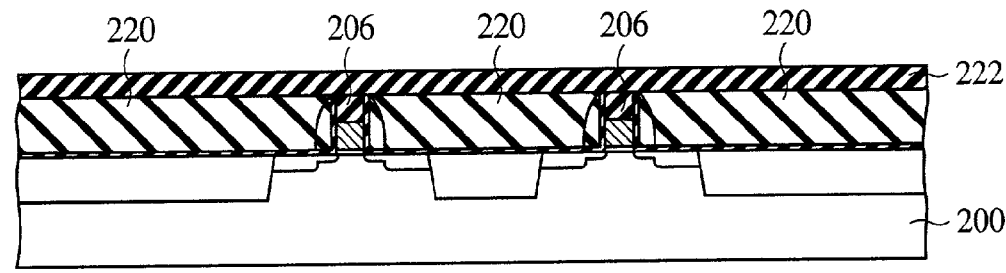

Then, a silicon nitride film of, e.g., a 40–80 nm-thick is deposed on the entire surface by, e.g., CVD method to form the inter-layer insulation film 222 of the silicon nitride film (FIG. 60C).

Next, contact holes 224 are formed through the inter-layer insulation films 220, 222 and the silicon nitride film 214 down to the source/drain diffusion layers 218 by lithography and etching.

Figure 60D:
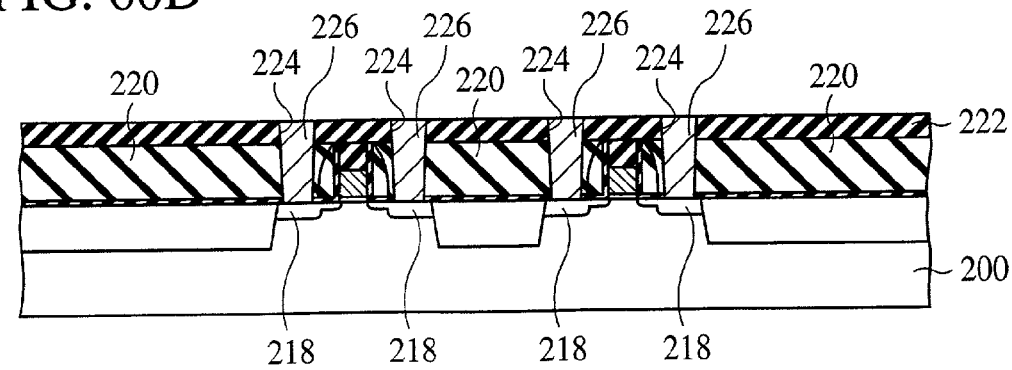

Then, the plugs 226 are buried in the contact holes 224 (FIG. 60D). For example, an Ru film of, e.g., a 10 nm-thick, a TiN film of, e.g., a 15 nm-thick and a W film of, e.g., a 200 nm-thick are sequentially deposited on the entire surface by, e.g., CVD method and are removed plane by CMP method until the surface of the inter-layer insulation film 222 is exposed to form the plugs 226 of the W film/TiN film/Ru film buried in the contact holes 224 are formed.

The lowest Ru film is for the contact with the silicon substrate 200, as is the usually used Ti film. The Ru film reacts with the silicon substrate 200 in the thermal processing, etc. for forming the source/drain diffusion layer 218 to form a silicide film on the interface between the TiN film and the silicon substrate 200.

Figure 61A:
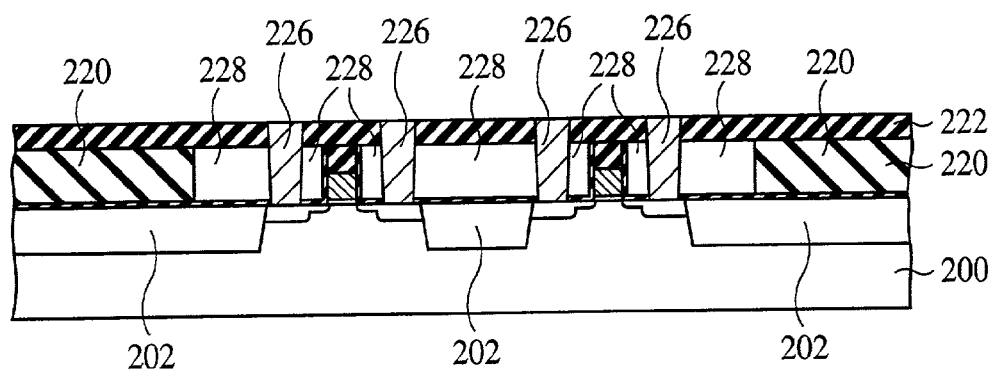

Next, wet etching using, e.g., hydrofluoric aid based aqueous solution follows. At this time, the outer peripheries of the plugs 226 are formed of the Ru film of poor adhesion to silicon oxide film and silicon nitride film, which forms the inter-layer insulation films 220, 222, and the etchant intrudes into the interface between the plugs 226 and the inter-layer insulation film 222 to etch the inter-layer insulation film 220 and the sidewall insulation film 216 below the inter-layer insulation film 222. Thus, the cavity 228 is formed below the inter-layer insulation film 222 (FIG. 61A). Because of the silicon nitride film 214 formed on the device isolation film 202 and on the side walls of the gate electrodes 208, the device isolation film 202 and the gate insulation film 204 are not etched.

The cavity 228 is thus formed, whereby the dielectric constants in the regions between the gate electrodes 208, and between the gate electrodes 208 and the plugs 226 can be decreased, with a result the parasitic capacitances of these interconnections can be drastically decreased.

As shown in FIG. 58A, the etching of the inter-layer insulation film 220 and the sidewall insulation film 216 starts at the plugs 226 and isotropically advances. The cavity 228 which is too wide causes the risk of the inter-layer insulation film 222 collapsing. It is preferable to adjust an etching amount of the inter-layer insulation film 220 suitably for the inter-layer insulation film 222 not to collapse. When the cavity 228 arrives at scribe lines, the cavity 228 is exposed at the peripheries of diced chips, which may cause the risk of degraded moisture resistance. Accordingly, when the cavity 228 is formed, control must be made so that the peripheries of the cavity 228 do not reach scribe lines.

Then, the interconnection layer 230 connected to the MOS transistors via the plug 226 is formed on the inter-layer insulation film 222. The surface of the interconnection layer is covered with a protection film 232 of hydrofluoric acid resistant, such as TiN, WN, SiN, $Al_2O_3$, W, Ti, Si, etc.

Figure 61B:
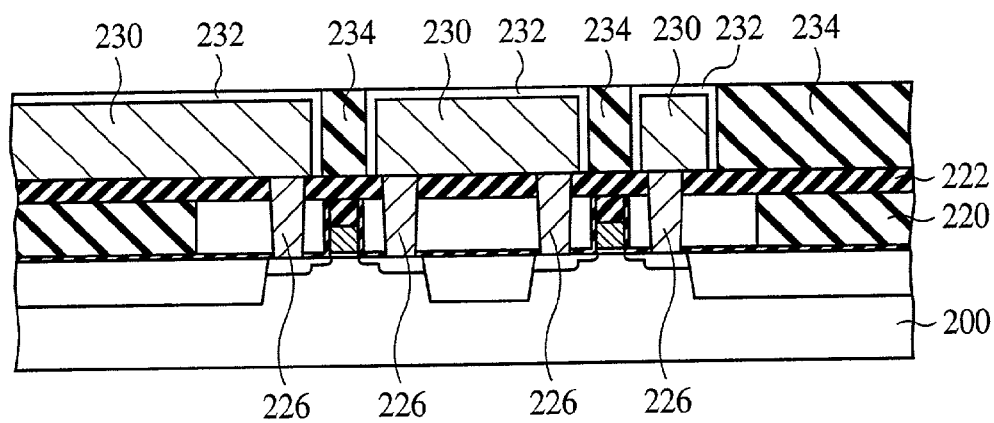

Next, a silicon oxide film of, e.g., a 500–1000 nm-thick is deposited on the entire surface by, e.g., CVD method, and the surface of the silicon oxide film is polished by, CMP method or others until the protection film 232 is exposed to form the inter-layer insulation film 234 of the silicon oxide film having the surface planarized (FIG. 61B).

Then, a silicon nitride film of, e.g., a 100–500 nm-thick is deposited on the entire surface by, e.g., CVD method to form the inter-layer insulation film 236 of the silicon nitride film.

Then, a contact hole is formed in the inter-layer insulation film 236 down to the protection film 232 by lithography and etching. In a case that the protection film 232 is formed of an insulation film, the contact holes 238 are formed down to the interconnection layer 230.

Figure 61C:
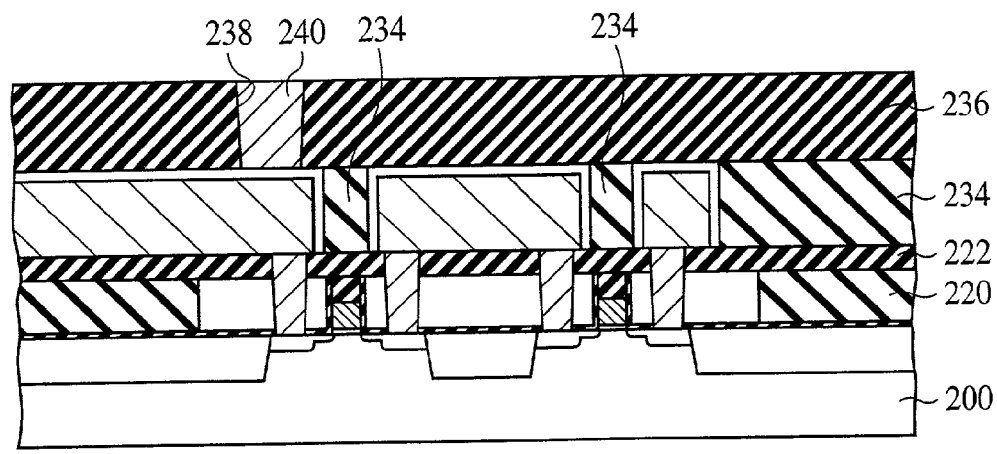

Next, the plug 240 is buried in the contact hole 238 (FIG. 61C). For example, an Ru film of, e.g., a 300 nm-thick is deposited on the entire surface by, e.g., CVD method and removed plane by CMP method until the surface of the inter-layer insulation film 236 is exposed to form the plug 240 of the Ru film buried in the contact hole 238. In a case that the interconnection layer 230 is a metal, the plugs 240 may be formed of the Ru film alone as described above, because the contact metal (Ti) and the barrier metal (TiN) are not essential.

Then, wet etching using, e.g., a hydrofluoric acid-based aqueous solution is performed. In this time, because the outer periphery of the plug 240 is formed of the Ru film, whose adhesion to the silicon oxide film forming the inter-layer insulation film 236 is poor, the etchant intrudes through the interface between the plug 240 and the inter-layer insulation film 236 to etch the inter-layer insulation film 234 below the inter-layer insulation film 236. Thus, the cavity 242 is formed below the inter-layer insulation film 236 (FIG. 61A).

At this time, as shown in FIG. 58, the plug 240 is formed beyond the regions of the interconnection layer 230, and the hydrofluoric acid-based aqueous solution intruded through the interface can arrive at the inter-layer insulation film 236. Because of the interconnection layer 230 formed, completely covering the plugs 226, the etchant never reaches the lower layers to etch the inter-layer insulation film 220.

The cavity 242 is thus formed, whereby the dielectric constant of the regions between the interconnection layers 230 can be decreased, and accordingly the parasitic capacitance of the interconnection layers 230 can be drastically decreased.

As shown in FIG. 58B, the etching of the inter-layer insulation film 234 starts at the plugs 240 and isotropically advances. The cavity which are too wide may cause the risk of the collapse of the inter-layer insulation film 236. Accordingly, it is preferable that an etching amount of the inter-layer insulation film 234 is suitably adjusted so that the inter-layer insulation film 236 does not collapse. The cavity 242 which arrives at scribe lines are exposed in the peripheries of diced chips, with a risk of degraded moisture resistance. Accordingly, when the cavity 242 is formed, control must be made so that the peripheries of the cavity 242 do not arrive at scribe lines.

Figure 62A:
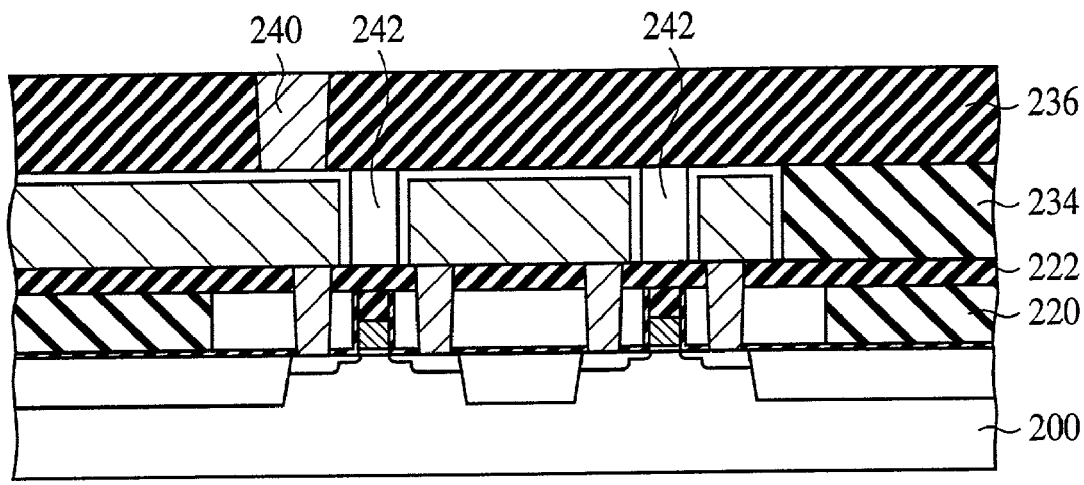
Figure 62B:
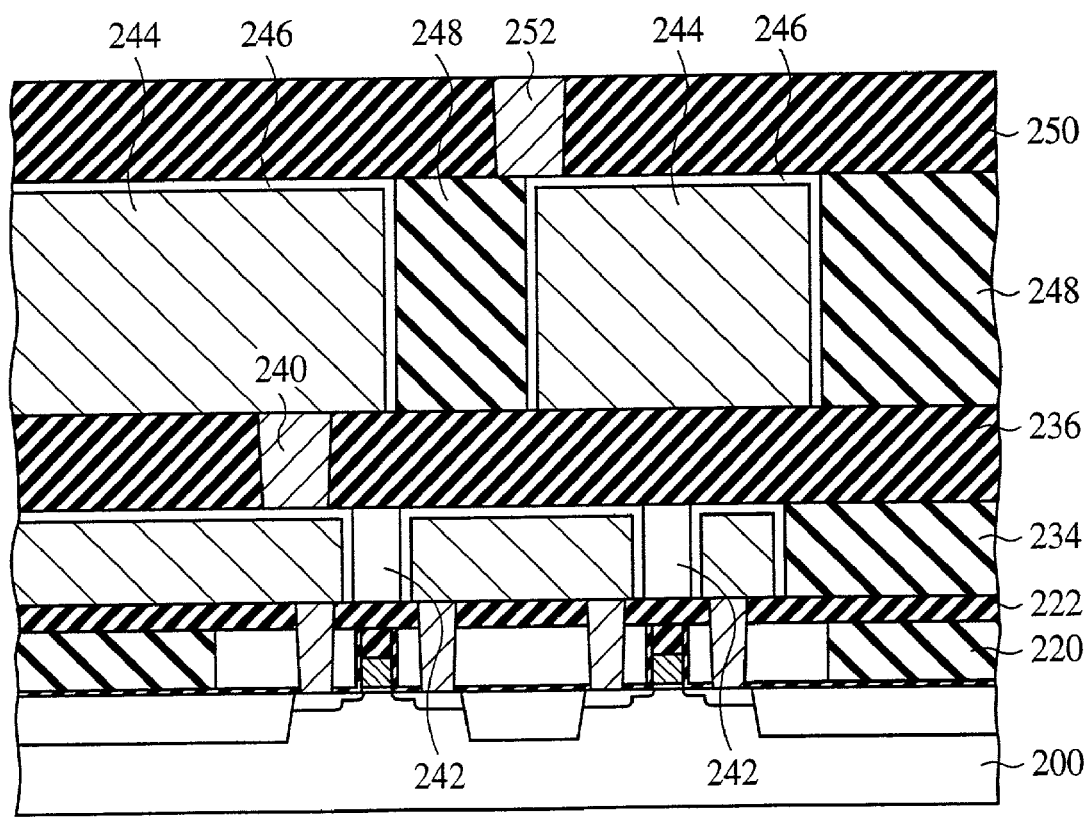

Next, the interconnection layer 244, the protection film 246, the inter-layer insulation films 248, 250 and the plugs 252 are formed on the inter-layer insulation film 236 by the same processing as the interconnection layer 230, the protection film 232, the inter-layer insulation films 234, 236 and the plugs 240 were formed (FIG. 62B).

Then, wet etching using, e.g., a hydrofluoric acid-based aqueous solution is performed. At this time, because the periphery of the plug 252 is formed of Ru film, whose adhesion to silicon oxide film forming the inter-layer insulation film 250 is poor, the etchant intrudes through the interface between the plug 252 and the inter-layer insulation film 250 to etch the inter-layer insulation film 248 below the inter-layer insulation film 250. Thus, the cavity 254 is formed below the inter-layer insulation film 250.

The cavity 254 is thus formed, whereby the dielectric constant of the regions between the interconnection layers 244 can be decreased, and accordingly the parasitic capacitance between the interconnection layers 244 can be drastically decreased.

The etching of the inter-layer insulation film 248 starts at the plug 252 and isotropically advances. The cavity 254 which is too wide cause the risk of the collapse of the inter-layer insulation film 250. Accordingly, it is preferable that an etching amount of the inter-layer insulation film is adjusted suitable so that the inter-layer insulation film 250 does not collapse. In a case that the cavity 254 reaches scribe lines, the cavity 254 is exposed at the peripheries of diced chips, with a risk of degraded moisture resistance. Accordingly, when the cavity 254 is formed, control must be made so that the peripheries of the cavity 254 do not arrive at scribe lines.

Figure 63:
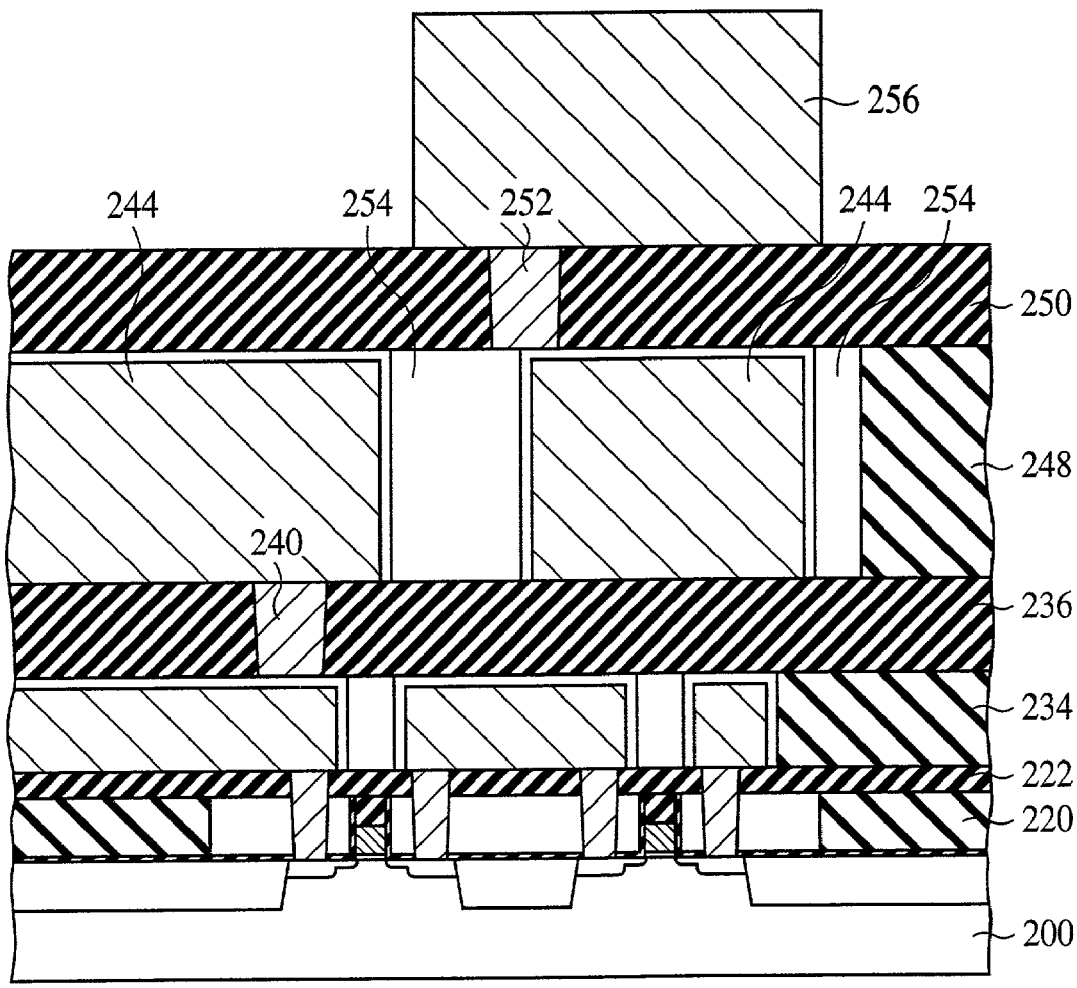

Next, the interconnection layer 256 connected to the interconnection layer 244 via the plug 252 is formed on the inter-layer insulation film 250 (FIG. 63).

As described above, according to the present embodiment, the cavity is formed in the lower inter-layer insulation films by forming on the outer periphery of the plug the film whose adhesion to the inter-layer insulation film is poor, and utilizing the intrusion of the etchant through the interface between the plugs and the inter-layer insulation film, whereby the parasitic capacitance between the interconnection layers can be drastically decreased.

Figure 64A:
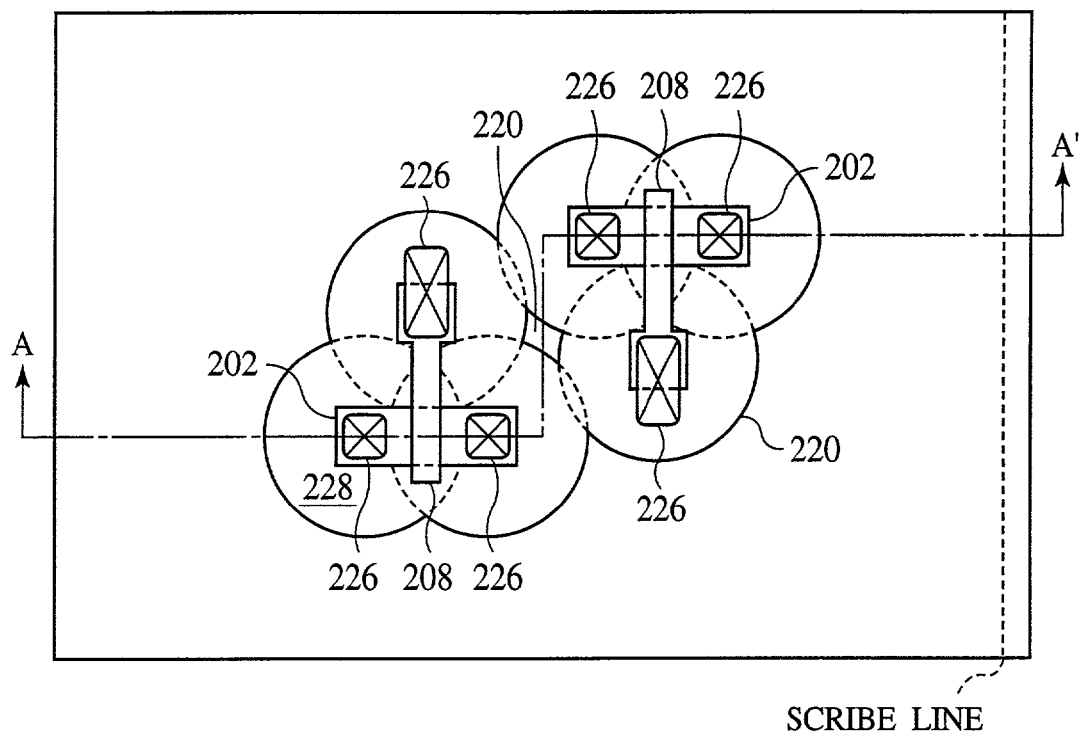
FIG. 64A is a plan view explaining the semiconductor device and the method for fabricating the same according to one modification of the ninth embodiment of the present invention.
Figure 64B:
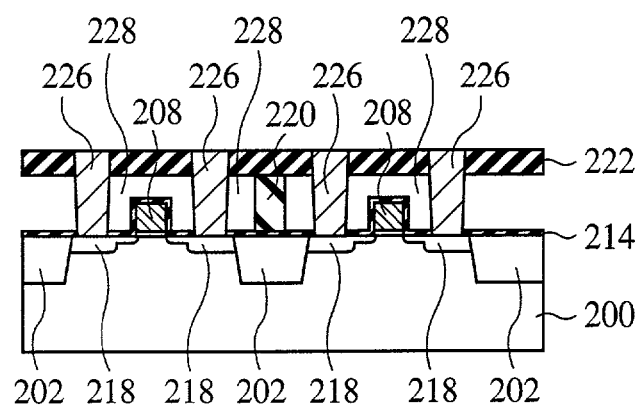
FIG. 64B is a diagrammatic sectional view explaining the semiconductor device and the method for fabricating the same according to one modification of the ninth embodiment of the present invention.

In the present embodiment, the silicon nitride film 206 is formed on the upper surfaces of the gate electrodes 208 to support the inter-layer insulation film 222 on the cavity 228, but the silicon nitride film 206 on the gate electrodes 208 is not essential, and in such case, as exemplified in FIG. 64, the inter-layer insulation film 220 may be left in a pillar shape in the cavity 228 to thereby prevent the collapse of the inter-layer insulation film 222. The inter-layer insulation film may be left in such pillar shape in the case that the silicon nitride film 206 is formed. When the cavity 228 is sufficiently small, the peripheries of the cavity 228 can be used as a structure for preventing the collapse of the inter-layer insulation film 222.

In the present embodiment, etching amounts of the inter-layer insulation films are controlled so that the cavity contact each other via the respective plugs, but etching amounts may be reduced so that the respective plugs are disposed in the discrete cavity.

In the present embodiment, the inter-layer insulation films 228, 242, 254 are respectively etched, but the cavity maybe formed in all the inter-layer insulation films by once etching. In this case, the respective plugs and the interconnection layers are arranged, offset from each other. For the control of etching amounts of the respective inter-layer insulation films, etching amounts of materials forming the respective inter-layer insulation films are suitably controlled.

[Modifications]

The present invention is not limited to the above-described embodiments and can cover other various modifications.

To give examples, in the above-described first to the eighth embodiments, the intrusion of the etchant through the storage electrode and the inter-layer insulation film is utilized to etch the lower insulation films, but pinholes formed in the storage electrode can be used to etch the lower insulation films. In forming the storage electrodes of a polycrystalline material, pinholes are often formed in crystal grain boundaries. To this end, conditions for forming the storage electrode is controlled suitably to form pinholes in the storage electrodes, whereby the pinholes formed in the storage electrode can be used to etch the lower insulation films.

The storage electrode having pinholes can be formed by making a density of growth nuclei at the early stage of the film deposition lower. For example, a film deposition temperature is set to be as low as 270–290° C. (the ordinary film deposition temperature is 300–330° C.) to thereby form storage electrodes having pinholes.

Figure 65:
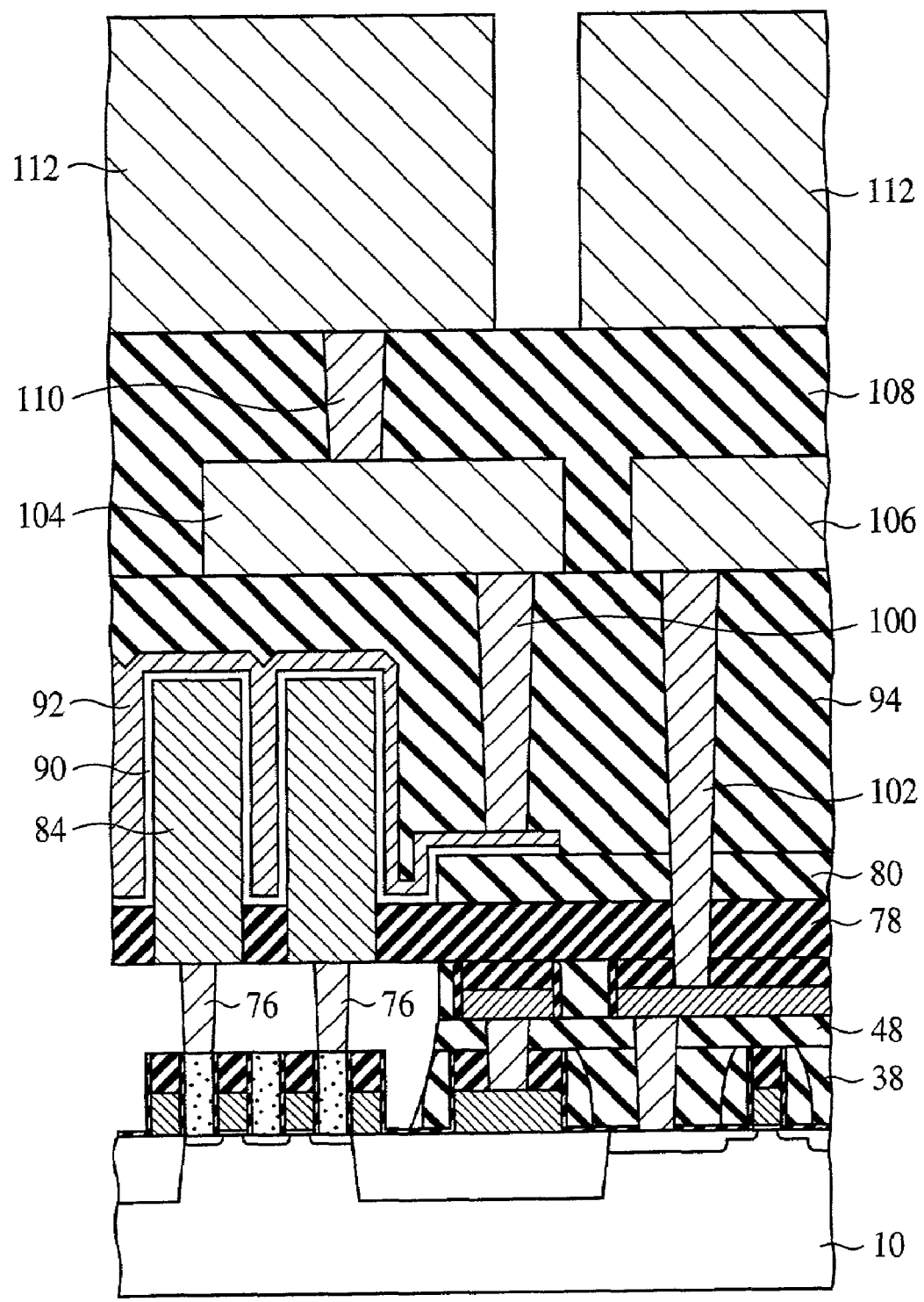
FIG. 65 is a diagrammatic sectional view of the semiconductor device according to a first modification of the embodiment of the present invention, which shows a structure thereof.
Figure 66:
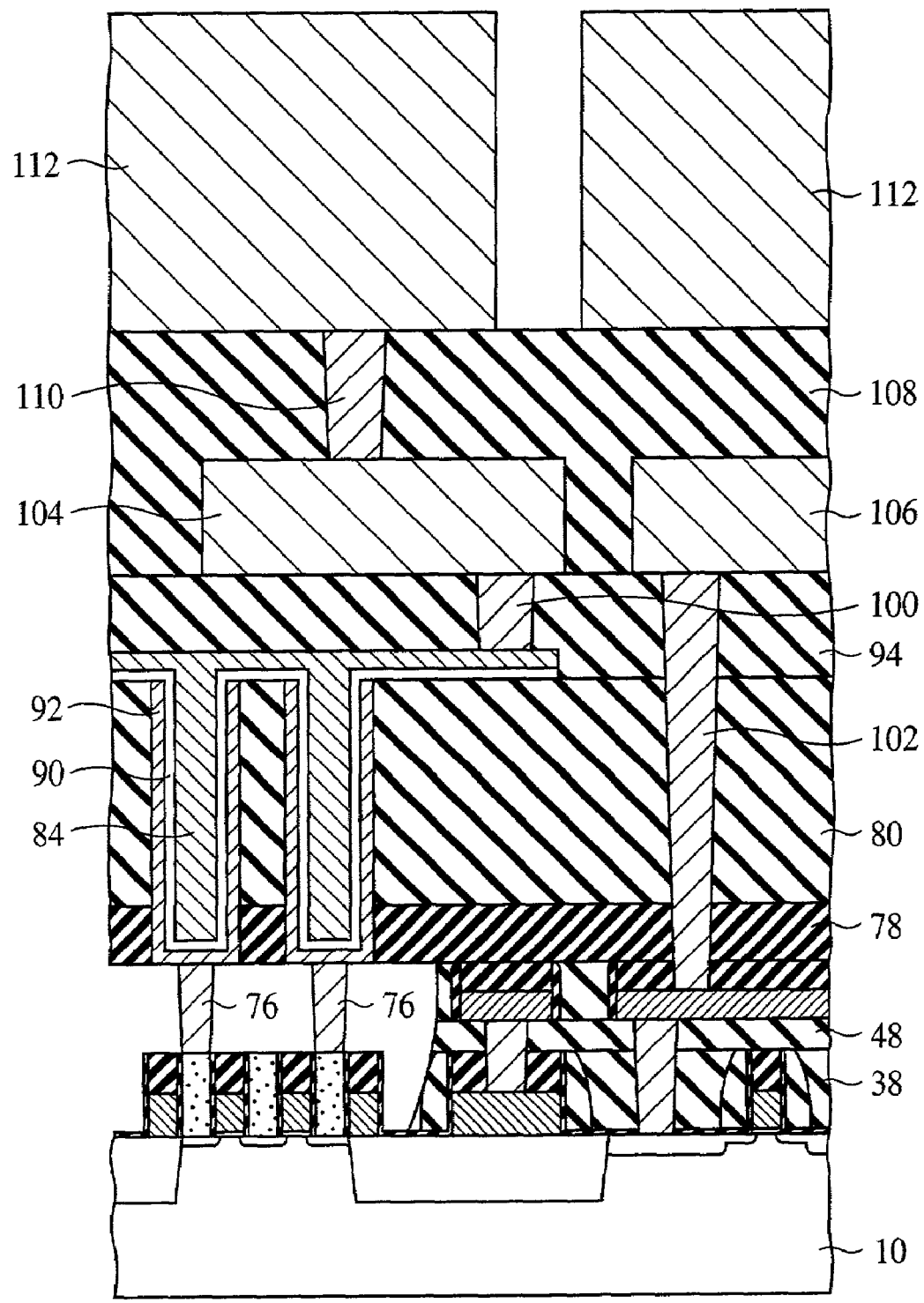
FIG. 66 is a diagrammatic sectional view of the semiconductor device according to a second modification of the embodiment of the present invention, which shows a structure thereof.

In the above-described first to eighth embodiments, the present invention is applied to semiconductor devices including the so-called cylindrical capacitors using the inside surfaces and the outside surfaces of the cylindrical storage electrodes as the storage electrode surfaces. However, capacitors to which the present invention is applicable are not limited to the cylindrical capacitors. As exemplified in FIG. 65, the present invention is applicable to the so-called pillar-shaped capacitor having pillar-shaped storage electrode 84, or as exemplified in FIG. 66, the so-called concave capacitors using the inside surfaces alone of the storage electrodes 84 as the storage electrode surfaces.

In forming the pillar-shaped capacitors, openings 82 are buried with storage electrodes 84 in the processing of forming the storage electrodes 84.

In forming the concave capacitors, the inter-layer insulation film 80 is formed of an insulation film, e.g., silicon nitride film, having resistance to a hydrofluoric acid-based aqueous solution and is left in the etching process for forming the cavity 88. In place of forming the entire inter-layer insulation film 80 of an insulation film having resistance to a hydrofluoric acid-based aqueous solution, an insulation film having resistance to a hydrofluoric acid-based aqueous solution may be formed on the upper surface of the inter-layer insulation film 80 and the inside walls of the openings 82.

In the above-described first to eighth embodiments, the present invention is applied to the capacitors of DRAMs, but a ferroelectric film is used as the capacitor dielectric film 90, and ferroelectric memories (FeRAM) may be formed of the same structures.

In above-described the first to seventh embodiments, the inter-layer insulation film 78 is supported by the silicon nitride film 62 formed on the bit lines. In the above-described eighth embodiment, the inter-layer insulation film 78 is supported by the substantially quadrangular cones of the inter-layer insulation film 72 formed on the bit lines 64. In the above-described modification of the ninth embodiment, the substantially square pole of the inter-layer insulation film 220 support the inter-layer insulation film 222. However, the inter-layer insulation films 78, 222 can be supported by other constituent members.

Figure 67A:
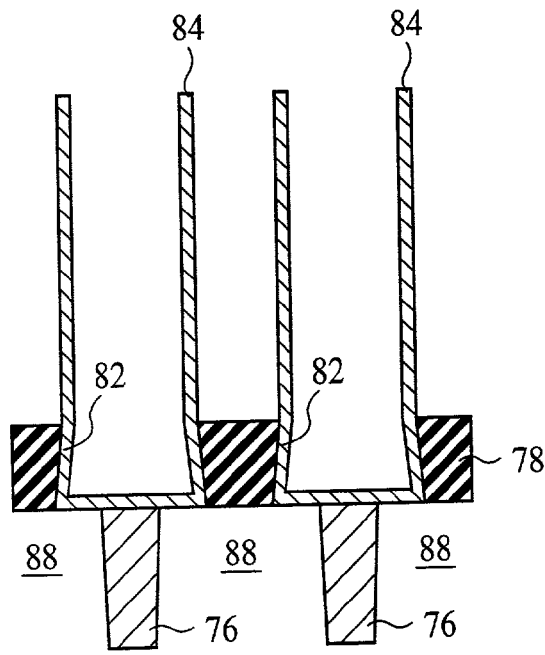
FIGS. 67A and 67B are diagrammatic sectional views of the semiconductor device according to a third modification of the embodiment of the present invention, which shows a structure thereof.

For examples, as shown in FIG. 67A, the openings 82 have the parts corresponding to the inter-layer insulation film 78 are increasingly tapered, whereby the storage electrodes 84 can have the parts corresponding to the increasingly tapered parts increasingly tapered. Accordingly, the inter-layer insulation film 78 is caught by the storage electrodes 84, whereby the inter-layer insulation film 78 is prevented from collapsing toward the cavity 88.

Figure 67B:
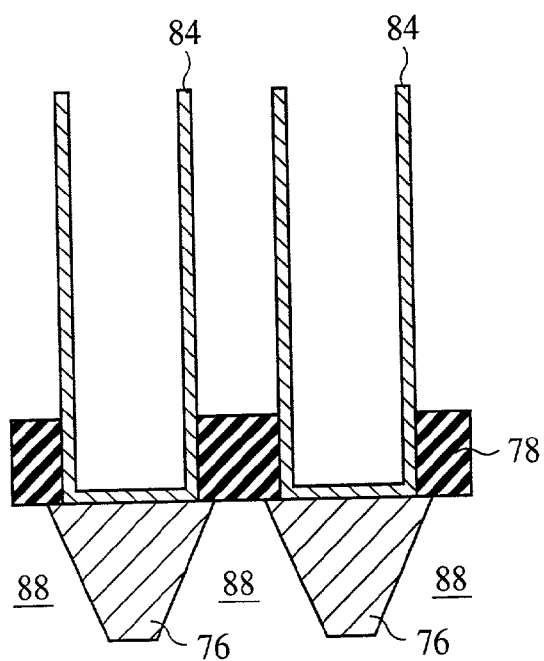
Figure 68A:
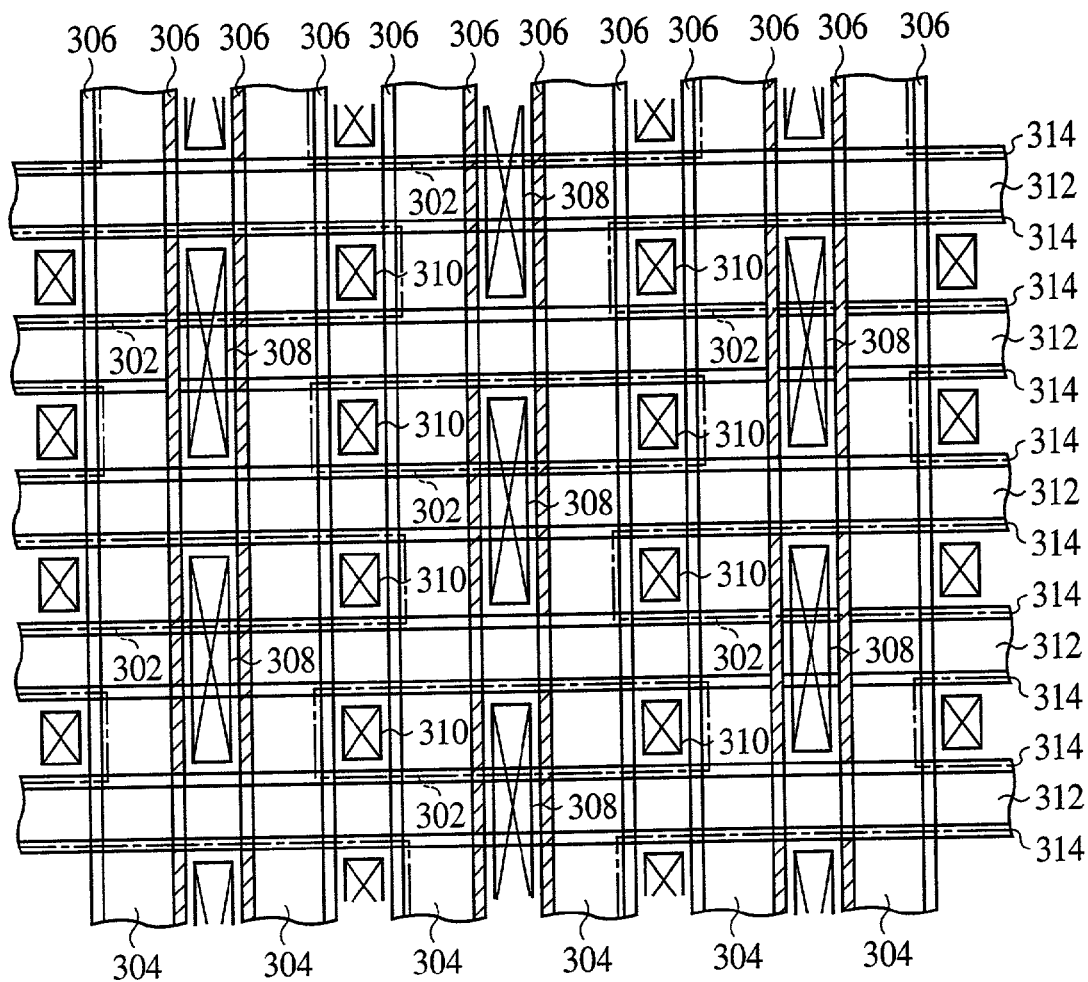
FIGS. 68A and 68B are plan views of the conventional semiconductor device, which show a structure thereof.
Figure 68B:
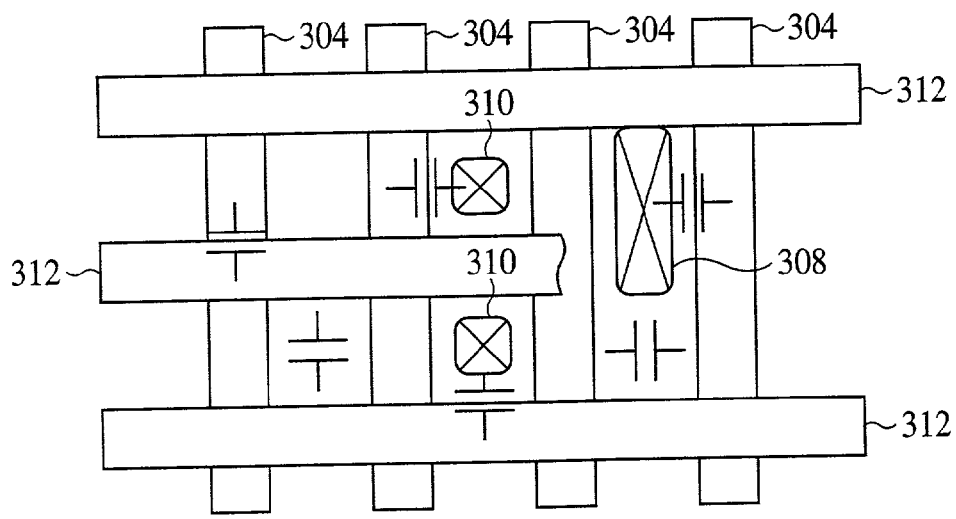

As exemplified in FIG. 67B, when a width of at least one side of the opening 82 is made smaller than a width of the plug 76, the inter-layer insulation film 78 overlaps the plugs 76. Accordingly, the inter-layer insulation film 78 is supported by the plug 76, whereby the inter-layer insulation film 78 is prevented from collapsing toward the cavity 88.

In the semiconductor device according to the ninth embodiment, the contact hole 224 has at least the part corresponding to the inter-layer insulation film 222 increasingly tapered, whereby the inter-layer insulation film 222 is caught by the plug 226, whereby the collapse of the inter-layer insulation film 222 can be prevented, as is the case of FIG. 67A.

In the above-described first to ninth embodiments, when the cavity is formed, the insulation film removed is silicon oxide film, and the insulation film used as the stopper is silicon nitride film. The removed insulation film and the left insulation film may be reverse. A combination of the insulation films is not limited to silicon oxide film and silicon nitride film as long as the insulation films of the combination have etching selectivities with respect to each other, and other combinations may be used. The film to be removed may be a conducting film.

In the above-described embodiments, the semiconductor devices are formed on silicon substrates. The present invention is also applicable to semiconductor devices formed on SOI substrates, GaAs substrates, InP substrates, SiC substrates and other substrates.

What is claimed is:

1. A semiconductor memory device including a memory cell having a transistor and a capacitor, comprising:
   the transistor formed over a semiconductor substrate, the transistor including a gate electrode and a pair of source/drain regions;
   a word line formed over the semiconductor substrate and connected to the gate electrode of the transistor;

a bit line formed over the semiconductor substrate and connected to one of the pair of source/drain regions of the transistor;

a first insulation film formed over the semiconductor substrate and covering the transistor, the word line and the bit line;

a second insulation film formed on the first insulation film and having an opening; and the capacitor formed over the second insulation film, a storage electrode of the capacitor being formed at least in the opening and electrically connected to another one of the pair of source/drain regions of the transistor;

wherein a cavity is formed in the first insulation film at least between the bit line and another bit line adjacent to said the bit line.

2. A semiconductor memory device according to claim 1, wherein the cavity is formed between the word line and another word line adjacent to the word line.

3. A semiconductor memory device according to claim 1, further comprising:

a first electrode plug firmed between the semiconductor substrate and the storage electrode, the first electrode plug being for electrically connecting the storage electrode to said another one of the pair of source/drain regions, and in which the cavity is formed between the first electrode plug and the bit line.

4. A semiconductor memory device according to claim 3, wherein the second insulation film is formed on the first electrode plug and supported by the first electrode plug.

5. A semiconductor memory device according to claim 1, further comprising:

a first electrode plug formed between the semiconductor substrate and the storage electrode, the first electrode plug being for electrically connecting the storage electrode to said another one of the pair of source/drain regions, and in which the cavity is formed between the first electrode plug and the word line.

6. A semiconductor memory device according to claim 5, wherein the second insulation film is formed on the first electrode plug and supported by the first electrode plug.

7. A semiconductor memory device according to claim 1, wherein the cavity is formed between the word line and the bit line.

8. A semiconductor memory device according to claim 1, further comprising:

a second electrode plug formed between the semiconductor substrate and the bit line, the second electrode plug being for electrically connecting the bit line to said one of the pair of source/drain regions, and in which the bit line is supported by the second electrode plug.

9. A semiconductor memory device according to claim 1, further comprising:

a third insulation film formed on the bit line in contact with the second insulation film, and in which the second insulation film is supported by the bit line and the third insulation film.

10. A semiconductor memory device according to claim 1, wherein the storage electrode and the second insulation film are arranged at a prescribed gap in the opening, the cavity is extended in a lower region of the gap, and a fourth insulation film formed on the second insulation film is buried in an upper region of the gap, closing the cavity.

11. A semiconductor memory device according to claim 10, wherein the fourth insulation film is a capacitor dielectric film of the capacitor.

12. A semiconductor memory device according to claim 1, wherein the peripheral edge of the cavity is located in substantially the same distance from the opening.

13. A semiconductor memory device according to claim 1, wherein a shape of a peripheral edge of the cavity is related to a shape of the opening.

14. A semiconductor memory device according to claim 13, wherein the peripheral edge of the cavity is defined by the first insulation film.

15. A semiconductor memory device according to claim 1, further comprising:

a plurality of cell array regions on the semiconductor substrate, each of the cell array regions including the plurality of the memory cells, and in which the cavities are formed independent of each other in the respective plurality of the cell array regions.

* * * * *